United States Patent
Shiraishi

(10) Patent No.: US 11,669,304 B2
(45) Date of Patent: Jun. 6, 2023

(54) ARITHMETIC DEVICE AND ARITHMETIC CIRCUIT FOR PERFORMING MULTIPLICATION AND DIVISION

(71) Applicant: Kioxia Corporation, Tokyo (JP)

(72) Inventor: Mikio Shiraishi, Yokohama (JP)

(73) Assignee: Kioxia Corporation, Tokyo (JP)

( * ) Notice: Subject to any disclaimer, the term of this patent is extended or adjusted under 35 U.S.C. 154(b) by 174 days.

(21) Appl. No.: 17/351,887

(22) Filed: Jun. 18, 2021

(65) Prior Publication Data

US 2022/0253286 A1     Aug. 11, 2022

(30) Foreign Application Priority Data

Feb. 8, 2021    (JP) .............................. JP2021-018196

(51) Int. Cl.
    *G06F 7/57*     (2006.01)
    *G06F 7/52*     (2006.01)

(52) U.S. Cl.
    CPC . *G06F 7/57* (2013.01); *G06F 7/52* (2013.01)

(58) Field of Classification Search
    CPC ... G06F 7/57; G06F 7/52; G06F 7/523; G06F 7/5272; G06F 7/5277; G06F 7/535–5375; G06F 2207/5355; G06F 7/483; G06F 7/487–4876; G06F 7/4915–492; G06F 7/493; G06F 7/496
    See application file for complete search history.

(56) References Cited

U.S. PATENT DOCUMENTS

| | | |
|---|---|---|
| 5,128,891 A | 7/1992 | Lynch et al. |
| 5,140,545 A | 8/1992 | Vassiliadis et al. |
| 5,379,245 A | 1/1995 | Ueda |
| 5,777,907 A * | 7/1998 | Kwon ........................ G06F 7/52 708/625 |
| 5,798,955 A | 8/1998 | Matsubara |
| 5,945,657 A | 8/1999 | Kozai |

(Continued)

FOREIGN PATENT DOCUMENTS

| | | |
|---|---|---|
| JP | 61-138334 A | 6/1986 |
| JP | 61-271536 A | 12/1986 |

(Continued)

OTHER PUBLICATIONS

I. Kong and E. E. Swartzlander, "A Goldschmidt Division Method With Faster Than Quadratic Convergence," in IEEE Transactions on Very Large Scale Integration (VLSI) Systems, vol. 19, No. 4, pp. 696-700, Apr. 2011, doi: 10.1109/TVLSI.2009.2036926. (Year: 2011).*

(Continued)

*Primary Examiner* — Matthew D Sandifer
*Assistant Examiner* — Huy Duong
(74) *Attorney, Agent, or Firm* — Oblon, McClelland, Maier & Neustadt, L.L.P.

(57) ABSTRACT

According to one embodiment, an arithmetic device includes: a first input terminal; a second input terminal; an output terminal; a first logical shifter; a second logical shifter; a third logical shifter; a first AND gate; a second AND gate; a first multiplexer; a third AND gate; a first adder; a fourth logical shifter; a second multiplexer; a second adder; a first arithmetic shifter; a second arithmetic shifter; a third arithmetic shifter; a third multiplexer; a fourth multiplexer; and a fifth multiplexer.

24 Claims, 32 Drawing Sheets

(56) References Cited

U.S. PATENT DOCUMENTS

| | | |
|---|---|---|
| 2001/0025293 A1 | 9/2001 | Inui |
| 2010/0281087 A1* | 11/2010 | Powell .................. G06F 7/5375 708/235 |
| 2011/0131262 A1 | 6/2011 | Nakazato |
| 2012/0150932 A1 | 6/2012 | Tanaka |
| 2017/0255449 A1* | 9/2017 | Li ........................... G06F 17/16 |
| 2020/0202201 A1 | 6/2020 | Shirahata et al. |
| 2022/0253286 A1 | 8/2022 | Shiraishi |

FOREIGN PATENT DOCUMENTS

| | | |
|---|---|---|
| JP | 3-083127 A | 4/1991 |
| JP | 4-205139 A | 7/1992 |
| JP | 4-227535 A | 8/1992 |
| JP | 5-94280 A | 4/1993 |
| JP | 5-113872 A | 5/1993 |
| JP | 6-28155 A | 2/1994 |
| JP | 7-6024 A | 1/1995 |
| JP | 7-160480 A | 6/1995 |
| JP | 9-62489 A | 3/1997 |
| JP | 9-91270 A | 4/1997 |
| JP | 10-49350 A | 2/1998 |
| JP | 2000-10763 A | 1/2000 |
| JP | 2001-175457 A | 6/2001 |
| JP | 2001-222410 A | 8/2001 |
| JP | 2001-256039 A | 9/2001 |
| JP | 2003-67182 A | 3/2003 |
| JP | 2011-118633 A | 6/2011 |
| JP | 2012-141952 A | 7/2012 |
| JP | 2020-101991 A | 7/2020 |
| JP | 2022-121055 A | 8/2022 |

OTHER PUBLICATIONS

Robert E. Goldschmidt, "Applications of Division by Convergence", MSc dissertation, M.I.T., Jun. 1964, 44 pages.

Ra Vowels, "Divide by 10", Australian Computer Journal, vol. 24, No. 3, Aug. 1992, 44 pages.

* cited by examiner

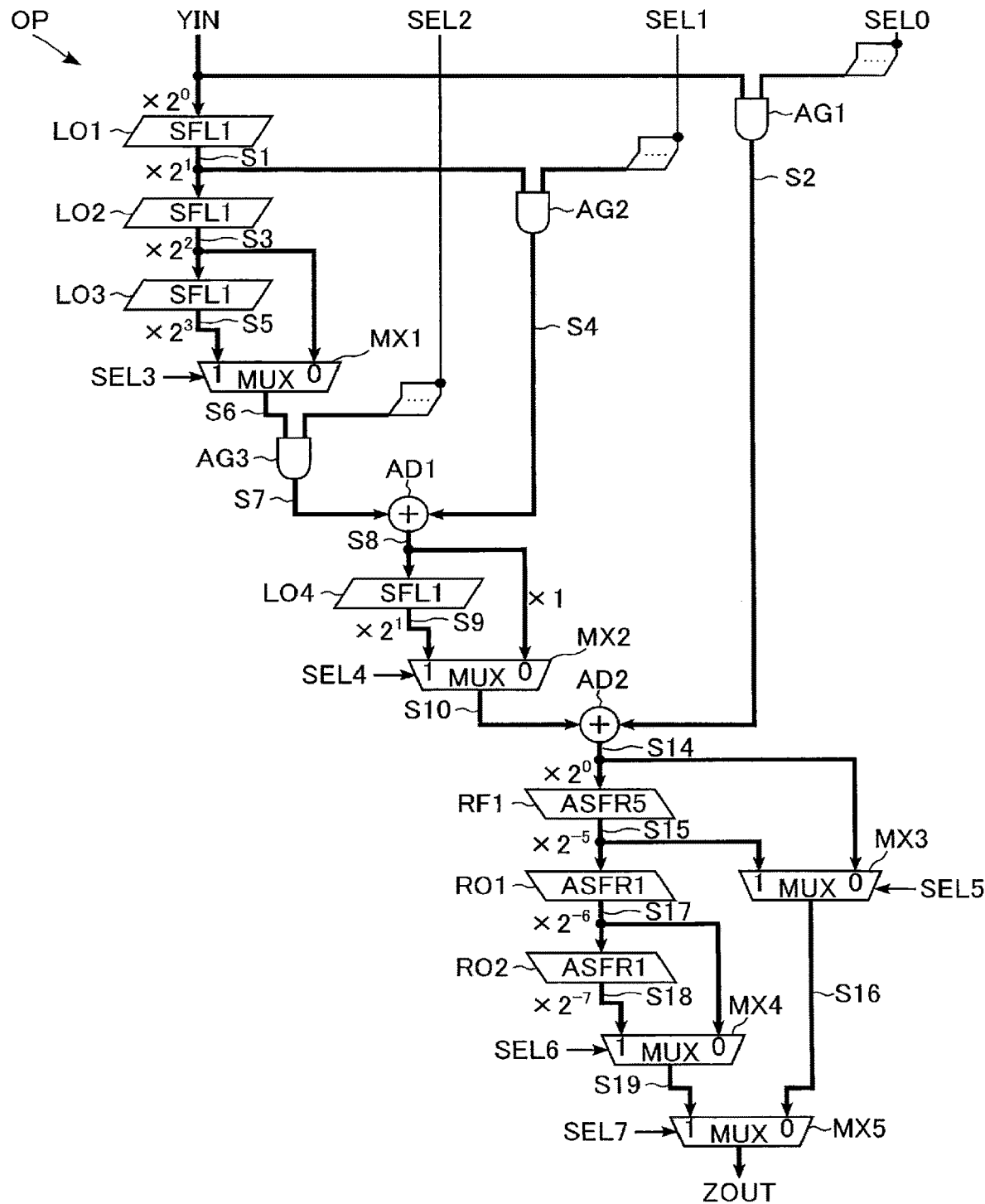
F I G. 2

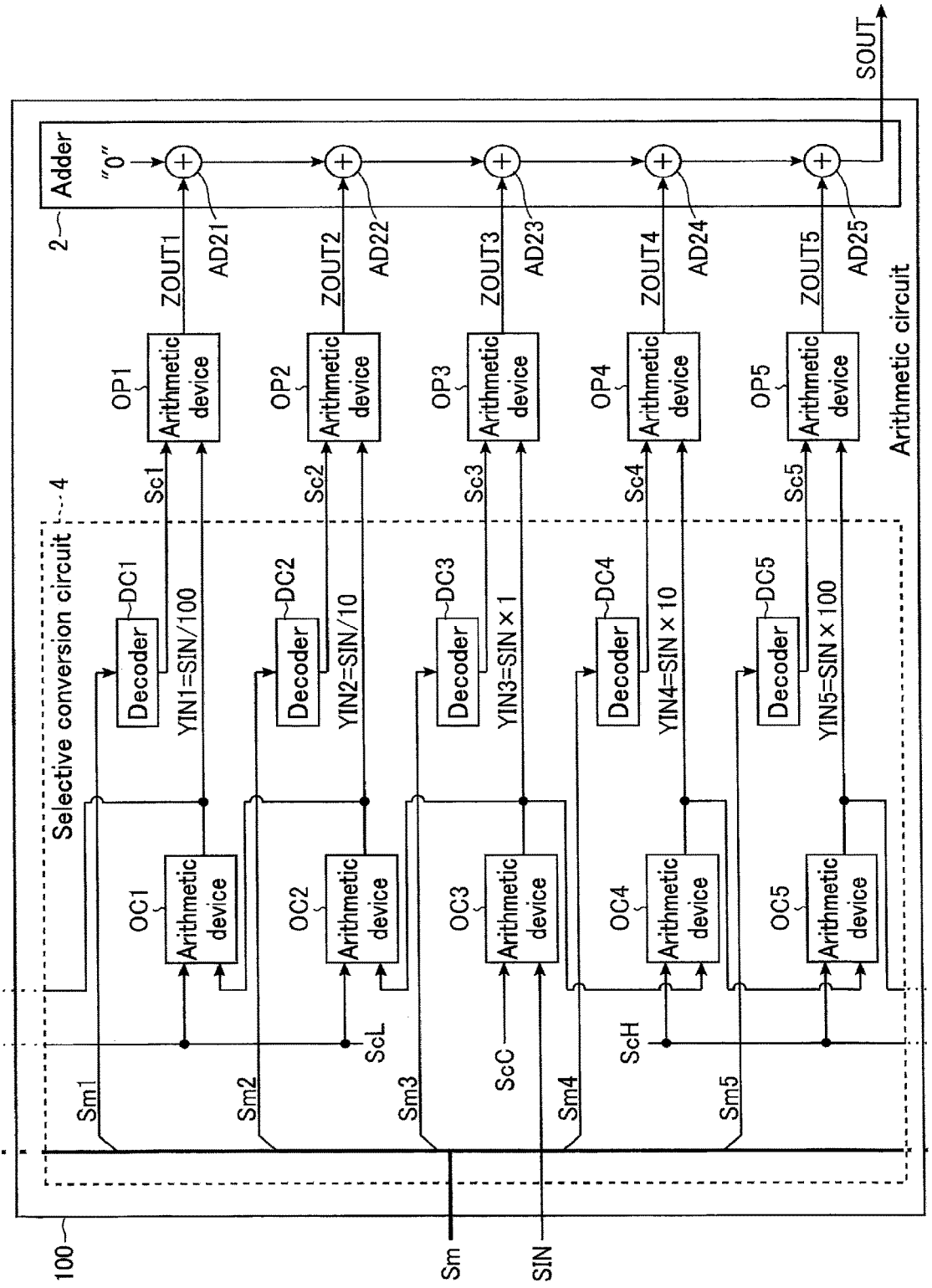
F I G. 3

| Multiplier | SEL7 | SEL6 | SEL5 | SEL4 | SEL3 | SEL2 | SEL1 | SEL0 |
|---|---|---|---|---|---|---|---|---|
| 10 | L | – | L | L | H | H | H | L |
| 9 | L | – | L | L | H | H | L | H |
| 8 | L | – | L | L | H | H | L | L |
| 7 | L | – | L | L | L | H | H | H |
| 6 | L | – | L | L | L | H | H | L |
| 5 | L | – | L | L | L | H | L | H |
| 4 | L | – | L | L | L | H | L | L |
| 3 | L | – | L | L | – | L | H | H |
| 2 | L | – | L | L | – | L | H | L |
| 1 | L | – | L | – | – | L | L | H |
| 1/2 | L | – | H | H | H | H | L | L |
| 1/3 | H | L | – | H | H | H | H | H |
| 1/4 | L | – | H | L | H | H | L | L |
| 1/5 | H | L | – | H | L | H | H | H |
| 1/6 | H | H | – | H | H | H | H | H |
| 1/7 | H | L | – | L | H | H | L | H |
| 1/8 | L | – | H | L | L | H | L | L |
| 1/9 | H | L | – | L | L | H | H | H |
| 1/10 | H | H | – | H | L | H | H | H |
| 0 | L | – | L | – | – | L | L | L |

F I G. 4

| Multiplier | Internal arithmetic operation | Error rate |
|---|---|---|
| 10 | $\times (2^3+2^1)$ | 0% |
| 9 | $\times (2^3+2^0)$ | 0% |
| 8 | $\times 2^3$ | 0% |
| 7 | $\times (2^2+2^1+2^0)$ | 0% |
| 6 | $\times (2^2+2^1)$ | 0% |
| 5 | $\times (2^2+2^0)$ | 0% |
| 4 | $\times 2^2$ | 0% |
| 3 | $\times (2^1+2^0)$ | 0% |
| 2 | $\times 2^1$ | 0% |
| 1 | $\times 2^0$ | 0% |
| 1/2 | $\times 2^4/2^5$ | 0% |
| 1/3 | $\times \{(2^3+2^1) \times 2+2^0\}/2^6$ | −1.5625% |
| 1/4 | $\times 2^3/2^5$ | 0% |
| 1/5 | $\times \{(2^2+2^1) \times 2+2^0\}/2^6$ | 1.5625% |
| 1/6 | $\times \{(2^3+2^1) \times 2+2^0\}/2^7$ | −1.5625% |
| 1/7 | $\times (2^3+2^0)/2^6$ | −1.5625% |
| 1/8 | $\times 2^2/2^5$ | 0% |
| 1/9 | $\times (2^2+2^1+2^0)/2^6$ | −1.5625% |
| 1/10 | $\times \{(2^2+2^1) \times 2+2^0\}/2^7$ | 1.5625% |
| 0 | $\times 0$ | 0% |

F I G. 5

| Component | Binary multiplying unit | Arithmetic circuit of first embodiment |
|---|---|---|
| AND gate | 4 | 3 |
| Multiplexer | 0 | 5 |
| Adder | 3 | 2 |
| Number of elements per multiplicand bit | 192 | 200 |

F I G. 6

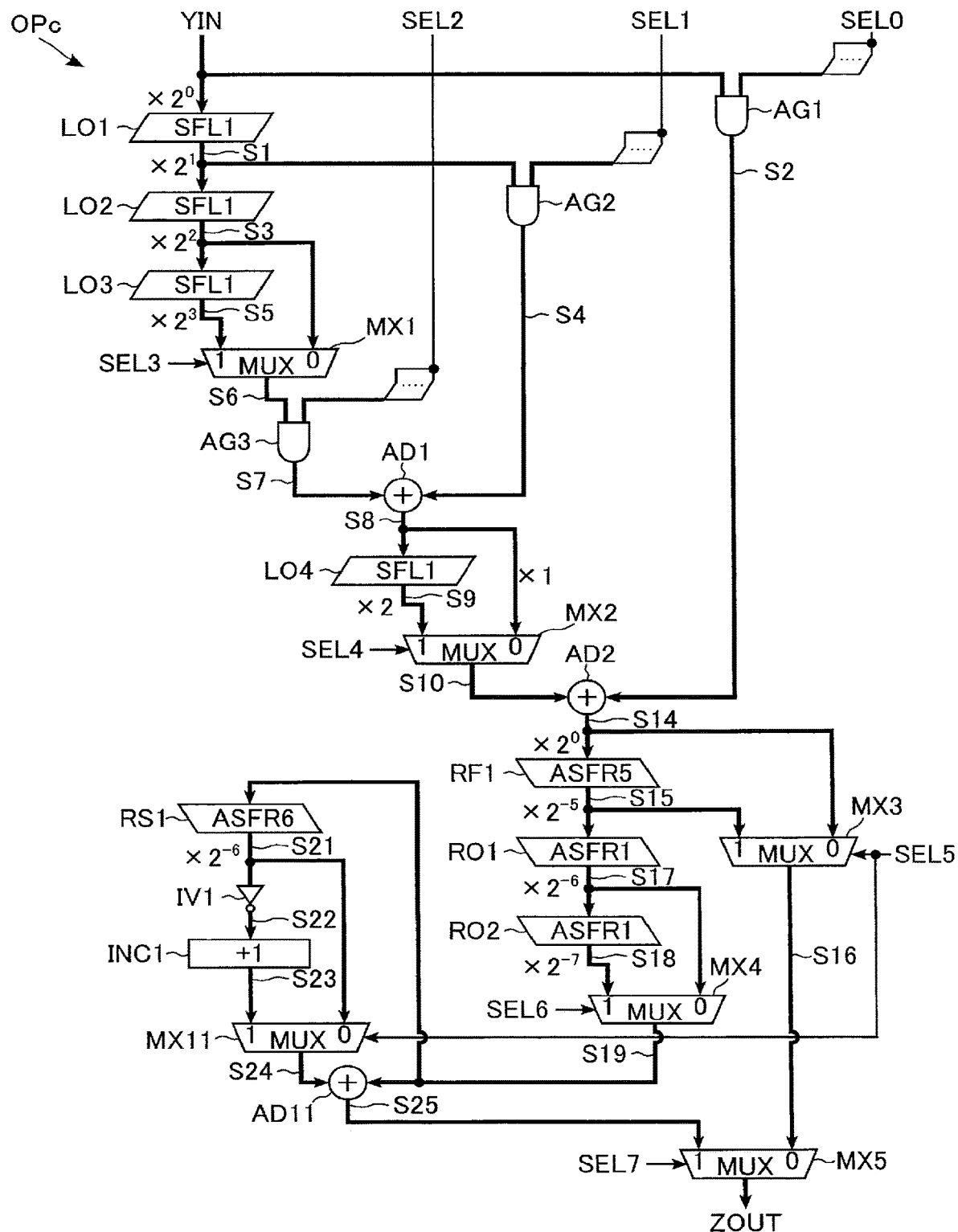
F I G. 9

| Multiplier | SEL7 | SEL6 | SEL5 | SEL4 | SEL3 | SEL2 | SEL1 | SEL0 |
|---|---|---|---|---|---|---|---|---|
| 10 | L | – | L | L | H | H | H | L |
| 9 | L | – | L | L | H | H | L | H |
| 8 | L | – | L | L | H | H | L | L |
| 7 | L | – | L | L | L | H | H | H |
| 6 | L | – | L | L | L | H | H | L |
| 5 | L | – | L | L | L | H | L | H |
| 4 | L | – | L | L | L | H | L | L |
| 3 | L | – | L | L | – | L | H | H |
| 2 | L | – | L | L | – | L | H | L |
| 1 | L | – | L | – | – | L | L | H |
| 1/2 | L | – | H | H | H | H | L | L |
| 1/3 | H | L | L | H | H | H | H | H |
| 1/4 | L | – | H | L | H | H | L | L |
| 1/5 | H | L | H | H | L | H | H | H |
| 1/6 | H | H | L | H | H | H | H | H |
| 1/7 | H | L | L | L | H | H | L | H |
| 1/8 | L | – | H | L | L | H | L | L |
| 1/9 | H | L | L | L | L | H | H | H |
| 1/10 | H | H | H | H | L | H | H | H |
| 0 | L | – | L | – | – | L | L | L |

F I G. 10

| Component | Binary multiplying unit | Arithmetic circuit of third embodiment |
|---|---|---|
| AND gate | 4 | 3 |
| Multiplexer | 0 | 6 |
| Adder | 3 | 3 |
| Inverter | 0 | 1 |
| Incrementer | 0 | 1 |
| Number of elements per multiplicand bit | 192 | 294 |

F I G. 11

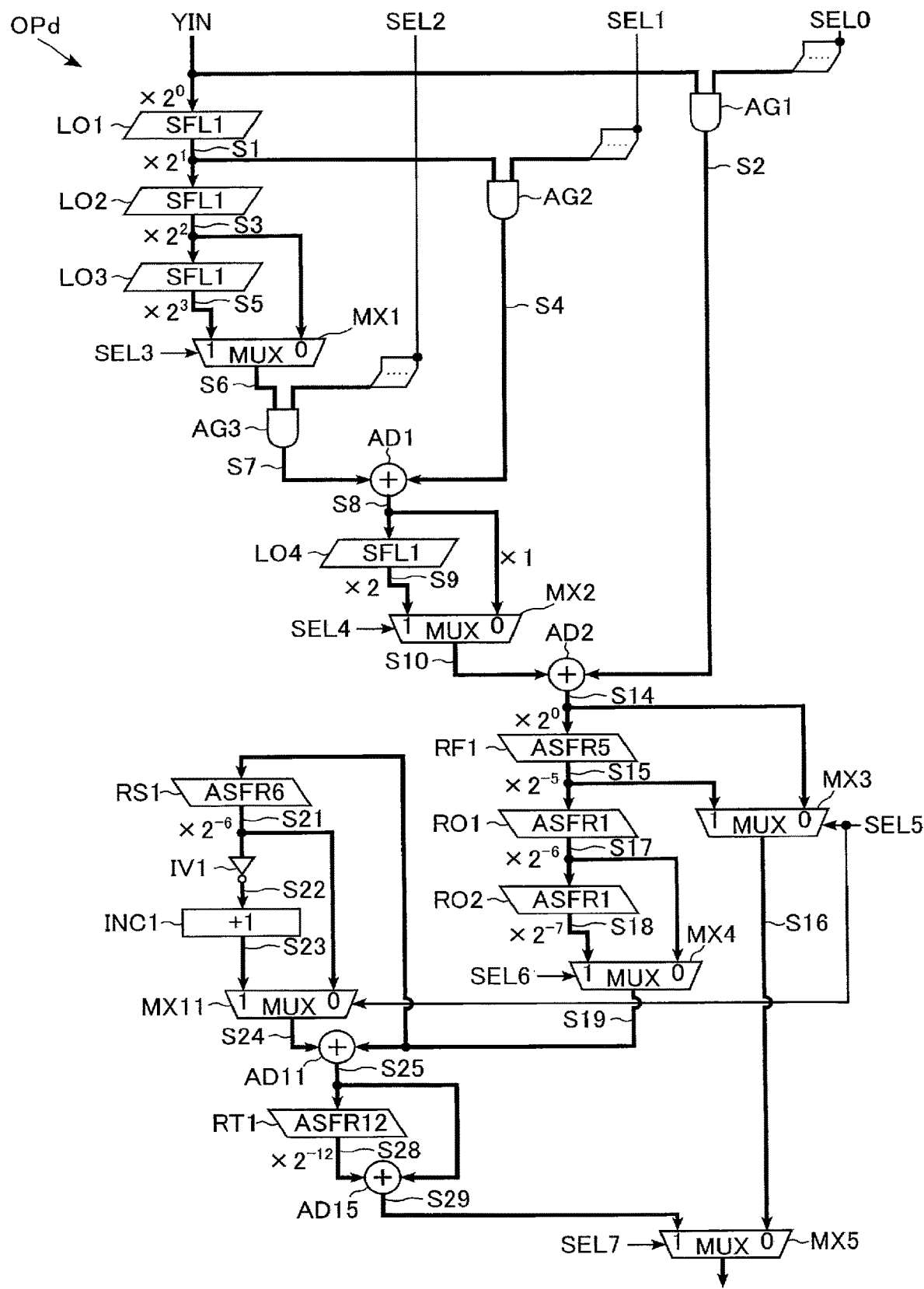
F I G. 12

| Component | Binary multiplying unit | Arithmetic circuit of fourth embodiment |
|---|---|---|
| AND gate | 4 | 3 |
| Multiplexer | 0 | 6 |
| Adder | 3 | 4 |
| Inverter | 0 | 1 |
| Incrementer | 0 | 1 |
| Number of elements per multiplicand bit | 192 | 350 |

F I G. 13

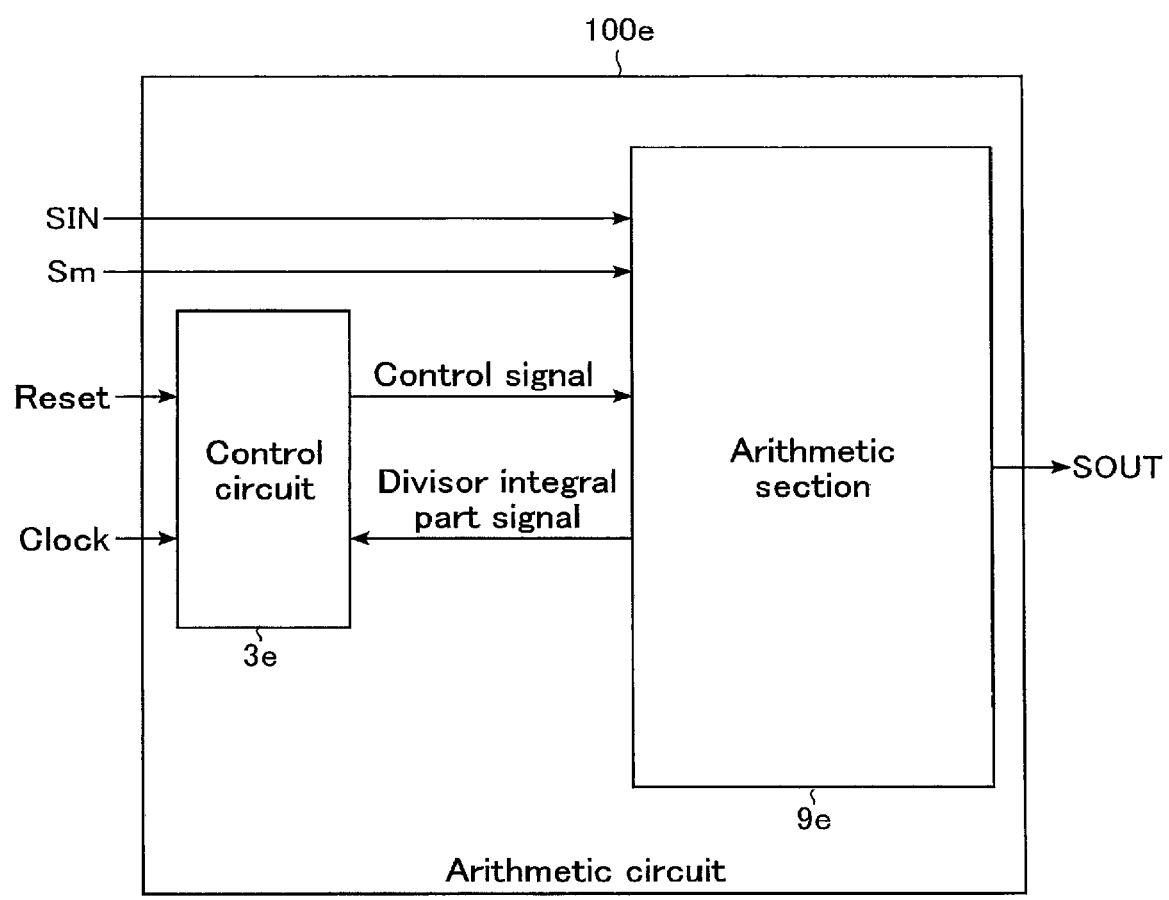
F I G. 14

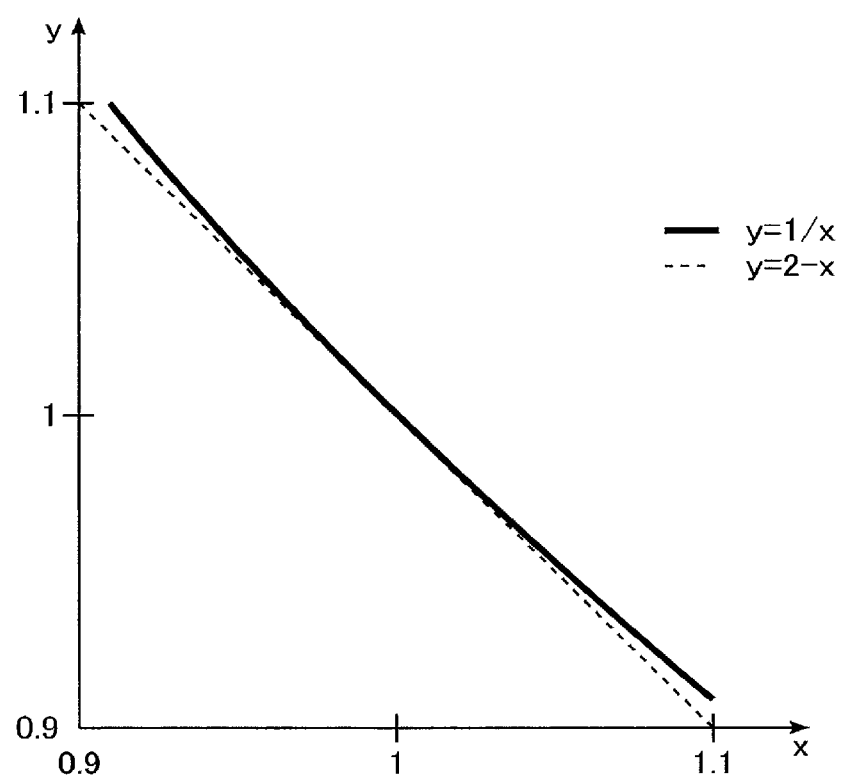
F I G. 16

| Value of divisor $D_5$ | Value of formula (51) | Value of divisor $D_6$ |
|---|---|---|
| 0.90 | 1.10 | 0.9900 |
| $0.90 < D_5 \leq 0.91$ | 1.09 | $0.9810 < D_6 \leq 0.9919$ |
| $0.91 < D_5 \leq 0.92$ | 1.08 | $0.9828 < D_6 \leq 0.9936$ |
| $0.92 < D_5 \leq 0.93$ | 1.07 | $0.9844 < D_6 \leq 0.9951$ |
| $0.93 < D_5 \leq 0.94$ | 1.06 | $0.9858 < D_6 \leq 0.9964$ |
| $0.94 < D_5 \leq 0.95$ | 1.05 | $0.9870 < D_6 \leq 0.9975$ |
| $0.95 < D_5 \leq 0.96$ | 1.04 | $0.9880 < D_6 \leq 0.9984$ |
| $0.96 < D_5 \leq 0.97$ | 1.03 | $0.9888 < D_6 \leq 0.9991$ |
| $0.97 < D_5 \leq 0.98$ | 1.02 | $0.9894 < D_6 \leq 0.9996$ |
| $0.98 < D_5 \leq 0.99$ | 1.01 | $0.9898 < D_6 \leq 0.9999$ |
| $0.99 < D_5 < 1.00$ | 1.00 | $0.9900 < D_6 < 1.0000$ |

FIG. 17

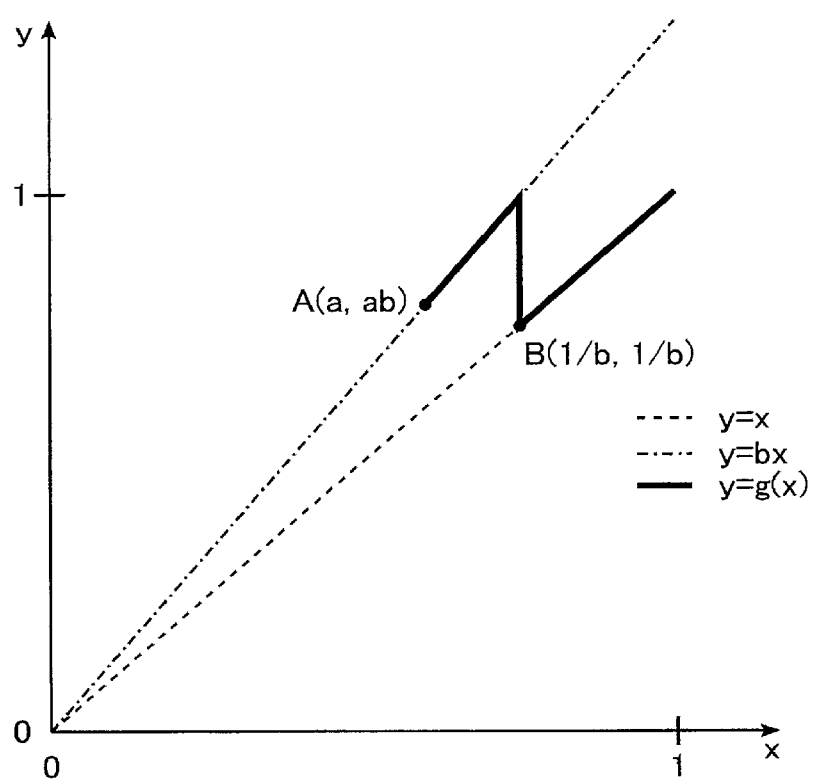
F I G. 18

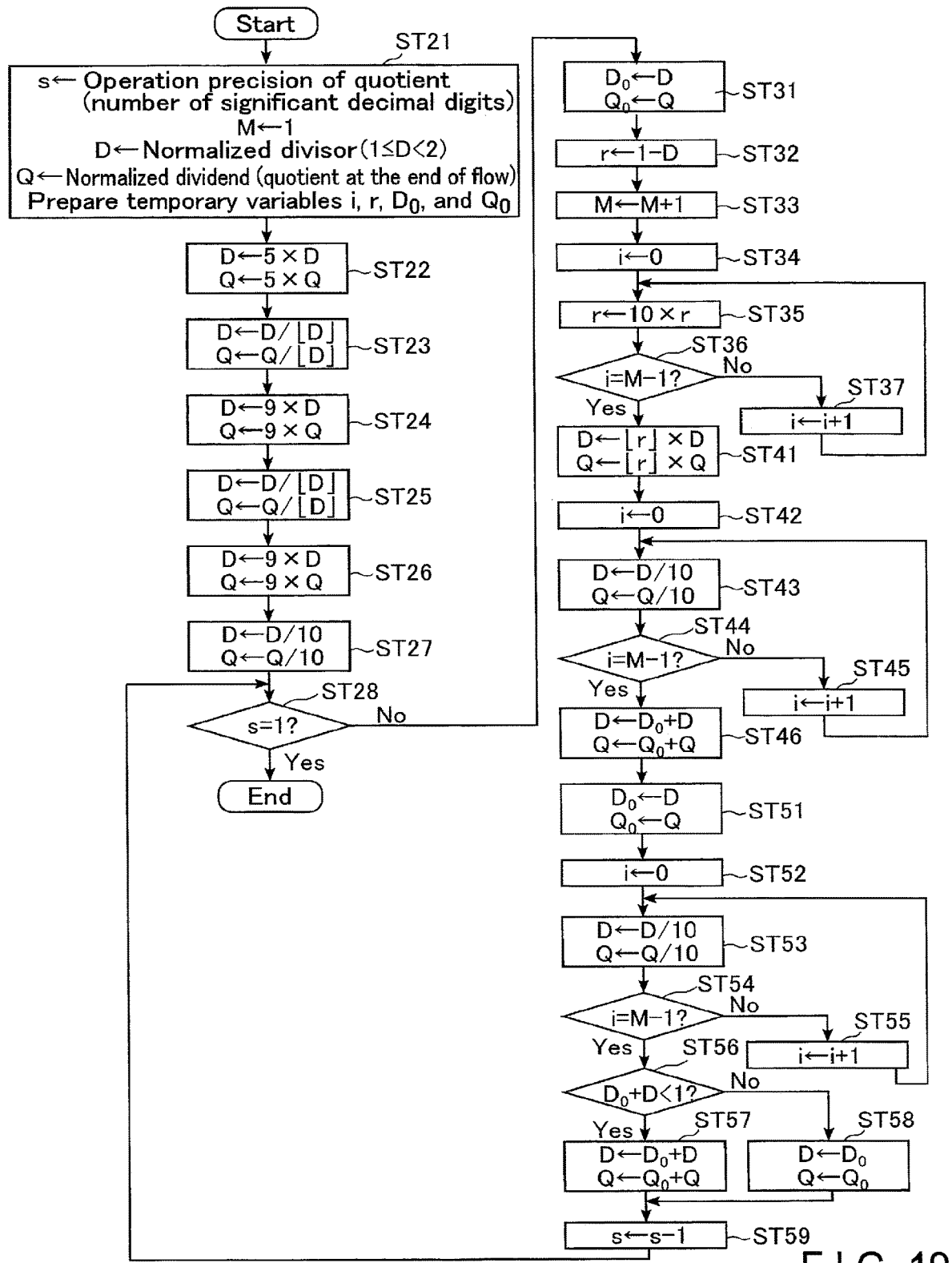
F I G. 19

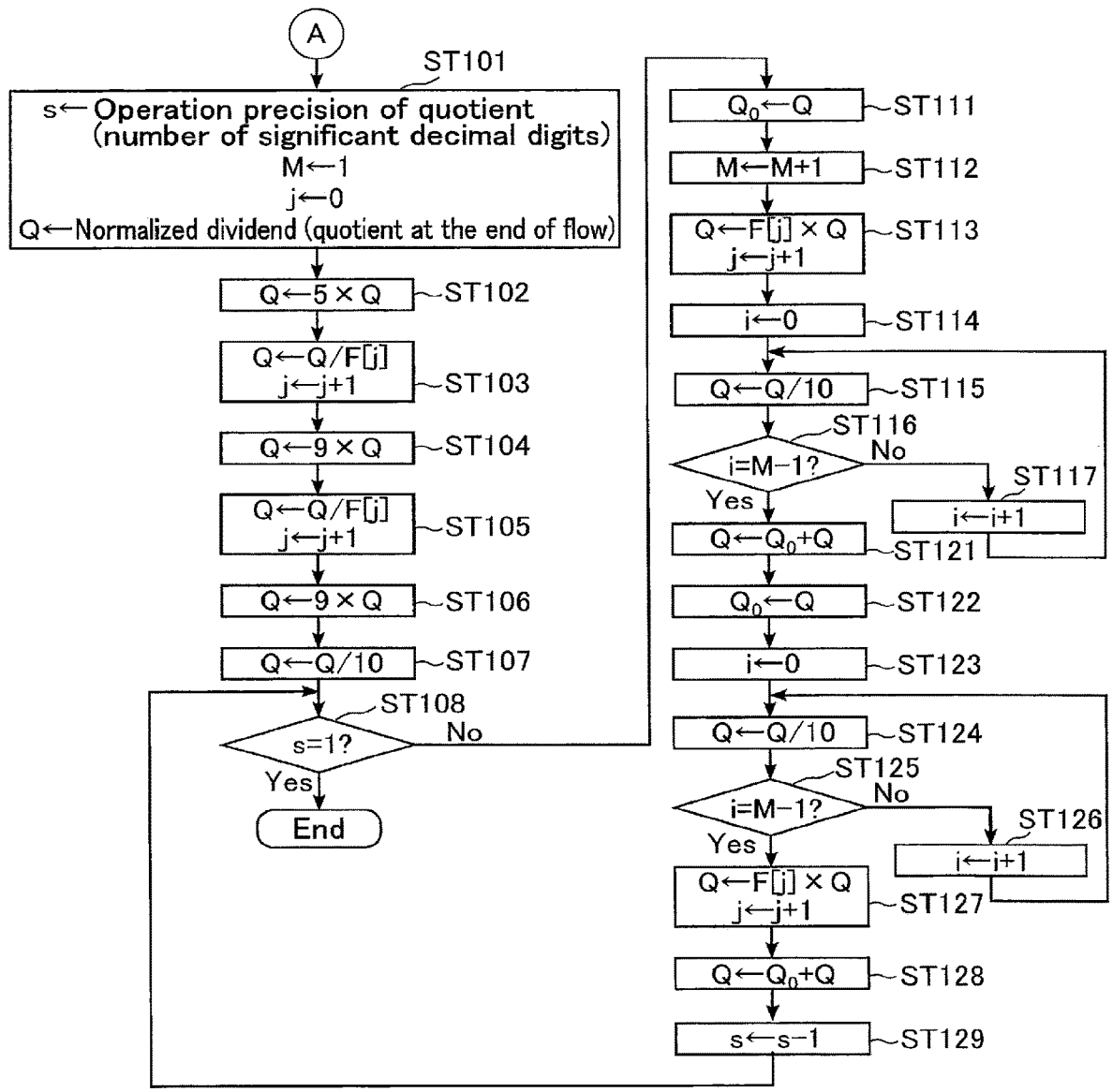
F I G. 21

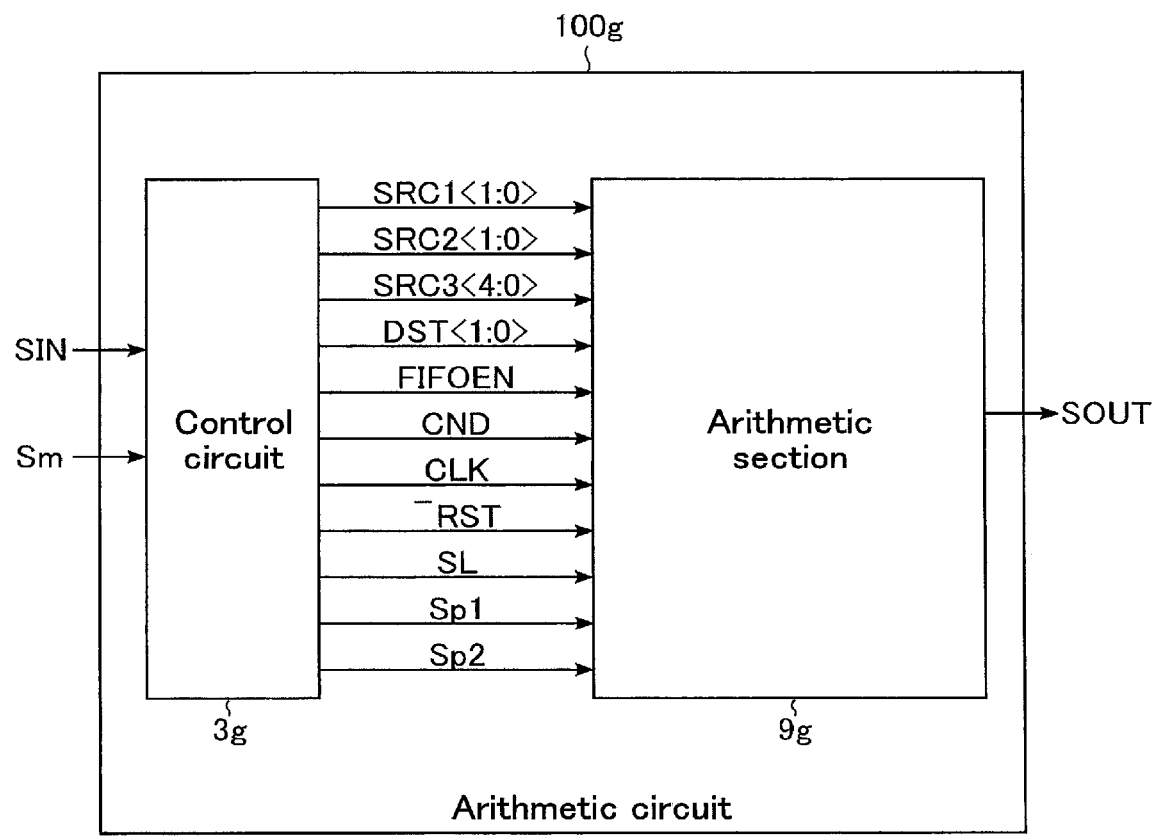
F I G. 22

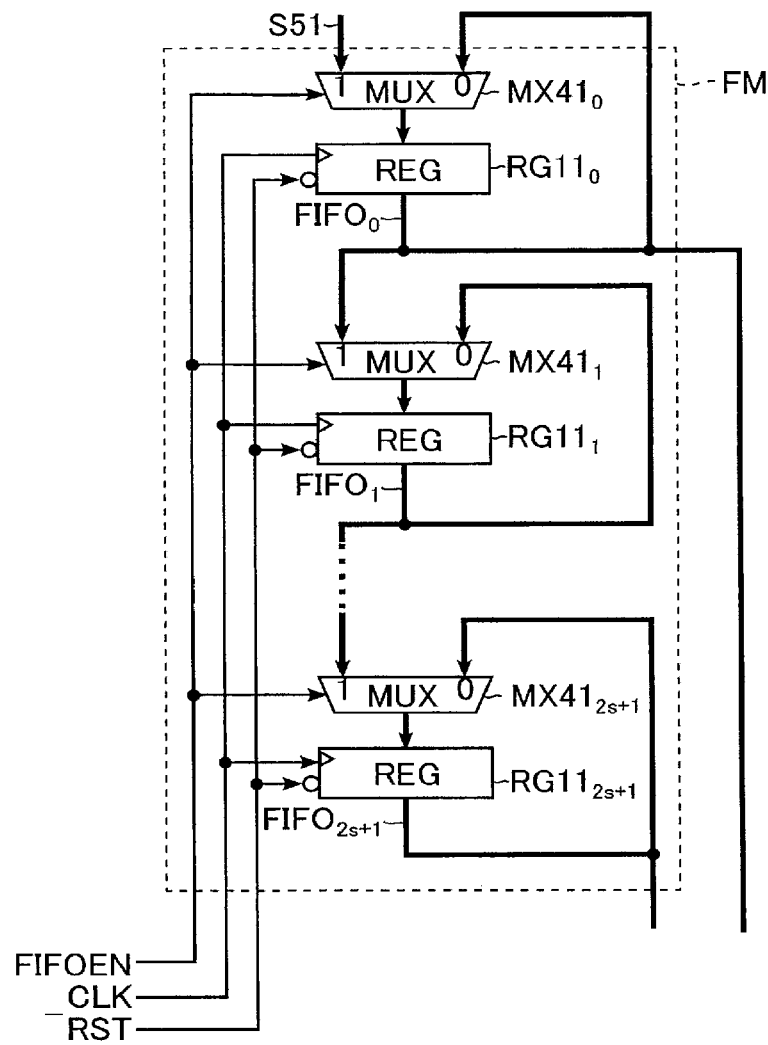
F I G. 24

| Sp2 | S62<3:0> | SEL7 | SEL6 | SEL5 | SEL4 | SEL3 | SEL2 | SEL1 | SEL0 |
|---|---|---|---|---|---|---|---|---|---|
| L | 1010 | L | – | L | L | H | H | H | L |
| L | 1001 | L | – | L | L | H | H | L | H |
| L | 1000 | L | – | L | L | H | H | L | L |
| L | 0111 | L | – | L | L | L | H | H | H |
| L | 0110 | L | – | L | L | L | H | H | L |
| L | 0101 | L | – | L | L | L | H | L | H |
| L | 0100 | L | – | L | L | L | H | L | L |
| L | 0011 | L | – | L | L | – | L | H | H |
| L | 0010 | L | – | L | L | – | L | H | L |
| L | 0001 | L | – | L | – | – | L | L | H |
| H | 0010 | L | – | H | H | H | H | L | L |
| H | 0011 | H | L | L | H | H | H | H | H |
| H | 0100 | L | – | H | L | H | H | L | L |
| H | 0101 | H | L | H | H | L | H | H | H |
| H | 0110 | H | H | L | H | H | H | H | H |
| H | 0111 | H | L | L | L | H | H | L | H |
| H | 1000 | L | – | H | L | L | H | L | L |
| H | 1001 | H | L | L | L | L | H | H | H |
| H | 1010 | H | H | H | H | L | H | H | H |
| L | 0000 | L | – | L | – | – | L | L | L |

F I G. 25

| First input | First arithmetic operation | Second input | Second arithmetic operation | Third input | Condition | Output |
|---|---|---|---|---|---|---|
| S43(Q) | + | Sm(D) | × | 0 | None | S43(Q) |
| 0.0⋯0 | − | SIN(N) | /(÷) | 1 | U<0>=0 | S47(R) |
| 1.0⋯0 |  | S43(Q) |  | 2 |  |  |
|  |  | S47(R) |  | 3 |  |  |
|  |  |  |  | 4 |  |  |
|  |  |  |  | 5 |  |  |
|  |  |  |  | 6 |  |  |
|  |  |  |  | 7 |  |  |
|  |  |  |  | 8 |  |  |
|  |  |  |  | 9 |  |  |
|  |  |  |  | 10 |  |  |
|  |  |  |  | $FIFO_0$ |  |  |
|  |  |  |  | $FIFO_{2s+1}$ |  |  |

FIG. 26

| Item | Select signal name | Selected signal value | Selection result |
|---|---|---|---|
| First input | SRC<1:0> | 00 | S43(Q) |
| | | 10 | 0.0⋯0 |
| | | 11 | 1.0⋯0 |
| First arithmetic operation | Sp1 | L | + |
| | | H | − |
| Second input | SRC2<1:0> | 00 | S43(Q) |
| | | 01 | S47(R) |
| | | 10 | Sm(D) |
| | | 11 | SIN(N) |
| Second arithmetic operation | Sp2 | L | × |
| | | H | /(÷) |
| Third input | SRC3<4:0> | 00000 | 0 |
| | | 00001 | 1 |
| | | 00010 | 2 |
| | | 00011 | 3 |
| | | 00100 | 4 |
| | | 00101 | 5 |
| | | 00110 | 6 |
| | | 00111 | 7 |
| | | 01000 | 8 |
| | | 01001 | 9 |
| | | 01010 | 10 |
| | | 10000 | $FIFO_0$ |
| | | 10001 | $FIFO_{2s+1}$ |
| Condition | CND | L | None |
| | | H | U<0>=0 |
| Output | DST<1:0> | 00 | None |
| | | 01 | S43(Q) |
| | | 10 | S47(R) |

FIG. 27

| Item | Select signal name | Selected signal value | Operation |
|---|---|---|---|
| Input | CND | L | Input U<3:0> |
| | | H | Input 1 if U<0>=0<br>Input 0 if U<0>≠0 |
| Update | FIFOEN | L | Retention |
| | | H | Update |

F I G. 28

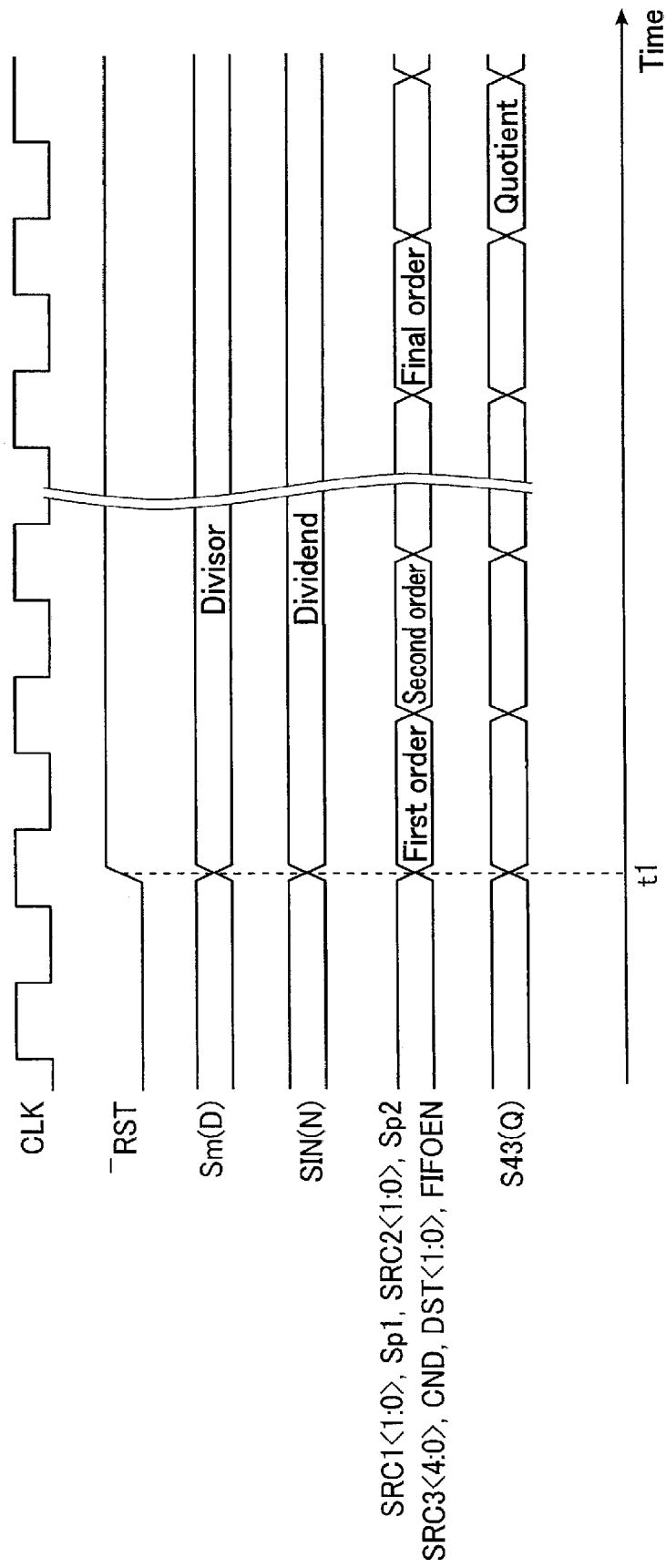
F I G. 29

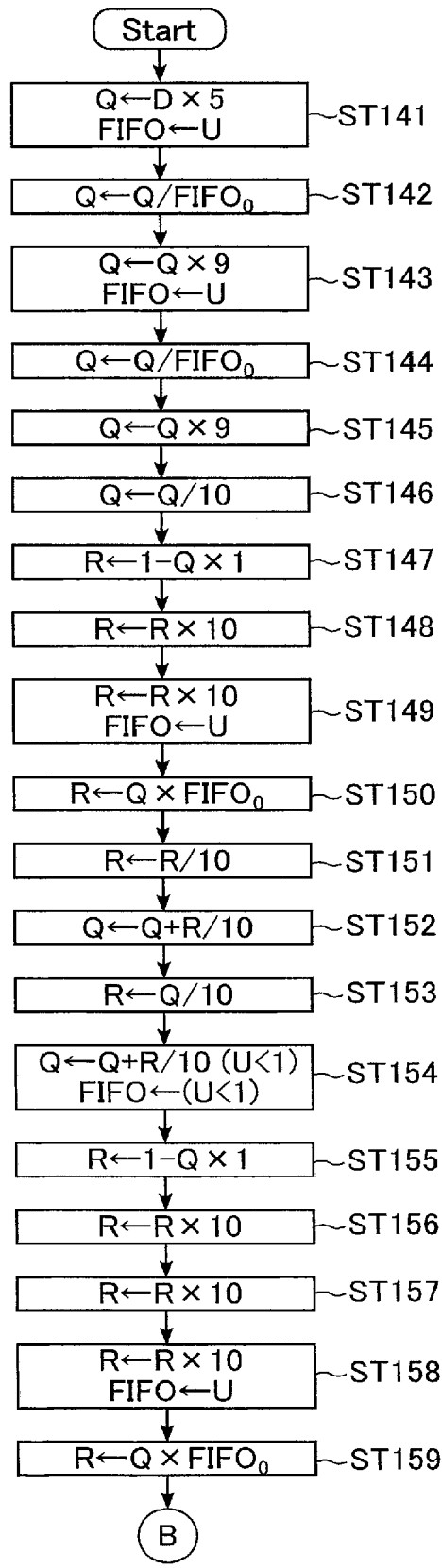
F I G. 30

ARITHMETIC DEVICE AND ARITHMETIC CIRCUIT FOR PERFORMING MULTIPLICATION AND DIVISION

CROSS-REFERENCE TO RELATED APPLICATIONS

This application is based upon and claims the benefit of priority from Japanese Patent Application No. 2021-18196, filed Feb. 8, 2021, the entire contents of which are incorporated herein by reference.

FIELD

Embodiments described herein relate generally to an arithmetic device and an arithmetic circuit.

BACKGROUND

An arithmetic device that performs multiplication and/or division is known. The multiplication and division are implemented by repeating addition or subtraction. It is desired that such an arithmetic device occupy a small area and offer a high operation speed. There is, however, a tradeoff relationship between the area occupied by the arithmetic device and its operation speed. To reduce the area of the arithmetic device that performs the multiplication and division, it is effective, in performing the multiplication and division, to provide an adder/subtractor and a register for storing results of addition/subtraction, with a clock given to the adder/subtractor and the register, and to configure the register to store results of arithmetic operations performed based on the edges of the clock. For an increased operation speed, it is effective to arrange a large number of adders/subtractors to perform arithmetic operations in parallel and simultaneously.

BRIEF DESCRIPTION OF THE DRAWINGS

FIG. 2 shows components in the arithmetic device and couplings of the components according to the first embodiment.

FIG. 3 shows components in a selective conversion circuit and an adder and couplings of the components according to the first embodiment.

FIG. 4 shows a combination of values of control signals for an arithmetic operation performed by the arithmetic device according to the first embodiment.

FIG. 5 shows arithmetic operations performed in the arithmetic device according to the first embodiment.

FIG. 6 shows the number of components and the number of elements per multiplicand bit of each of the arithmetic device of the first embodiment and an arithmetic device of a comparative example.

FIG. 9 shows components in an arithmetic device and couplings of the components according to a third embodiment.

FIG. 10 shows a combination of values of control signals for an arithmetic operation performed by the arithmetic device according to the third embodiment.

FIG. 11 shows the number of components and the number of elements per multiplicand bit of each of the arithmetic device of the third embodiment and an arithmetic device of a comparative example.

FIG. 12 shows components in an arithmetic device and couplings of the components according to a fourth embodiment.

FIG. 13 shows the number of components and the number of elements per multiplicand bit of each of the arithmetic device of the fourth embodiment and an arithmetic device of a comparative example.

FIG. 14 shows components in an arithmetic circuit and couplings of the components according to a fifth embodiment.

FIG. 16 shows a flow of an operation of the arithmetic circuit according to the fifth embodiment.

FIG. 17 shows, with respect to various values of a divisor, values of another divisor according to the fifth embodiment.

FIG. 18 shows characteristics after conversion according to the fifth embodiment.

FIG. 19 shows a flow of an operation of the arithmetic circuit according to the fifth embodiment.

FIG. 21 shows another part of the flow of the operation of the arithmetic circuit according to the sixth embodiment.

FIG. 22 shows components in an arithmetic circuit and couplings of the components according to a seventh embodiment.

FIG. 24 shows an example of components in a FIFO memory and couplings of the components according to the seventh embodiment.

FIG. 25 shows a combination of an input and an output of a decoder according to the seventh embodiment.

FIG. 26 shows types of arithmetic operations performed by the arithmetic circuit according to the seventh embodiment.

FIG. 27 shows a combination of values of control signals for an arithmetic operation performed by the arithmetic circuit according to the seventh embodiment.

FIG. 28 shows a combination of values of control signals for an arithmetic operation performed by the arithmetic circuit according to the seventh embodiment.

FIG. 29 shows, along a timeline, states of some of the signals of the arithmetic circuit according to the seventh embodiment.

FIG. 30 shows a part of a flow of an operation of the arithmetic circuit according to the seventh embodiment.

DETAILED DESCRIPTION

Figure 1:
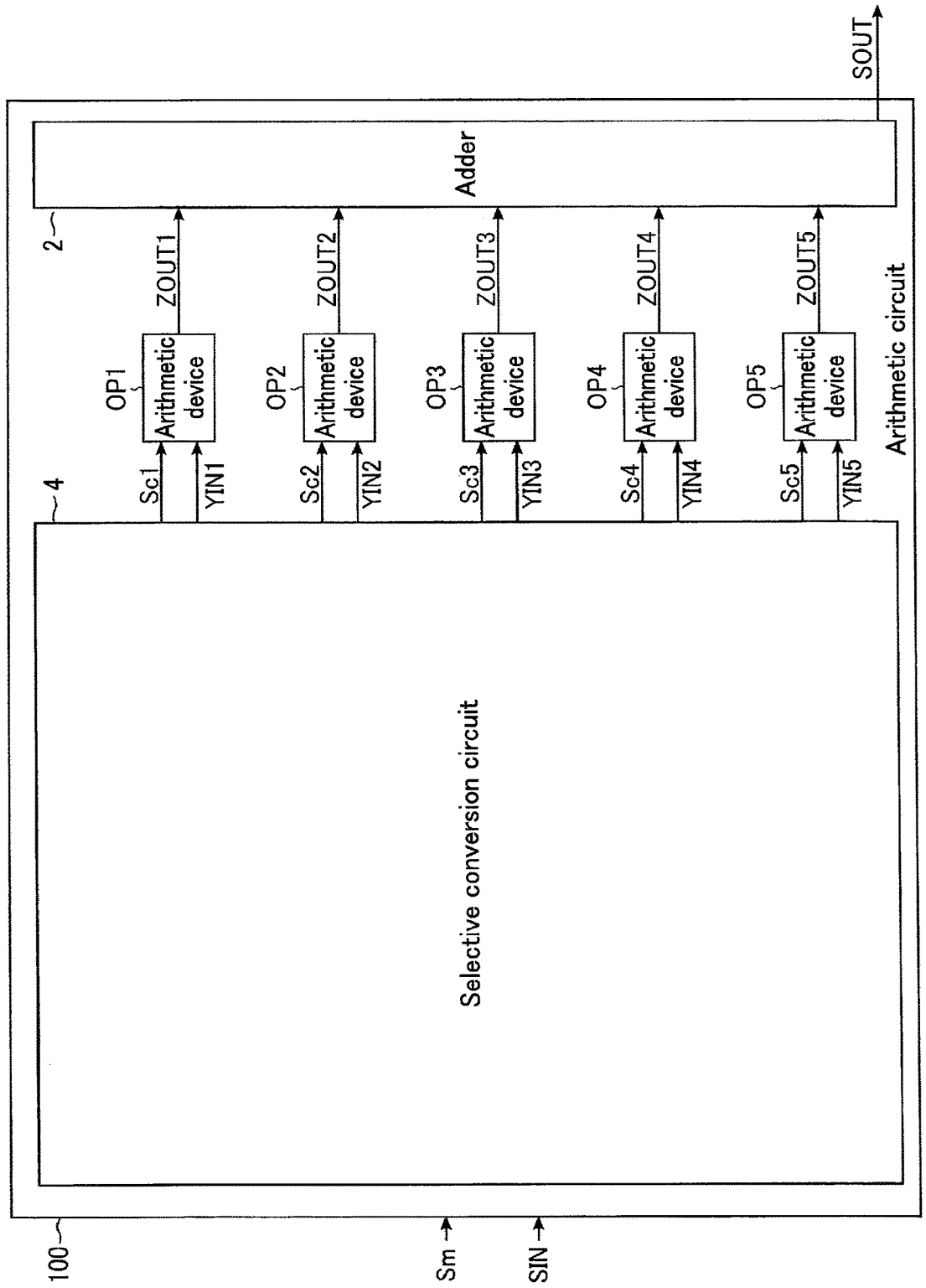
FIG. 1 shows components in an arithmetic circuit including an arithmetic device and couplings of the components according to a first embodiment.

In general, according to one embodiment, an arithmetic device includes: a first input terminal; a second input terminal; an output terminal; a first logical shifter; a second logical shifter; a third logical shifter; a first AND gate; a second AND gate; a first multiplexer; a third AND gate; a first adder; a fourth logical shifter; a second multiplexer; a second adder; a first arithmetic shifter; a second arithmetic shifter; a third arithmetic shifter; a third multiplexer; a fourth multiplexer; and a fifth multiplexer.

The first input terminal is configured to receive a first signal that transmits an input bit string. The second input terminal is configured to receive a second signal that includes first to eighth control signals. The output terminal is configured to output a signal indicating a product of a value indicated by the first signal and a value indicated by the second signal. The first logical shifter is configured to output a first bit string obtained by shifting left a sequence of bits of the input bit string by one bit. The second logical shifter is configured to output a second bit string obtained by shifting left a sequence of bits of the first bit string by one bit. The third logical shifter is configured to output a third bit string obtained by shifting left a sequence of bits of the second bit string by one bit. The first AND gate is configured to output a fourth bit string that is an arithmetic result of a logical product of values of the input bit string and the first control signal. The second AND gate is configured to output a fifth bit string that is an arithmetic result of a logical product of values of the first bit string and the second control signal. The first multiplexer is configured to output, based on the third control signal, a sixth bit string that is either the second bit string or the third bit string. The third AND gate is configured to output a seventh bit string that is an arithmetic result of a logical product of values of the sixth bit string and the fourth control signal. The first adder is configured to output an eighth bit string that is a sum of the seventh bit string and the fifth bit string. The fourth logical shifter is configured to output a ninth bit string obtained by shifting left a sequence of bits of the eighth bit string by one bit. The second multiplexer is configured to output, based on the fifth control signal, a tenth bit string that is either the eighth bit string or the ninth bit string. The second adder is configured to output an eleventh bit string that is a sum of the fourth bit string and the tenth bit string. The first arithmetic shifter is configured to output a twelfth bit string obtained by shifting right a sequence of bits of the eleventh bit string by five bits while maintaining a sign. The second arithmetic shifter is configured to output a thirteenth bit string obtained by shifting right a sequence of bits of the twelfth bit string by one bit while maintaining a sign. The third arithmetic shifter is configured to output a fourteenth bit string obtained by shifting right a sequence of bits of the thirteenth bit string by one bit while maintaining a sign. The third multiplexer outputs, based on the sixth control signal, a fifteenth bit string that is either the eleventh bit string or the twelfth bit string. The fourth multiplexer is configured to output, based on the seventh control signal, a sixteenth bit string that is either the thirteenth bit string or the fourteenth bit string. The fifth multiplexer is configured to output, as the signal indicating the product, an output signal that transmits either the fifteenth bit string or the sixteenth bit string based on the eighth control signal.

Embodiments will now be described with reference to the figures. In the following description, components with substantially the same functionalities and configurations will be referred to with the same reference numerals, and repeated descriptions may be omitted. In order to distinguish components having substantially the same function and configuration from each other, an additional numeral or letter may be added to the end of each reference numeral.

The entire description for a particular embodiment also applies to another embodiment unless explicitly mentioned otherwise or obviously eliminated. Each functional block can be implemented as hardware, computer software, or a combination of both. For this reason, in order to clearly illustrate that each block can be any of hardware, software or a combination thereof, descriptions will be made in terms of their functionalities in general. It is not necessary that functional blocks be distinguished as in the following examples. For example, some of the functions may be implemented by functional blocks different from those illustrated below. Furthermore, an illustrated functional block may be divided into functional sub-blocks.

Moreover, any step in a flow of a method of an embodiment is not limited to any illustrated order, and can occur in an order different from an illustrated order and/or can occur concurrently with another step.

In the specification and the claims described herein, a first component being "coupled" to a second element includes the first component being coupled to the second component directly or through the intervention of electronic waves and may be a component that is constantly conductive or selectively conductive.

1. First Embodiment 1. 1. Configuration (Structure)

FIG. 1 shows components in an arithmetic circuit and couplings of the components according to the first embodiment. An arithmetic circuit 100 can be included in, for example, a calibration circuit.

As shown in FIG. 1, the arithmetic circuit 100 receives a digital input signal SIN and a digital input signal Sm. The arithmetic circuit 100 obtains a product of a value transmitted by the input signal SIN and a value transmitted by the input signal Sm. Hereinafter, a value transmitted by a signal with a certain name may be simply referred to as a "value of the signal". For example, a value transmitted by a signal S may be referred to as a "value of the signal S".

The arithmetic circuit 100 outputs an obtained product as a digital output signal SOUT. The input signal SIN transmits a value of a plurality of bits. The input signal SIN transmits, for example, a binary multiplicand Y. The input signal Sm transmits, for example, a value of a binary-coded decimal (BCD), and transmits a multiplier X.

The arithmetic circuit 100 includes a plurality of arithmetic devices OP (OP1, OP2, OP3, . . . ), an adder 2, and a selective conversion circuit 4. The arithmetic circuit 100 includes arithmetic devices OP of a number that is equal to or larger than the number of digits of a decimal value transmitted by the signal Sm. The embodiment in which a plurality of arithmetic devices OP are included is based on an example in which the arithmetic circuit 100 includes five arithmetic devices OP1, OP2, OP3, OP4, and OP5. Details of a case where the arithmetic circuit 100 includes four or less or six or more arithmetic devices OP can be inferred from the descriptions about the five arithmetic devices OP given below.

The selective conversion circuit 4 converts the input signal Sm into a plurality of different control signals Sc (Sc1, Sc2, Sc3, Sc4, and Sc5), and supplies the control signals Sc obtained by the conversion to the respective arithmetic devices OP. The selective conversion circuit 4 converts the input signal SIN into a plurality of different data signals YIN (YIN1, YIN2, YIN3, YIN4, and YIN5), and supplies the data signals YIN obtained by the conversion to the respective arithmetic devices OP.

The arithmetic devices OP have the same components with the same couplings. Each arithmetic device OP includes a first input and a second input, and receives an input signal via each of the first input and the second input, and outputs a signal that transmits a value based on the received signals. Details will be described below. Each arithmetic device OP receives a control signal Sc via its first input. More specifically, the arithmetic devices OP1, OP2, OP3, OP4, and OP5 respectively receive the control signals Sc1, Sc2, Sc3, Sc4, and Sc5 at their control input terminals. Each arithmetic device OP receives a signal YIN via its second input. More specifically, the arithmetic devices OP1, OP2, OP3, OP4, and OP5 respectively receive data signals YIN1, YIN2, YIN3, YIN4, and YIN5 at their data input terminals.

Each arithmetic device OP outputs, from its output terminal, a signal ZOUT (ZOUT1, ZOUT2, ZOUT3, ZOUT4, and ZOUT5) that transmits a product of a value specified by a value of the control signal Sc received via the first input and a value of the signal YIN received via the second input. More details will be described below. The arithmetic device OP1 outputs the signal ZOUT1 that transmits a product of a value specified by the control signal Sc1 and a value of the signal YIN1. The arithmetic device OP2 outputs the signal ZOUT2 that transmits a product of a value specified by the control signal Sc2 and a value of the signal YIN2. The arithmetic device OP3 outputs the signal ZOUT3 that transmits a product of a value specified by the control signal Sc3 and a value of the signal YIN3. The arithmetic device OP4 outputs the signal ZOUT4 that transmits a product of a value specified by the control signal Sc4 and a value of the signal YIN4. The arithmetic device OP5 outputs the signal ZOUT5 that transmits a product of a value specified by the control signal Sc5 and a value of the signal YIN5.

The adder 2 receives the signals ZOUT from all the arithmetic devices OP. Based on the received signals ZOUT, the adder 2 outputs a signal SOUT. The signal SOUT transmits a sum of the values of the received signals ZOUT. A value of the output signal SOUT is a binary number.

1.1.1. Configuration of Arithmetic Device

FIG. 2 shows components in an arithmetic device OP and couplings of the components according to the first embodiment. As shown in FIG. 2, the arithmetic devices OP receive a signal YIN and control signals SEL0, SEL1, SEL2, SEL3, SEL4, SEL5, SEL6, and SEL7, and outputs the signal ZOUT. Each of the control signals SEL0 to SEL7 is a one-bit signal. A set of the control signals SEL0 to SEL7 forms the control signal Sc.

The arithmetic device OP includes AND gates AG1, AG2, and AG3, adders AD1 and AD2, multiplexers (MUX) MX1, MX2, MX3, MX4, and MX5, one-bit logical left shifters (SFL1) LO1, LO2, LO3, and LO4, a five-bit arithmetic right shifter (ASFR5) RF1, and one-bit arithmetic right shifters (ASFR1) RO1 and RO2.

In FIG. 2, each thick line indicating interconnect that transmit signals represents a set of interconnects (hereinafter referred to as an "interconnect group") that transmit a plurality of bits, and each interconnect transmits a 1-bit signal. That is, each thick line represents a set of interconnects each of which transmits a single bit. Each interconnect in the interconnect group represented by the thick lines transmits a unique bit (digit). Each interconnect group represented by the thick line includes at least a number of interconnects equal to or larger than the number of bits of the signal YIN. In the description that follows, it is assumed that the signal YIN transmits a value of n bits (where n is a natural number equal to or greater than 2), and each interconnect group includes n interconnects. That is, first to n-th interconnects of the interconnect group represented by the thick lines respectively transmit signals of a first bit, which is the least significant bit, to a n-th bit, which is the most significant bit. The signals transmitted by the interconnect group shown by the thick lines have signed values.

Similarly, the AND gate AG, the left one-bit logic shifter (SFL1) LO, the five-bit arithmetic right shifter (ASFR5) RF, the one-bit arithmetic right shifter (ASFR1) RO, and the multiplexer MX can handle signals configured of multiple bits (n bits) from a first bit as the least significant bit to an n-th bit as the most significant bit. Hereinafter, a signal with such a configuration will be referred to as an "n-bit signal".

Details will be described below. Each AND gate AG receives a first n-bit signal, and receives a second n-bit signal. Each AND gate AG generates a logical product of the same bits in the first to n-th bit positions of the first n-bit signal and the first to n-th bit positions of the second n-bit signal. Each AND gate AG outputs an n-bit signal that includes logical products of the first to n-th bits in the first to n-th bit positions, respectively.

Each 1-bit logical left shifter LO receives an n-bit signal, and shifts left (i.e., toward the n-th or most significant bit) (or, performs a logical left shift on) a sequence of bits of the received n-bit signal (hereinafter referred to as a "bit string") by one bit. Each one-bit logical left shifter LO outputs a signal having a new bit string obtained by performing a logical shift. After the least significant bit is moved left by the left shift, a position in the least significant bit is filled with a 0.

Upon receiving the n-bit signal, the arithmetic shifters RF and RO respectively shift right (i.e., toward the first or least significant bit) (or, performs an arithmetic right shift on) a bit string of the received n-bit signal by five bits and one bit. Each of the arithmetic shifters RF and RO outputs a signal that has a new bit string obtained by performing an arithmetic shift. In general, a sign of n-bit data is represented by the most significant bit (i.e., n-th bit). Since a bit position from which the most significant bit has been moved right by an arithmetic right shift (five consecutive bits including the most significant bit of a bit string output from the arithmetic shifter RF and the most significant bit of a bit string output from the arithmetic shifter RO) is filled with the same value as that of the most significant bit of the signal prior to the shift, the sign of the data does not change before and after the shift.

Each multiplexer MX receives an n-bit signal via its first input, and receives an n-bit signal via its second input. In symbols for the multiplexers MX in FIG. 2, the first input is denoted by "0", and the second input is denoted by "1". Each multiplexer MX receives a signal (select signal) via its selective input, and outputs either a signal received via the first input or a signal received via the second input, whichever is specified by the select signal. The multiplexer MX outputs a signal received via the first input while a low-level select signal is being received. The multiplexer MX outputs a signal received via the second input while a high-level select signal is being received.

The signal YIN is received by the one-bit logical left shifter LO1. The one-bit logical left shifter LO1 performs a one-bit logical left shift on a bit string of the n-bit signal YIN, and generates a signal S1. The signal S1 transmits an n-bit value. A value of the signal S1 has a magnitude $2^1$ times the value of the signal YIN.

The signal YIN is also received by a first input of the AND gate AG1. The AND gate AG1 receives, via its second input, a signal that has a value of the control signal SEL0 in all the n bit positions. That is, all the bits of the n-bit signal given to the second input of the AND gate AG1 are coupled to the control signal SEL0. The AND gate AG1 outputs a signal S2 that transmits an n-bit value.

The signal S1 is received by the one-bit logical left shifter LO2. The one-bit logical left shifter LO2 performs a one-bit logical left shift on a bit string of the n-bit signal S1, and generates a signal S3. The signal S3 transmits an n-bit value. A value of the signal S3 has a magnitude $2^2$ times the value of the signal YIN.

The signal S1 is also received by a first input of the AND gate AG2. The AND gate AG2 receives, via its second input, a signal that has a value of the control signal SEL1 in all the n bit positions. That is, all the bits of the n-bit signal given to the second input of the AND gate AG2 are coupled to the control signal SEL1. The AND gate AG2 outputs a signal S4 that transmits an n-bit value.

The signal S3 is received by the one-bit logical left shifter LO3. The one-bit logical left shifter LO3 performs a one-bit logical left shift on a bit string of the n-bit signal S3, and generates a signal S5. The signal S5 transmits an n-bit value. A value of the signal S5 has a magnitude $2^3$ times the value of the signal YIN.

The signal S5 is received by a second input of the multiplexer MX1. The multiplexer MX1 receives a signal S3 via its first input. The multiplexer MX1 receives the control signal SEL3 as its select signal. The multiplexer MX1 outputs, as a signal S6, one of the signals S3 and S5 that is selected based on the control signal SEL3. The signal S6 transmits an n-bit value.

The signal S6 is received by a first input of the AND gate AG3. The AND gate AG3 receives, via its second input, a signal that has a value of the control signal SEL2 in all the n bit positions. That is, all the bits of the n-bit signal given to the second input of the AND gate AG3 are coupled to the control signal SEL2. The AND gate AG3 outputs a signal S7 that transmits an n-bit value.

The signal S7 is received by a first input of the adder AD1. The adder AD1 receives the signal S4 from the AND gate AG2 via its second input. Based on the signals S4 and S7, the adder AD1 outputs a signal S8. The signal S8 transmits a sum of values of the signals S7 and S4. The signal S8 has an n-bit value. There is a case where the number of bits of the signal representing the sum needs to be larger than the two to-be-added numbers prior to the addition by one bit. Herein, it is assumed that the bit width is n bits, taking into account an increase in the number of bits as a result of the addition or the shift, and that a sign representing bit and 0 are respectively given to the high order and the low order of the input signal, with an extension by a required number.

The signal S8 is received by the one-bit logical left shifter LO4. The one-bit logical left shifter LO4 performs a one-bit logical left shift on a bit string of the n-bit signal S8 to generate a signal S9. The signal S9 transmits an n-bit value. A value of the signal S9 has a magnitude $2^1$ times a value of the signal S8.

The signal S9 is received by a second input of the multiplexer MX2. The multiplexer MX2 receives the signal S8 via its first input. The multiplexer MX2 receives the control signal SEL4 as its select signal. The multiplexer MX2 outputs, as a signal S10, one of the signals S8 and S9 that is selected based on the control signal SEL4. The signal S10 transmits an n-bit value.

The signal S10 is received by a first input of the adder AD2. The adder AD2 receives the signal S2 from the AND gate AG1 via its second input. Based on the signals S2 and S10, the adder AD2 outputs a signal S14. The signal S14 transmits a sum of the values of the signals S10 and S2. The signal S14 has an n-bit value.

The signal S14 is received by the five-bit arithmetic right shifter RF1. The five-bit arithmetic right shifter RF1 performs a five-bit right arithmetic shift on a bit string of the signal S14 to generate a signal S15. The signal S15 transmits an n-bit value. A value of the signal S15 has a magnitude $2^{-5}$ times the value of the signal S14.

The signal S15 is received by a second input of the multiplexer MX3. The multiplexer MX3 receives the signal S14 via its first input. The multiplexer MX3 receives the control signal SEL5 as its select signal. The multiplexer MX3 outputs, as a signal S16, one of the signals S14 and S15 that is selected based on the control signal SEL5. The signal S16 transmits an n-bit value.

The signal S15 is also received by the one-bit arithmetic right shifter RO1. The one-bit arithmetic right shifter RO1 performs a one-bit right arithmetic shift on a bit string of the signal S15 to generate a signal S17. The signal S17 transmits an n-bit value. A value of the signal S17 has a magnitude $2^{-6}$ times the value of the signal S14.

The signal S17 is received by the one-bit arithmetic right shifter RO2. The one-bit arithmetic right shifter RO2 performs a one-bit right arithmetic shift on a bit string of the signal S17 to generate a signal S18. The signal S18 transmits an n-bit value. A value of the signal S18 has a magnitude $2^{-7}$ times the value of the signal S14.

The signal S18 is received by a second input of the multiplexer MX4. The multiplexer MX4 receives the signal S17 via its first input. The multiplexer MX4 receives the control signal SEL6 as its select signal. The multiplexer MX4 outputs, as a signal S19, one of the signals S17 and S18 that is selected based on the control signal SEL6. The signal S19 transmits an n-bit value.

The signal S19 is received by a second input of the multiplexer MX5. The multiplexer MX5 receives the signal S16 via its first input. The multiplexer MX5 receives the control signal SEL7 as its select signal. The multiplexer MX5 outputs, as the signal ZOUT, one of the signals S16 and S19 that is selected based on the control signal SEL7.

In the above description, the input and output bit widths of the components configuring the arithmetic device OP are all equal (n bits); however, the above-described configuration may be implemented by extending the bits by the number of bits that are shifted to the high-order side or the low-order side by a logical left shift or an arithmetic right shift. In this method, there may be a case where two signals input to each of an AND gate, a multiplexer, and an adder have different bit widths; in such a case, the bit widths of the two inputs can be aligned by appending one or more bits at a position for an order higher than the most significant (sign) bit of the input with a lower number of bits, or appending one or more 0s at a position for an order lower than the least significant bit of the input with a lower number of bits. There may be a case where the bit width is increased by one bit by an addition; in such a case, the bit widths before and after the addition can be aligned by appending a bit at a position for an order higher than the most significant (sign) bit of the signal with a lower number of bits. In such an implementation method, the bit width of the output ZOUT is greater than the bit width of the input YIN.

1.1.2. Configuration of Selective Conversion Circuit

FIG. 3 shows components in a selective conversion circuit and an adder and couplings of the components according to the first embodiment. As shown in FIG. 3, the selective conversion circuit 4 includes decoders DC1 to DC5 and arithmetic devices OC1 to OC5. The decoders DC1 to DC5 receive signals Sm1 to Sm5, respectively. Each of the signals Sm1 to Sm5 transmits a digit of the signal Sm, which transmits a 5-digit decimal number. That is, the signals Sm1 to Sm5 transmit values of the lowest-order, second-lowest-order, the third-lowest-order, the fourth-lowest-order, and the fifth-lowest-order digits, respectively, of the signal Sm. The decoders DC1 to DC5 convert the signals Sm1 to Sm5 into the control signals Sc1 to Sc5, respectively.

The arithmetic devices OC1 to OC5 have the same configuration as the arithmetic devices OP (OP1 to OP5), and their internal configurations are shown by FIG. 2. The arithmetic device OC1 receives a control signal ScL via its control input terminal (i.e., terminals via which the control signals SEL7 to SEL0 in FIG. 2 are received). The control signal ScL has a value that specifies 1/10. The arithmetic device OC1 receives the signal YIN2 via its data input terminal (a terminal via which the signal YIN in FIG. 2 is received). The arithmetic device OC1 outputs the signal YIN1.

The arithmetic device OC2 receives the control signal ScL via its control input terminal. The arithmetic device OC2 receives the signal YIN3 via its data input terminal. The arithmetic device OC2 outputs the signal YIN2.

The arithmetic device OC3 receives a control signal ScC via its control input terminal. The control signal ScC has a value that specifies 1. The arithmetic device OC3 receives an input signal SIN via its data input terminal. The arithmetic device OC3 outputs the signal YIN3.

The arithmetic device OC4 receives a control signal ScH via its control input terminal. The control signal ScH has a value that specifies 10. The arithmetic device OC4 receives the signal YIN3 via its data input terminal. The arithmetic device OC4 outputs the signal YIN4.

The arithmetic device OC5 receives the control signal ScH via its control input terminal. The arithmetic device OC5 receives the signal YIN4 via its data input terminal. The arithmetic device OC5 outputs the signal YIN5.

With the above-described couplings of the arithmetic devices OC1 to OC5 and the values of the control signals ScL, ScC, and ScH, the signals YIN1 to YIN5 have the following values.

The signal YIN1 has a value of $(1/10) \times (1/10) \times \text{SIN}$.
The signal YIN2 has a value of $(1/10) \times \text{SIN}$.
The signal YIN3 has a value of $1 \times \text{SIN}$.
The signal YIN4 has a value of $10 \times \text{SIN}$.
The signal YIN5 has a value of $10 \times 10 \times \text{SIN}$.

The adder 2 includes adders AD21, AD22, AD23, AD24, and AD25. The adder AD21 receives a signal that transmits a value 0 and the signal ZOUT1, and outputs a signal that transmits a sum of 0 and a value of the signal ZOUT1. The adder AD22 receives the output of the adder AD21 and the signal ZOUT2, and outputs a signal that transmits a sum of the output of the adder AD21 and a value of the signal ZOUT2. The adder AD23 receives the output of the adder AD22 and the signal ZOUT3, and outputs a signal that transmits a sum of the output of the adder AD22 and a value of the signal ZOUT3. The adder AD24 receives the output of the adder AD23 and the signal ZOUT4, and outputs a signal that transmits a sum of the output of the adder AD23 and a value of the signal ZOUT4. The adder AD25 receives the output of the adder AD24 and the signal ZOUT5, and outputs a signal SOUT. The signal SOUT transmits a sum of the output of the adder AD24 and a value of the signal ZOUT5.

1.2. Operation 1.2.1. Operation of Arithmetic Device

An arithmetic operation by the arithmetic device OP is performed by a method to be described below. The arithmetic device OP is capable of performing multiplication using, as a multiplier, a selected one of 0, an integer equal to or greater than 1 and equal to or less than 10, and the inverse of the integer equal to or greater than 1 and equal to or less than 10.

FIG. 4 shows a combination of values of the control signals SEL0 to SEL7 for an arithmetic operation performed by the arithmetic device OP according to the first embodiment. As described with reference to FIG. 2 and shown in FIG. 4, a combination of the values of the control signals SEL0 to SEL7 specifies a unique multiplier. That is, to obtain a result of a multiplication of a signal YIN and a multiplier as a signal ZOUT, the levels of the control signals SEL0 to SEL7 are set to levels to be described below. In the description that follows, "X: $\alpha\beta\gamma\delta\epsilon\zeta\theta\iota$" means that, to specify a multiplier X, the levels of the control signals SEL7, SEL6, SEL5, SEL4, SEL3, SEL2, SEL1, and SEL0 are set to $\alpha$, $\beta$, $\gamma$, $\delta$, $\epsilon$, $\zeta$, $\theta$, and $\iota$, respectively. Each of $\alpha$, $\beta$, $\gamma$, $\delta$, $\delta$, $\epsilon$, $\zeta$, $\theta$, and $\iota$ is either a high level (H), a low level (L), or a don't-care level (−). H is equal to the binary number 1, and L is equal to the binary number 0.

10 :L-LLHHHL
9 :L-LLHHLH
8 :L-LLHHLL
7 :L-LLLHHH
6 :L-LLLHHL
5 :L-LLLHLH
4 :L-LLLHLL
3 :L-LL-LHH
2 :L-LL-LHL
1 :L-L- -LLH
1/2 :L-HHHHLL
1/3 :HL-HHHHH
1/4 :L-HLHLLL
1/5 :HL-HLHHH
1/6 :HH-HHHHH
1/7 :HL-LHHLH
1/8 :L-HLLHLL
1/9 :HL-LLHHH
1/10 :HH-HLHHH
0 :L-L- -LLL

When a combination of the values of the control signals SEL0 to SEL7 that specifies a multiplier that is requested to be calculated is input to the arithmetic device OP, a product of the signal YIN and the multiplier is output as the signal ZOUT.

FIG. 5 shows arithmetic operations performed in the arithmetic device OP according to the first embodiment. More specifically, FIG. 5 shows arithmetic operations performed in the arithmetic device OP for calculations in which each of 0, an integer equal to or greater than 1 and equal to or less than 10, and the inverse of the integer equal to or greater than 1 and equal to or less than 10 is used as the multiplier. In a case of a multiplication, the rate of error of a value of the signal ZOUT with respect to the actual value (hereinafter simply referred to as an "error") is 0%. However, in a case of a division (i.e., a multiplication using a fractional multiplier), since the arithmetic operation is performed by approximation, as will be described below, an error occurs.

As shown in FIG. 5, when the multiplier is 10, as the value of the signal ZOUT, $$YIN \times (2^3+2^1) \quad \text{Formula (1)}$$

is obtained. In this case, an error rate between the actual value and the value of the signal ZOUT is 0%.

When the multiplier is 9, as the value of the signal ZOUT, $$YIN \times (2^3+2^0) \quad \text{Formula (2)}$$

is obtained. In this case, the error rate is 0%.

When the multiplier is 8, as the value of the signal ZOUT, $$YIN \times (2^3) \quad \text{Formula (3)}$$

is obtained, and the error rate is 0%.

When the multiplier is 7, as the value of the signal ZOUT, $$YIN \times (2^2+2^1+2^0) \quad \text{Formula (4)}$$

is obtained. In this case, the error rate is 0%.

When the multiplier is 6, as the value of the signal ZOUT, $$YIN \times (2^2+2^1) \quad \text{Formula (5)}$$

is obtained. In this case, the error rate is 0%.

When the multiplier is 5, as the value of the signal ZOUT, $$YIN \times (2^2+2^0) \quad \text{Formula (6)}$$

is obtained. In this case, the error rate is 0%.

When the multiplier is 4, as the value of the signal ZOUT, $$YIN \times (2^2) \quad \text{Formula (7)}$$

is obtained. In this case, the error rate is 0%.

When the multiplier is 3, as the value of the signal ZOUT, $$YIN \times (2^1+2^0) \quad \text{Formula (8)}$$

is obtained. In this case, the error rate is 0%.

When the multiplier is 2, as the value of the signal ZOUT, $$YIN \times (2^1) \quad \text{Formula (9)}$$

is obtained. In this case, the error rate is 0%.

When the multiplier is 1, as the value of the signal ZOUT, $$YIN \times (2^0) \quad \text{Formula (10)}$$

is obtained. In this case, the error rate is 0%.

When the multiplier is ½, as the value of the signal ZOUT, $$YIN \times (2^4/2^5) \quad \text{Formula (11)}$$

is obtained. In this case, the error rate is 0%.

When the multiplier is ⅓, as the value of the signal ZOUT, $$YIN \times [\{(2^3+2^1) \times 2+2^0\}/2^6)] \quad \text{Formula (12)}$$

is obtained. In this case, the error rate is −1.5625%.

When the multiplier is ¼, as the value of the signal ZOUT, $$YIN \times (2^3/2^5) \quad \text{Formula (13)}$$

is obtained. In this case, the error rate is 0%.

When the multiplier is ⅕, as the value of the signal ZOUT, $$YIN \times [\{(2^2+2^1) \times 2+2^0\}/2^6] \quad \text{Formula (14)}$$

is obtained. In this case, the error rate is 1.5625%.

When the multiplier is ⅙, as the value of the signal ZOUT, $$YIN \times [\{(2^3+2^1) \times 2+2^0\}/2^7] \quad \text{Formula (15)}$$

is obtained. In this case, the error rate is −1.5625%.

When the multiplier is ⅐, as the value of the signal ZOUT, $$YIN \times \{(2^3+2^0)/2^6\} \quad \text{Formula (16)}$$

is obtained. In this case, the error rate is −1.5625%.

When the multiplier is ⅛, as the value of the signal ZOUT, $$YIN \times (2^2/2^5) \quad \text{Formula (17)}$$

is obtained. In this case, the error rate is 0%.

When the multiplier is ⅑, as the value of the signal ZOUT, $$YIN \times \{(2^2+2^1+2^0)/2^6\} \quad \text{Formula (18)}$$

is obtained. In this case, the error rate is −1.5625%.

When the multiplier is ⅒, as the value of the signal ZOUT, $$YIN \times [\{(2^2+2^1) \times 2+2^0\}/2^7] \quad \text{Formula (19)}$$

is obtained. In this case, the error rate is 1.5625%.

When the multiplier is 0, as the value of the signal ZOUT, $$YIN \times 0 \quad \text{Formula (20)}$$

is obtained. In this case, the error rate is 0%.

1.2.2. Operation of Arithmetic Circuit 1.2.2.1 Multiplication

Hereinafter, a value of a signal S may be simply referred to as a "value S" or "S". For example, the value of an input signal SIN may be simply referred to as a "value SIN" or "SIN".

As a specific example, it is assumed that Sm is 314.15. In this case, a calculation of SOUT=SIN×314.15 may be replaced with the following calculation:

$$SOUT = 3 \times 10 \times 10 \times SIN + 10 \times SIN + 4 \times SIN + (1/10) \times SIN + 5 \times (1/10) \times (1/10) \times SIN$$

That is, with respect to each digit of Sm, a product of a value of the digit of Sm, a power of ten corresponding to the place of the digit, and SIN is obtained, and the products obtained with respect to all the digits are added. A calculation is performed with respect to each digit using a single arithmetic device OP. Formulas for calculations with respect to the respective digits are referred to as follows: The formula "3×10×10×SIN" for the product of a value of the hundreds digit of Sm and SIN is referred to as Formula (21). The formula "10×SIN" for the product of a value of the tens digit of Sm and SIN is referred to as Formula (22). The formula "4×SIN" for the product of a value of the units digit of Sm and SIN is referred to as Formula (23). The formula "(1/10)×SIN" for the product of the value of the tenths digit of Sm and SIN is referred to as Formula (24). The formula "5×(1/10)×(1/10)×SIN" for the product of the value of the hundredths digit of Sm and SIN is referred to as Formula (25).

Based on the exemplary Sm being 314.15, Sm1 to Sm5 are 5, 1, 4, 1, and 3, respectively. Based thereon, the decoders DC1 to DC5 shown in FIG. 3 output control signals Sc1 to Sc5 to be described below, in accordance with the table of FIG. 4.

Sc1 is L-LLLHLH (decoded result of a decimal number 5).
Sc2 is L-L- -LLH (decoded result of a decimal number 1).
Sc3 is L-LLLHLL (decoded result of a decimal number 4).
Sc4 is L-L- -LLH (decoded result of a decimal number 1).
Sc5 is L-LL-LHH (decoded result of a decimal number 3).

As will be described with reference to FIG. 3, the control signals ScL, ScC, and ScH have following values to specify 1/10, 1, and 10, respectively.

ScL is HH-HLHHH (decoded result of a decimal number 1/10).
ScC is L-L- -LLH (decoded result of a decimal number 1).
ScH is L-LLHHHL (decoded result of a decimal number 10).

The signals YIN1 to YIN5 have the following values, as described with reference to FIG. 3.

$$YIN1=(1/10) \times (1/10) \times SIN$$

$$YIN2=(1/10) \times SIN$$

$$YIN3=1 \times SIN$$

$$YIN4=10 \times SIN$$

$$YIN5=10 \times 10 \times SIN$$

Based on the signals YIN1 to YIN5, the arithmetic devices OP1 to OP5 respectively perform arithmetic operations defined by the control signals Sc1 to SC5 on YIN1 to YIN5. In the example in which Sm is 314.15, the arithmetic operations of Formulas (21) to (25) are performed by OP5, OP4, OP3, OP2, and OP1, and the results of the arithmetic operations are output as signals ZOUT5, ZOUT4, ZOUT3, ZOUT2, and ZOUT1.

The adder 2 adds values ZOUT1, ZOUT2, ZOUT3, ZOUT4, and ZOUT5. The adder 2 outputs the result of the addition as an output signal SOUT. In the example in which Sm is 314.15, the value of the output signal SOUT is equal to the product of SIN and 314.15.

Similarly, the product of the input signal Sm having a given value and the input signal SIN can be obtained with respect to each of the five digits.

A division can be performed by a given divisor by converting the inverse of the divisor into a decimal and multiplying the decimal obtained by the conversion. When, for example, the divisor is 12.5, 1/12.5=0.08. Accordingly, SOUT can be obtained by SIN×0.08.

1.3. Advantages (Effects)

According to the first embodiment, it is possible to provide an arithmetic device OP having a small area and capable of performing multiplication with a multiplier of a one-digit decimal and an inverse of a one-digit decimal, as will be described below.

In a first approach as a comparative example, a high-speed multiplication can be performed by providing a large number of addition and subtraction units. In a technical field in which multiplications are frequently performed, such as digital signal processing, it is efficient to implement an apparatus that performs digital signal processing with a multiplying unit, and therefore consumption of an area by providing a dedicated circuit is acceptable. However, in another technical field, such as calibration of an analogue circuit is controlled by a digital circuit, it is inefficient to use an arithmetic device with a large circuit area for a multiplication that is required only once during the operation period. In a second approach as a comparative example, the arithmetic device can be configured with the smallest possible area. In this case, however, a required number of clock edges during the operation might not be ensured.

Thus, the first approach as the comparative example in which a large number of adders/subtractors are used for enhanced speed can be insufficient depending on the application, and the second approach as the comparative example with a small area may not allow the operation to be completed within a time limit. To address such issues, an approach that is an intermediate of the two approaches, as will be described below, can be employed.

First, a multiplication will be described. In the following, it is assumed that the signs of all the numerical values are positive, for the sake of simplicity of description. When a multiplicand Y and a multiplier X are both 16-bit, a product Z (where Z has a 32-bit value) of Y and X is expressed by the following Formula (26).

$$Z=Y \times X \qquad \text{Formula (26)}$$

The multiplier X is split into four, non-overlapping sections $X_0$, $X_1$, $X_2$, and $X_3$ each of which has adjacent four bits, as shown in Formula (27).

$$X=16^3 \times X_3 + 16^2 \times X_2 + 16^1 \times X_1 + 16^0 \times X_0 \qquad \text{Formula (27)}$$

Using this representation, Formula (26) can be converted as in (28).

$$Z=Y \times 16^3 \times X_3 + Y \times 16^2 \times X_2 + Y \times 16 \times X_1 + Y \times X_0 \qquad \text{Formula (28)}$$

An arithmetic operation of multiplying a number by 16 is equivalent to shifting left by four bits a bit string of the number. Accordingly, Z is obtained by repeating four times an arithmetic operation of shifting a result of a multiplication using a multiplying unit that multiplies a 4-bit multiplier and a 16-bit multiplicand and adding the value obtained by the shift to a result obtained by arithmetic operations performed previously during the multiplication.

On the other hand, a division cannot be performed in a similar manner to the multiplication. When a divisor D and a dividend N are both 16-bit, a quotient Q obtained by dividing N by D is expressed by the following Formula (29):

$$Q=N/D \qquad \text{Formula (29)}$$

When the divisor D is split similarly to the example of the multiplication, the quotient Q is expressed as in the following Formula (30):

$$Q=N/(16^3 \times D_3 + 16^2 \times D_2 + 16^1 \times D_1 + 16^0 \times D_0) \qquad \text{Formula (30)}$$

It is not easy to calculate Formula (30). Accordingly, in place of the divisor D, the dividend N is split into four non-overlapping sections $N_0$, $N_1$, $N_2$, and $N_3$, each of which has adjacent four bits, as in Formula (31). Based thereon, Formula (29) is converted as in Formula (31).

$$Q = (16^3 \times N_3 + 16^2 \times N_2 + 16^1 \times N_1 + 16^0 \times N_0)/D \qquad \text{Formula (31)}$$

$$= 16^3 \times N_3/D + 16^2 \times N_2/D + 16^1 \times N_1/D + 16^0 \times N_0/D \qquad \text{Formula (32)}$$

As a mathematical formula, the terms of $16^k \times N_k/D$ (k=0, 1, 2, 3) can be expressed as in Formula (33).

$$16^k \times (N_k/D) = (16^k \times N_k)/D \qquad \text{Formula (33)}$$

However, in the case of, for example, k=3, $N_3$=1, and D=15, the left side and the right side of Formula (33) become 0 and 273, respectively, when the digits after the decimal point of the arithmetic result of Formula (33) are truncated. For the calculation of the right side of Formula (33), it takes the same amount of time as N/D. Accordingly, the division cannot be performed at high speed even by splitting the divisor. In this manner, even if a divisor or a dividend is split for a division, a tradeoff between the area of the circuit for the division and the operation speed cannot be easily achieved.

The arithmetic device OP according to the first embodiment includes the components and the couplings shown in FIG. 2. Through the specification of the multiplier by the combination of the values of the control signals SEL, it is possible to perform a multiplication using, as a multiplier, a selected one of 0, an integer equal to or greater than 1 and equal to or less than 10, and the inverse of the integer equal to or greater than 1 and equal to or less than 10, as described with reference to FIG. 4. That is, each of Formula (20) and Formulas (1) to (10) is respectively performed as a multiplication of SIN by 0 or an integer that is equal to or greater than 1 and equal to or less than 10 as a multiplier. Each of Formulas (11), (13), and (17) is respectively performed as a multiplication of SIN by the inverse of 2, 4, and 8 as a multiplier. An approximate arithmetic operation as shown in Formulas (12), (14), (15), (16), (18), and (19) is respectively performed as a multiplication of SIN by the inverse of 3, 5, 6, 7, 9, and 10.

Such multiplication and division can be performed by an arithmetic device OP having a small area. FIG. 6 shows the number of components and the number of elements per multiplicand bit of each of a binary multiplying unit of a comparative example and the arithmetic device OP of the first embodiment. The binary multiplying unit is a conventional arithmetic device of the fixed decimal point type, which is capable of using an integer equal to or greater than 0 and equal to or less than 15 as a multiplier and using a given number of bit strings as a multiplicand, and is a parallel array multiplying unit that does not require a clock for an operation. For the obtainment of the number of elements per multiplicand bit, it is assumed that the AND gate, the multiplexer, and the adder respectively have 6, 14, and 56 elements. Since a shift of a bit string can be performed only with interconnects, the number of elements required for the shift is zero.

The arithmetic device OP is capable of performing multiplication and division, merely by having a number of elements greater by 4.2% than that of the binary multiplying unit that is capable of performing only a multiplication according to the comparative example.

Since the arithmetic device OP is capable of performing multiplication using, as a multiplier, 0, a one-digit integer, or the inverse of the one-digit integer, it is possible to perform a multiplication of each digit of the multiplier using the arithmetic device OP. Through the use of an arithmetic device OP capable of performing broadly general-purpose multiplication, the arithmetic circuit 100 which uses the arithmetic device OP is capable of performing a given number (including the inverse) of multiplications. This suppresses the arithmetic circuit 100 from requiring a large area. With the arithmetic circuit 100, it is also possible to achieve both suppression of a large area of the arithmetic circuit and an increase in the operation speed, which cannot be achieved by splitting the divisor or dividend. In addition, since a clock signal is not required for the operation of the arithmetic circuit 100, the problem caused by the second approach according to the comparative example does not occur.

2. Second Embodiment

The second embodiment differs from the first embodiment in terms of the configuration and the operation of the arithmetic circuit 100. To be distinguished from the arithmetic circuit 100 of the first embodiment, the arithmetic circuit 100 of the second embodiment may be referred to as an arithmetic circuit 100$b$.

2.1. Configuration

Figure 7:
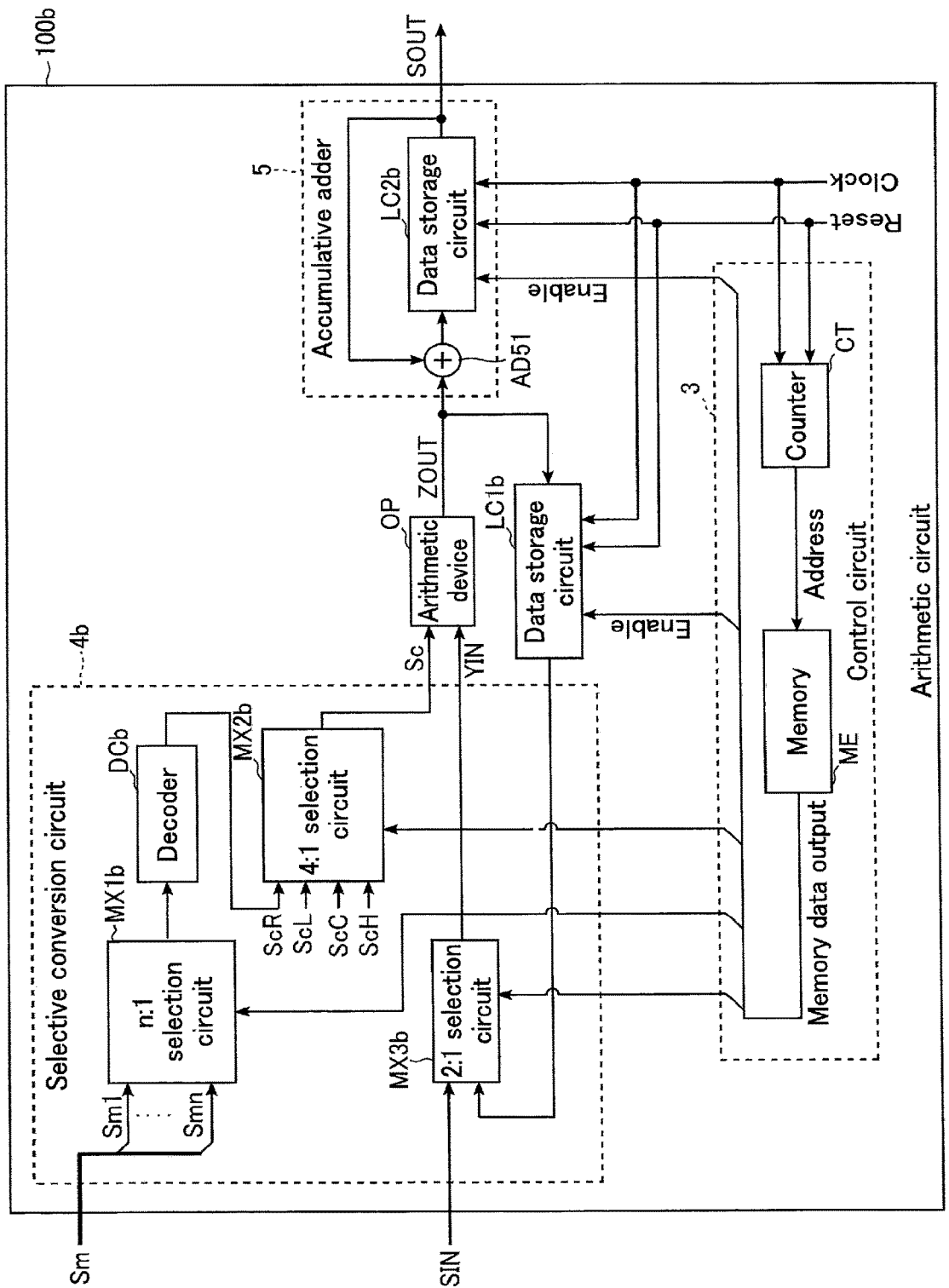
FIG. 7 shows components in an arithmetic circuit and couplings of the components according to a second embodiment.

FIG. 7 shows components in an arithmetic device according to the second embodiment and couplings of the components. As shown in FIG. 7, an arithmetic circuit 100$b$ includes an arithmetic device OP, a control circuit 3, a selective conversion circuit 4$b$, a data storage circuit LC1$b$, and an accumulative adder 5.

The control circuit 3 controls the selective conversion circuit 4$b$, the data storage circuit LC1$b$, and the accumulative adder 5. The control circuit 3 includes a counter CT and a memory ME. The counter CT receives a reset signal and a clock signal. The counter CT counts the number of edges (e.g., rising edges) of the clock signal. Upon receiving a reset signal that is asserted, the counter CT resets a value stored therein. The output (i.e., result of the counting) of the counter CT is supplied to the memory ME as address information. The memory ME outputs data stored in an address specified by the address information.

The selective conversion circuit 4$b$ generates a control signal Sc from an input signal Sm, and supplies the generated control signal Sc to the arithmetic device OP. The selective conversion circuit 4$b$ selects one of the input signal SIN and an output from the data storage circuit LC1$b$ (i.e., a value stored in the data storage circuit LC1$b$), and supplies the selected one to the arithmetic device OP as a signal YIN.

The selective conversion circuit 4$b$ includes an n:1 selection circuit (or, multiplexer) MX1$b$, a 4:1 selection circuit MX2$b$, a 2:1 selection circuit MX3$b$, and a decoder DCb. The n:1 selection circuit MX1$b$ receives signals Sm1 to Smn. The signals Sm1 to Smn transmit respective digits of a signal Sm which transmits an n-digit decimal number. The n:1 selection circuit MX1$b$ outputs one of the signals Sm1 to Smn that is selected based on a control of the control circuit 3.

The decoder DCb receives an output from the n:1 selection circuit MX1$b$. Similarly to the decoders DC1 to DC5 of the first embodiment, the decoder DCb converts the received signal (i.e., one of the signals Sm1 to SMn) into a control signal ScR.

The 4:1 selection circuit MX2$b$ receives control signals ScR, ScL, ScC, and ScH. The 4:1 selection circuit MX2$b$ outputs one of the control signals ScR, ScL, ScC, and ScH that is selected based on the control of the control circuit 3 as a control signal Sc.

The 2:1 selection circuit MX3$b$ receives an input signal SIN and an output from the data storage circuit LC1$b$. The 2:1 selection circuit MX3$b$ outputs, as the signal YIN, one of the input signal SIN and an output from the data storage circuit LC1$b$ that is selected based on the control of the control circuit 3.

The arithmetic device OP outputs a signal ZOUT that transmits a product of a value specified by the value of the control signal Sc and the value of the signal YIN.

The data storage circuit LC1$b$ receives the signal ZOUT, and stores the value of the received signal ZOUT based on the control of the control circuit 3. The data storage circuit LC1$b$ supplies the value stored therein to the selective conversion circuit 4$b$. The data storage circuit LC1$b$ receives the reset signal and the clock signal, and receives an enable signal from the control circuit 3. The data storage circuit LC1$b$ operates based on the enable signal, and operates at a timing based on the clock signal. Upon receiving a reset signal that is asserted, the data storage circuit LC1$b$ resets the value stored therein.

The accumulative adder 5 includes an adder AD51 and a data storage circuit LC2$b$. The accumulative adder 5 receives a signal ZOUT. The adder AD51 in the accumulative adder 5 adds the value of the received signal ZOUT to a value stored in the data storage circuit LC2$b$ prior to the reception of the signal ZOUT to obtain a sum of them. In the accumulative adder 5, the data storage circuit LC2$b$ stores the obtained sum, and outputs an output signal SOUT that transmits the obtained value. The data storage circuit LC2b receives the reset signal and the clock signal, and receives the enable signal from the control circuit 3. The data storage circuit LC2b operates based on the enable signal, and operates at a timing based on the clock signal. Upon receiving a reset signal that is asserted, the data storage circuit LC2b resets a value stored therein.

2.2. Operation

Figure 8:
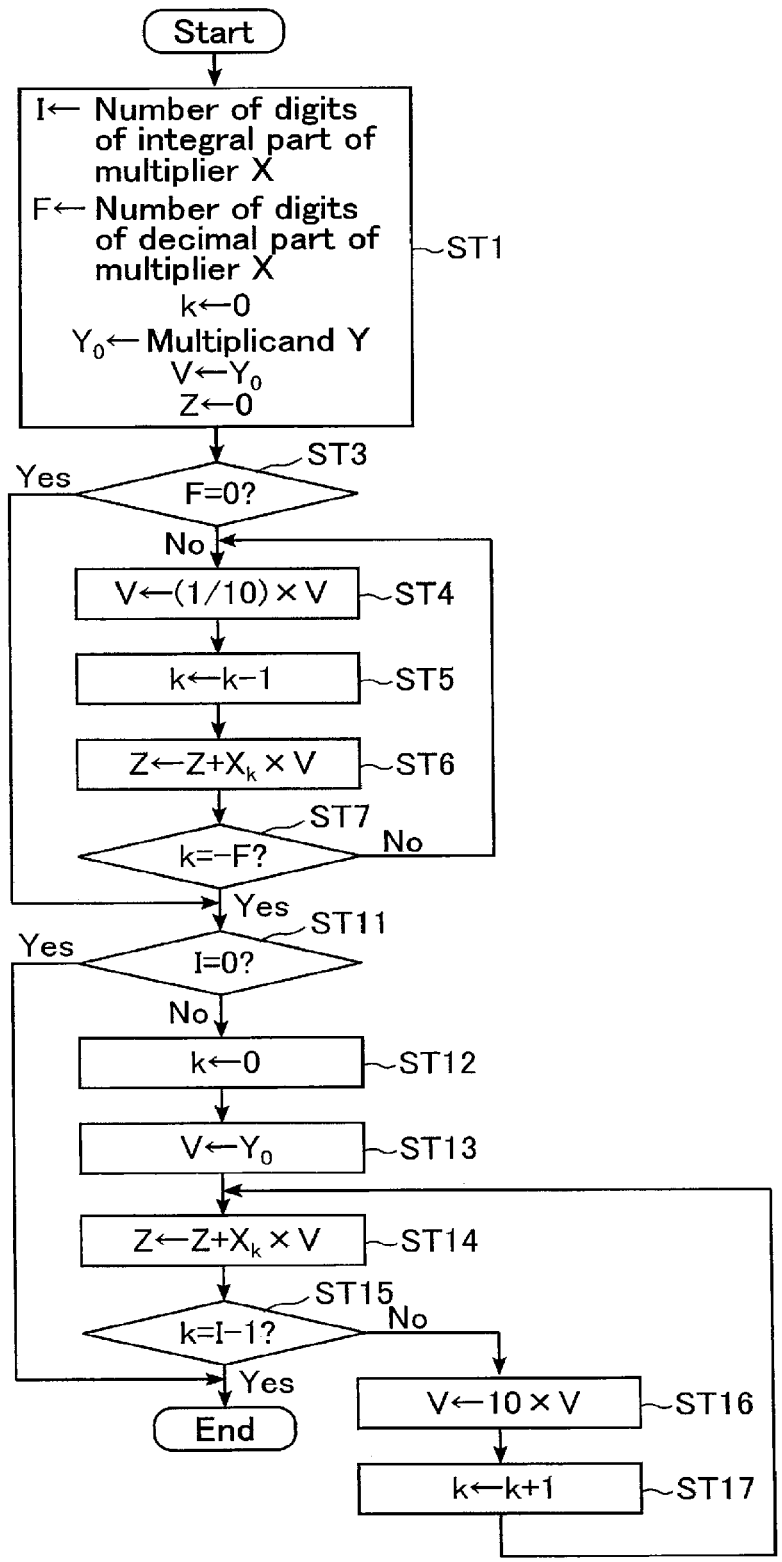
FIG. 8 shows a flow of an operation of the arithmetic circuit according to the second embodiment.

FIG. 8 shows a flow of an operation of the arithmetic circuit 100b according to the second embodiment. The flow of FIG. 8 starts when the control circuit 3 receives an input signal SIN and an input signal Sm. As described in the first embodiment, the input signal Sm transmits a multiplier X, and the input signal SIN transmits a multiplicand Y. The flow corresponds to accumulatively adding products of the digits of the multiplier X and the multiplicand Y, similarly to the sum calculations of Formulas (21) to (25) in the first embodiment.

The control circuit 3 sets variables I, F, k, $Y_0$, V, and Z to values to be described below (ST1). The control circuit 3 sets the variable I to the number of digits of the integral part of the multiplier X. The control circuit 3 sets the variable F to the number of digits of the decimal part of multiplier X. The control circuit 3 sets the variable k to 0. The control circuit 3 sets the variable $Y_0$ to the multiplicand Y. The control circuit 3 sets the variable V to the variable $Y_0$. The control circuit 3 sets the variable Z to 0. The variables I, F, and k are stored in, for example, the memory ME by the control circuit 3. The variable V is stored by, for example, the data storage circuit LC1b. The variable Z is stored in, for example, the accumulative adder 5 by the data storage circuit LC2b.

The multiplier X is a decimal number, and can thus be expressed as in Formula (34).

$$X=10^{I-1} \times X_{I-1} + \ldots + 10^0 \times X_0 + 10^{-1} \times X_{-1} + \ldots + 10^{-F} \times X_{-F}$$ Formula (34)

In the range in which k is positive, $X_k$ denotes a value of a k-th digit from the lowest-order digit of the integral part of the multiplier X. In the range in which k is negative, $X_k$ denotes a value of a k-th decimal digit of the decimal part of the multiplier X. $X_0$ denotes a value of the units digit of the integral part of the multiplier X.

The control circuit 3 separately performs a multiplication of the integral part of the multiplier X and a multiplication of the decimal part of the multiplier X. For example, the control circuit 3 performs a multiplication of the decimal part of the multiplier X through the performance of ST3 to ST7, and performs a multiplication of the integral part of the multiplier X through the performance of ST11 to ST17. Details will be described below.

The control circuit 3 determines whether F is 0 (ST3).

If F is not 0 (ST3_No), it means that the multiplier X includes a decimal part. Based thereon, the control circuit 3 calculates ($\frac{1}{10}$)×V using an arithmetic device OP, and updates V with the obtained value (ST4). Details are the same as those of the method described in the first embodiment. That is, the control circuit 3 performs control to cause the 2:1 selection circuit MX3b to select the input signal SIN, and to cause the 4:1 selection circuit MX2b to select the control signal ScL (i.e., a signal that specifies $\frac{1}{10}$). As a result, the selective conversion circuit 4b supplies a signal YIN that transmits V, and supplies a control signal Sc that specifies $\frac{1}{10}$ to the arithmetic device OP. Hereinafter, a calculation by the control circuit 3 through the use of the arithmetic device OP is performed by supplying and specifying two values of which a product is obtained, as described in the first embodiment. A value of ($\frac{1}{10}$)×V is transmitted by a signal ZOUT, and the signal ZOUT is received by the data storage circuit LC1b. The data storage circuit LC1b updates V that has been stored prior to the performance of ST4 with the value of the signal ZOUT (=($\frac{1}{10}$)×V), based on an instruction from the control circuit 3. The value of the signal ZOUT (=($\frac{1}{10}$)×V) is stored in the data storage circuit LC1b.

The control circuit 3 updates k with k−1 (ST5).

The control circuit 3 calculates Z+$X_k$×V, and updates Z with the obtained value (ST6). Details will be described below. The control circuit 3 obtains $X_k$×V using the arithmetic device OP. That is, the control circuit 3 controls the data storage circuit LC1b to cause the data storage circuit LC1b to output a signal that has a value (=($\frac{1}{10}$)×V) stored therein, and supplies the output signal to the arithmetic device OP as the signal YIN based on the control of the 2:1 selection circuit MX3b. The control circuit 3 supplies a control signal Sc that specifies $X_k$ by causing the 4:1 selection circuit MX2b to select the control signal ScR. The signal ZOUT transmits $X_k$×V. The signal ZOUT is received by the accumulative adder 5. The accumulative adder 5 stores a sum of Z that has been stored prior to reception of the signal ZOUT and the signal ZOUT.

The control circuit 3 determines whether k is equal to −F (ST7).

If k is not equal to −F (ST7_No), it means that the obtainment of the sums of the products of all the digits of the decimal part of the multiplier X and the multiplicand Y has not been completed. Based thereon, the control circuit 3 performs ST4.

If k is equal to −F (ST11_Yes), it means that the obtainment of the sums of the products of all the digits of the decimal part of the multiplier X and the multiplicand Y has been completed. Based thereon, the control circuit 3 shifts to a process of obtainment of the integral part of the multiplier X. As a part of such a process, the control circuit 3 determines whether I is 0 (ST11). If F is 0 (ST3_Yes), the control circuit 3 performs ST11.

If I is 0 (ST11_Yes), it means that the multiplier X does not include the integral part. Accordingly, the flow ends. The value (Z) stored in the accumulative adder 5 (i.e., data storage circuit LC2b) at the time of ending of the flow in FIG. 8 is equal to the product of the multiplicand Y and the multiplier X.

If I is not 0 (ST11_No), it means that the multiplier X includes an integral part. Based thereon, the control circuit 3 updates k with 0 (ST12).

The control circuit 3 updates V with $Y_0$ (ST13).

The control circuit 3 calculates Z+$X_k$×V, and updates Z with the obtained value (ST14). The process performed as ST14 is the same as the process performed as ST6.

The control circuit 3 determines whether k is equal to I−1 (ST15).

If k is equal to I−1 (ST15_Yes), it means that the obtainment of the sums of the products of all the digits of the integral part of the multiplier X and the multiplicand Y has been completed. Accordingly, the flow ends.

If k is not equal to I−1 (ST15_No), it means that the obtainment of the sums of the products of all the digits of the integral part of the multiplier X and the multiplicand Y has not been completed. Based thereon, the control circuit 3 calculates 10×V using the arithmetic device OP, and updates V with the obtained value (ST16). The process performed as ST16 is the same as the process performed as ST4, except for the difference in values. In the process performed as ST16, the control signal ScH is used, instead of the control signal ScL as in ST4.

The control circuit 3 updates k with k+1 (ST17). After ST17, the processing continues to ST14.

2.3. Advantages

The arithmetic circuit 100b of the second embodiment includes an arithmetic device OP, and is capable of obtaining a product of the multiplicand Y and the multiplier X through obtainment of the sum of the product of each digit of the multiplier and the multiplicand using the arithmetic device OP, similarly to the first embodiment. It is thus possible to achieve the same advantages as those achieved by the first embodiment. According to the arithmetic circuit 100b of the second embodiment, since the number of arithmetic devices OP can be reduced, as compared to the arithmetic circuit 100 of the first embodiment, it is possible to decrease the circuit area.

2.4. Others and Modifications

When the number of digits and the position of the decimal point of the multiplier are fixed, it is possible to use a read-only memory (ROM) as a memory ME in the control circuit 3.

Alternatively, the memory ME may be configured of a rewritable flash memory. This case is advantageous in that the number of digits and the position of the decimal point of the multiplier can be made variable.

As described with reference to FIG. 8, when the operation of the control circuit 3 includes a conditional judgment, one approach is to configure the control circuit 3 using a microprocessor.

3. Third Embodiment

The third embodiment differs from the first embodiment in terms of components in an arithmetic device OP and couplings of the components. To be distinguished from the arithmetic device OP of the first embodiment, the arithmetic device OP of the third embodiment may be referred to as an arithmetic device OPc. The arithmetic device OPc of the third embodiment is applicable to both the arithmetic circuit 100 of the first embodiment and the arithmetic circuit 100b of the second embodiment. Hereinafter, a description will be given mainly of differences from the first embodiment. It is to be understood that at least the matters that are not described are the same as those of the first embodiment.

3.1. Configuration

FIG. 9 shows components in the arithmetic device OPc of the third embodiment and couplings of the components. As shown in FIG. 9, the arithmetic device OPc includes, in addition to the components included in the arithmetic device OP and couplings of the components, a 6-bit right arithmetic shifter (ASFR6) RS1, an inverter IV1, an incrementer INC1, a multiplexer MX11, and an adder AD11.

The signal S19 from the multiplexer MX4 is received by the 6-bit right arithmetic shifter RS1, in place of the multiplexer MX5 in the first embodiment. The 6-bit right arithmetic shifter RS1 performs a 6-bit right arithmetic shift on a bit string of the signal S19, and generates a signal S21. The signal S21 transmits an n-bit value. A value of the signal S21 has a magnitude $2^{-6}$ times the value of the signal S19.

The signal S21 is received by the inverter IV1. The inverter IV1 outputs a signal S22 based on the signal S21. The signal S22 transmits a value obtained by inverting the value of the signal S21 with respect to all the bits of the signal S21. The signal S22 transmits an n-bit value.

The signal S22 is received by the incrementer INC1. The incrementer INC1 outputs a signal S23 based on the signal S22. The signal S23 transmits a sum of 1 and the value transmitted by the signal S22. The signal S23 transmits an n-bit value.

The signal S23 is received by a second input of the multiplexer MX11. The multiplexer MX11 receives the signal S21 via its first input. The multiplexer MX11 receives the control signal SEL5 as its select signal. The multiplexer MX11 outputs, as a signal S24, one of the signals S21 and S23 that is selected based on the control signal SEL5. The signal S24 transmits an n-bit value.

The signal S24 is received by a first input of the adder AD11. The adder AD11 receives the signal S19 from the multiplexer MX4 via its second input. Based on the signals S19 and S24, the adder AD11 outputs a signal S25. The signal S25 transmits a sum of the values of the signals S24 and S19. The signal S25 has an n-bit value.

The multiplexer MX5 receives a signal S25, in place of the signal S19 as in the first embodiment, via its second input.

3. 2. Operation

Similarly to the arithmetic device OP of the first embodiment, the arithmetic device OPc is capable of performing multiplication using, as a multiplier, a selected one of 0, an integer equal to or greater than 1 and equal to or less than 10, and the inverse of the integer equal to or greater than 1 and equal to or less than 10.

FIG. 10 shows a combination of values of the control signals SEL0 to SEL7 for an arithmetic operation performed by the arithmetic device OPc according to the third embodiment. For the specification of each multiplier X, the levels of the control signals SEL7, SEL6, SEL5, SEL4, SEL3, SEL2, SEL1, and SEL0 have the combinations shown in FIG. 10 and described below.

10 :L-LLHHHL
9 :L-LLHHLH
8 :L-LLHHLL
7 :L-LLLHHH
6 :L-LLLHHL
5 :L-LLLHLH
4 :L-LLLHLL
3 :L-LL-LHH
2 :L-LL-LHL
1 :L-L- -LLH
½ :L-HHHHLL
⅓ :HLLHHHH
¼ :L-HLHHLL
⅕ :HLHHLHHH
⅙ :HHLHHHHH
⅐ :HLLLHHLH
⅛ :L-HLLHLL
⅑ :HLLLLHHH
¹⁄₁₀ :HHHHLHHH
0 :L-L- -LLL

FIG. 10 differs from FIG. 3 of the first embodiment only in terms of the level of the control signal SEL5 of some of the multipliers. That is, the don't-care level of the multipliers ⅓, ⅕, ⅙, ⅐, ⅑, and ¹⁄₁₀ in FIG. 3 are L, H, L, L, L, and H, respectively.

A multiplication performed by the arithmetic device OPc using, as a multiplier, one of 0 and an integer equal to or greater than 1 and equal to or less than 10 is the same as the multiplication in the arithmetic device OP of the first embodiment. For a division (i.e., a multiplication using, as a multiplier, the inverse of the integer equal to or greater than 1 and equal to or less than 10), the following principle is used. Hereinafter, the multiplication sign "×" may be omitted.

Assuming that the error rate when the number x that does not include an error has a magnitude 1 is e, the number including an error, x̂ is expressed as in Formula (35).

$$\hat{x}=(1+e)x \quad \text{Formula (35)}$$

Here, assuming that e is a constant, the right side of Formula (35) multiplied by 1−e can be expressed as Formula (36).

$$(1e)(1-e)x=(1-e^2)x \quad \text{Formula (36)}$$

In Formula (36), a term including an error is corrected from e to $-e^2$.

The right side of Formula (36) multiplied by $1+e^2$ can be expressed as in Formula (37).

$$(1-e^2)(1+e^2)x=(1-e^4)x \quad \text{Formula (37)}$$

In Formula (37), a term including an error is corrected from $-e^2$ to $-e^4$.

Here, assuming that the number of corrections is N and that the number including an error that has gone through N corrections is $\hat{x}_N$, the number including the error that has gone through N corrections can be expressed as in Formula (38).

$$\hat{x}_N = \begin{cases} \hat{x}, & N = 0 \\ (1-e)\hat{x}, & N = 1 \\ \left(1+e^{2^{N-1}}\right)\hat{x}_{N-1}, & N \geq 2 \end{cases} \quad \text{Formula (38)}$$

The description at the right of "," on the right side of Formula (38) indicates conditions under which the value described at the left of "," is applied.

As shown in FIG. 5, the arithmetic device OP of the first embodiment causes an error rate of 1.5625% in the result of the multiplication (i.e., value of the signal S19) when the multiplier is ⅕ or ⅒, and causes an error rate of −1.5625% in the result of the multiplication when the multiplier is ⅓, ⅙, ⅐, or ⅑. The cases where such errors occur are equal to the cases where $e=2^{-6}$ and $e=-2^{-6}$ in Formula (38). Based thereon, in arithmetic in which the arithmetic device OP of the first embodiment causes an error rate of 1.5625%, namely, when the multiplier is ⅕ or ⅒, the error rate can be reduced to $e=-2^{-12}\approx-0.0244\%$ by multiplying the result of the multiplication by $(1-2^{-6})$. Similarly, in arithmetic in which the arithmetic device OP of the first embodiment causes an error rate of −1.5625%, namely, when the multiplier is ⅓, ⅙, ⅐, or ⅑, the error rate can be reduced to $e=-2^{-12}\approx-0.0244\%$ by multiplying the result of the multiplication by $(1+2^{-6})$.

The above-described multiplication of $(1-2^{-6})$ or $(1+2^{-6})$ is implemented by the 6-bit right arithmetic shifter RS1, the inverter IV1, the incrementer INC1, the multiplexer MX11, and the adder AD11.

A method similar to the error rate reduction according to the third embodiment is disclosed in Robert E. Goldschmidt, Applications of Division by Convergence, MSc dissertation, M.I.T., June 1964. R. A. Vowels, "Divide by 10", Australian Computer Journal, vol. 24, no. 3, pp. 81-85, August 1992 discloses a processing method based on a division by 10 as a divisor in an algorithm format.

3.3. Advantages

The arithmetic device OPc of the third embodiment includes the same components and couplings of the components as those of the arithmetic device OP of the first embodiment. It is thus possible to achieve the same advantageous effects as those achieved by the first embodiment.

In addition, the arithmetic device OPc includes the 6-bit right arithmetic shifter RS1, the inverter IV1, the incrementer INC1, the multiplexer MX11, and the adder AD11, which are coupled as shown in FIG. 9. They multiply a signal S19, which transmits a value of the result of the division performed by the arithmetic device OP of the first embodiment, namely, the signal S19 from the multiplexer MX4, by $(1-2^{-6})$ or $(1+2^{-6})$. Such multiplication reduces the error rate in the result of the division transmitted by the signal S19 from the multiplexer MX4. Accordingly, the arithmetic device OPc is capable of performing division with a lower error rate than the arithmetic device OP of the first embodiment.

Such multiplication and division can be performed by the arithmetic device OPc having a small area. FIG. 11 shows the number of components and the number of elements per multiplicand bit of each of a binary multiplying unit of a comparative example and the arithmetic device OPc. The binary multiplying unit of the comparative example is the same as that shown in FIG. 6 of the first embodiment. The assumption for obtainment of the number of elements is the same as that described in the first embodiment. In addition, it is assumed that the incrementer and the inverter include 22 elements and two elements, respectively. Since a shift of a bit string can be performed only with interconnects, the number of elements required for the shift is zero.

The arithmetic device OPc is capable of performing division with a lower error rate, as well as multiplication, merely by having a number of elements greater by 53% than that of the binary multiplying unit that is capable of performing only a multiplication according to the comparative example.

4. Fourth Embodiment

The fourth embodiment differs from the first and third embodiments in terms of the components in an arithmetic device OP and couplings of the components. To be distinguished from the arithmetic device OP of the first embodiment and the arithmetic device OPc of the third embodiment, the arithmetic device OP of the fourth embodiment may be referred to as an arithmetic device OPd. The arithmetic device OPd of the fourth embodiment is applicable to both the arithmetic circuit 100 of the first embodiment and the arithmetic circuit 100b of the second embodiment.

4.1. Configuration

FIG. 12 shows components in an arithmetic device OPd and couplings of the components according to the fourth embodiment. As shown in FIG. 12, the arithmetic device OPd includes, in addition to the components included in the arithmetic device OPc of the third embodiment and couplings of the components, a 12-bit right arithmetic shifter (ASFR12) RT1 and an adder AD15.

The signal S25 from the adder AD11 is received by the 12-bit right arithmetic shifter RT1, instead of the multiplexer MX5 of the third embodiment. The 12-bit right arithmetic shifter RT1 performs a 12-bit right arithmetic shift on a bit string of the signal S25, and thereby generates a signal S28. The signal S28 transmits an n-bit value. A value of the signal S28 has a magnitude $2^{-12}$ times the value of the signal S25.

The signal S28 is received by a first input of the adder AD15. The adder AD15 receives a signal S25 from the adder AD11 via its second input. Based on the values of the signal S25 and the signal S28, the adder AD15 outputs a signal S29. The signal S29 transmits a sum of the values of the signals S25 and S28. The signal S29 transmits an n-bit value.

The multiplexer MX5 receives a signal S29, in place of the signal S25 as in the third embodiment, via its second input.

4.2. Operation

Similarly to the arithmetic device OP of the first embodiment and the arithmetic device OPc of the third embodiment, the arithmetic device OPd is capable of performing multiplication using, as a multiplier, a selected one of 0, an integer equal to or greater than 1 and equal to or less than 10, and the inverse of the integer equal to or greater than 1 and equal to or less than 10.

The combination of the values of the control signals SEL0 to SEL7 for an arithmetic operation performed by the arithmetic device OPd of the fourth embodiment is the same as that in the third embodiment.

In the arithmetic device OPd, a result of a division performed by the arithmetic device OPc of the third embodiment, namely, the signal S25 from the adder AD11, is multiplied by $(1+2^{-12})$. As a result, the error rate ($\approx$–0.0244%) in the signal S25 is reduced to approximately –59.6 ppb (approximately –0.00000596%) of the error rate of the signal S29, based on the same principle as the principle of error rate reduction described in the third embodiment.

4.3. Advantages

The arithmetic device OPd of the fourth embodiment includes the same components and couplings of the components as those of the arithmetic device OP of the first embodiment. It is thus possible to achieve the same advantageous effects as those achieved by the first embodiment.

The arithmetic device OPd further includes the 6-bit right arithmetic shifter RS1, the inverter IV1, the incrementer INC1, the multiplexer MX11, and the adder AD11, which are coupled similarly to that of the arithmetic device OPc of the third embodiment. In addition, the arithmetic device OPd includes the 12-bit right arithmetic shifter RT1 and the adder AD15, which are coupled as shown in FIG. 12. They multiply a signal S25 indicating a result of the division performed by the arithmetic device OPc of the third embodiment, namely, the signal S25 from the adder AD11, by $(1+2^{-12})$. Such multiplication reduces the error rate in the result of the division transmitted by the signal S25 from the adder AD11. Accordingly, the arithmetic device OPd is capable of performing division with a lower error rate than the arithmetic device OPc of the third embodiment.

Such multiplication and division can be performed by an arithmetic device OPd having a small area. FIG. 13 shows the number of components and the number of elements per multiplicand bit of each of a binary multiplying unit of a comparative example and the arithmetic device OPd of the fourth embodiment. The binary multiplying unit of the comparative example is the same as those shown in FIG. 6 of the first embodiment and FIG. 11 of the third embodiment. The assumption for obtainment of the number of elements is the same as that described in the third embodiment.

The arithmetic device OPd is capable of performing division with a lower error rate, as well as multiplication, merely by having a number of elements greater by 82% than that of the binary multiplying unit that is capable of performing only multiplication according to the comparative example.

5. Fifth Embodiment

The fifth embodiment differs from the first to fourth embodiments in terms of the configuration and the operation of the arithmetic circuit 100. To be distinguished from the arithmetic circuit 100 of the first embodiment, the arithmetic circuit 100 of the fifth embodiment may be referred to as an arithmetic circuit 100e.

5.1. Configuration

FIG. 14 shows components in an arithmetic circuit and couplings of the components according to the fifth embodiment. As shown in FIG. 14, the arithmetic circuit 100e includes a control circuit 3 (3e) and an arithmetic section 9e. To be distinguished from the control circuit 3 of the second embodiment, the control circuit 3 of the fifth embodiment may be referred to as a control circuit 3e. An input Sm of the fifth embodiment is a binary number, unlike the input Sm of the first and second embodiments.

The control circuit 3e controls the entire operation of the arithmetic circuit 100e. The control circuit 3e receives a reset signal and a clock signal. The control circuit 3e operates at a timing based on the clock signal. Upon receiving a reset signal that is asserted, the control circuit 3e resets the internal state. The control circuit 3e generates a plurality of control signals, and supplies the generated control signals to the arithmetic section 9e. The arithmetic section 9e receives the input signal SIN, the input signal Sm, and the control signal, and performs an arithmetic operation based on the received signals. The arithmetic section 9e outputs a signal SOUT that transmits a result of the arithmetic operation based on a control of the control circuit 3e. The arithmetic section 9e outputs a signal (or, divisor integral part signal) that transmits an integral part of a divisor (i.e., higher-order bits than the decimal point) to the control circuit 3e.

Figure 15:
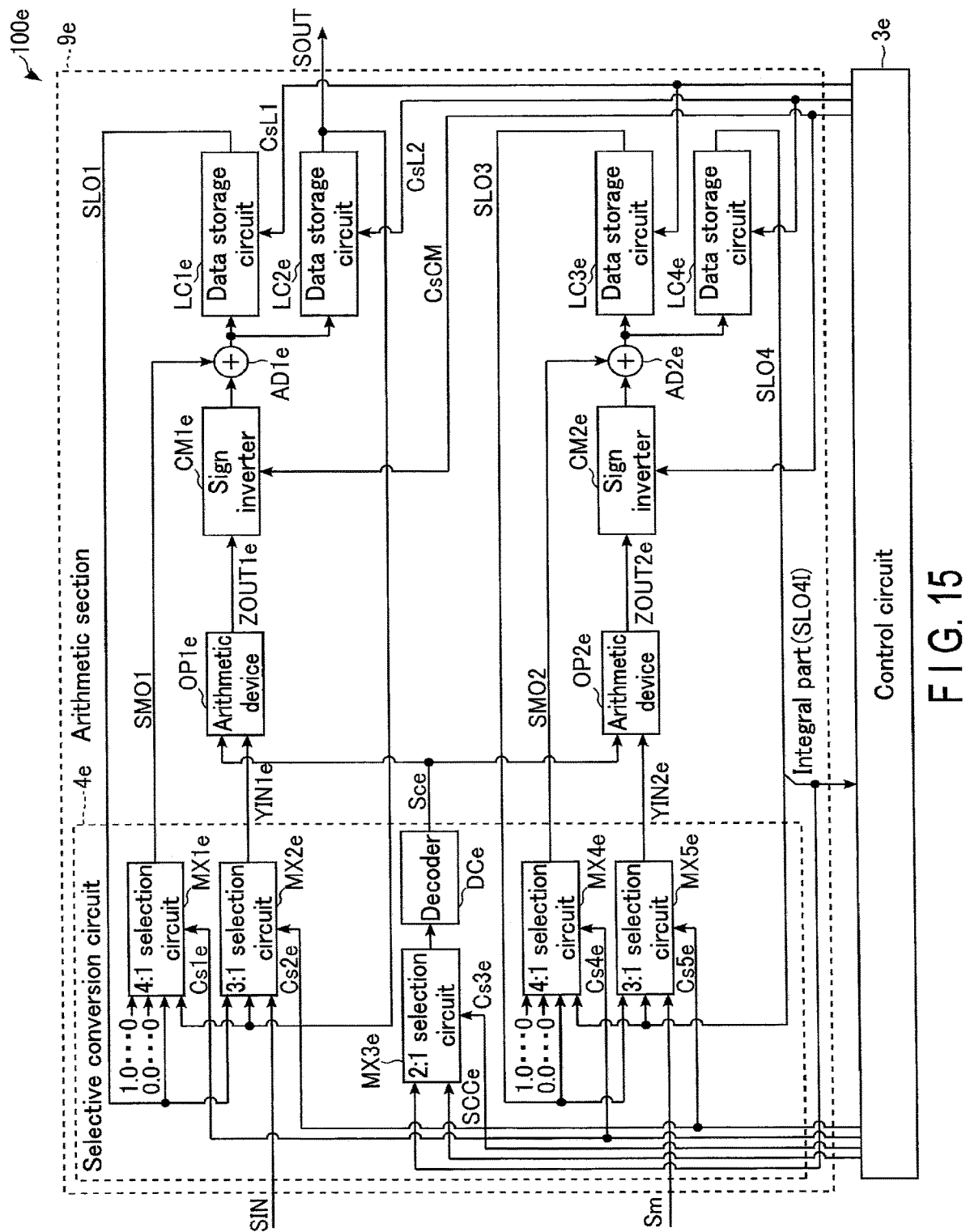
FIG. 15 shows components in the arithmetic circuit and couplings of the components according to the fifth embodiment.

FIG. 15 shows a more detailed example of components in an arithmetic circuit and couplings of the components according to the fifth embodiment, showing, in particular, a more detailed example of the arithmetic section. As shown in FIG. 15, the arithmetic section 9e includes a selective conversion circuit 4e, arithmetic devices OP1e and OP2e, adders AD1e and AD2e, sign inverters CM1e and CM2e, and data storage circuits LC1e, LC2e, LC3e, and LC4e.

The control circuit 3e respectively supplies the selective conversion circuit 4e, the data storage circuits LC1e to LC4e, and the sign inverters CM1e and CM2e with control signals Cs1e, Cs2e, Cs3e, Cs4e, Cs5e, CsCM, CsL1, and CsL2. A signal SLO4 output from the data storage circuit LC4e transmits a divisor. A divisor integral part signal SLO4I is obtained from the signal SLO4. The divisor integral part signal SLO4I is supplied to the control circuit 3e and the selective conversion circuit 4e.

The selective conversion circuit 4e includes 4:1 selection circuits MX1e and MX4e, 3:1 selection circuits MX2e and MX5e, a 2:1 selection circuit MX3e, and a decoder DCe. The 4:1 selection circuit MX1e receives a control signal Cs1e supplied from the control circuit 3e. The 4:1 selection circuit MX1e receives a fixed value that contains 1 in the integral part and contains 0s in all the bit positions of the decimal part, i.e., 1.0 . . . 0, and a fixed value that contains 0s in all the bit positions of the integral part and the decimal part, i.e., 0.0 . . . 0. The 4:1 selection circuit MX1e receives a signal SLO1 and the signal SOUT respectively supplied from the data storage circuits LC1e and LC2e. The 4:1 selection circuit MX1e outputs, as a signal SMO1, one of the value 1.0 . . . 0, the value 0.0 . . . 0, and the signals SLO1 and SOUT that is selected based on the control signal Cs1e. The signal SMO1 is received by a second input of the adder AD1e.

The 3:1 selection circuit MX2e receives a control signal Cs2e supplied from the control circuit 3e. The 3:1 selection circuit MX2e outputs, as a signal YIN1e, one of the input signal SIN and the signals SLO1 and SOUT that is selected based on the control signal Cs2e.

The 2:1 selection circuit MX3e receives a control signal CS3e supplied from the control circuit 3e. The 2:1 selection circuit MX3e supplies, to the decoder DCe, one of the signals SCCe supplied from the control circuit 3e and SLOI4 that is selected based on the control signal Cs3e.

The decoder DCe generates, from the signal supplied from the 2:1 selection circuit MX3e, a signal Sce.

The 4:1 selection circuit MX4e receives a control signal Cs4e supplied from the control circuit 3e. The 4:1 selection circuit MX4e receives a fixed value that contains 1 in the integral part and contains 0s in all the bit positions of the decimal part, i.e., 1.0 . . . 0, and a fixed value that contains 0s in all the bit positions of the integral part and the decimal part, i.e., 0.0 . . . 0. The 4:1 selection circuit MX4e receives signal SLO3 and SLO4 respectively supplied from the data storage circuits LC3e and LC4e. The 4:1 selection circuit MX4e outputs, as a signal SMO2, one of the value 1.0 . . . 0, the value 0.0 . . . 0, and the signals SLO3 and SLO4 that is selected based on the control signal Cs4e. The signal SMO2 is received by a second input of the adder AD2e.

The 3:1 selection circuit MX5e receives a control signal Cs5e supplied from the control circuit 3e. The 3:1 selection circuit MX5e outputs, as a signal YIN2e, one of the input signal Sm and the signals SLO3 and SLO4 that is selected based on the control signal Cs5e.

The arithmetic device OP1e outputs a signal ZOUT1e which transmits a product of a value of the signal YIN1e and a value specified by a value of the control signal Sce, similarly to the arithmetic device OP described in the first embodiment. The arithmetic device OP2e outputs a signal ZOUT2e which transmits a product of a value of the signal YIN2e and a value specified by the value of the control signal Sce, similarly to the arithmetic device OP described in the first embodiment.

The sign inverter CM1e receives a signal ZOUT1e, and receives a control signal CsCM supplied from the control circuit 3e. The sign inverter CM1e inverts a sign of the value transmitted by the signal ZOUT1e based on the control signal CsCM, and supplies the signal ZOUT1e having the inverted sign to a first input of the adder AD1e.

The sign inverter CM2e receives a signal ZOUT2e and a control signal CsCM. The sign inverter CM2e inverts a sign of a value transmitted by the signal ZOUT2e based on the control signal CsCM, and supplies the signal ZOUT2e having the inverted sign to the first input of the adder AD2e.

The adder AD1e receives, via its first input, a signal from the sign inverter CM1e. The adder AD1e receives, via its second input, a signal SMO1 from the selective conversion circuit 4e. The adder AD1e adds a value of the signal received via the first input and a value of the signal SMO1. The adder AD1e supplies a sum obtained by the addition to the data storage circuits LC1e and LC2e.

The adder AD2e receives, via its first input, a signal from the sign inverter CM2e. The adder AD2e receives, via its second input, a signal SMO2 from the selective conversion circuit 4e. The adder AD2e adds a value of the signal received via the first input and a value of the signal SMO2. The adder AD2e supplies a sum obtained by the addition to the data storage circuits LC3e and LC4e.

The data storage circuits LC1e and LC2e receive a signal from the adder AD1e, and store a value of the received signal based on a control of the control circuit 3e. The data storage circuits LC1e and LC2e supply signals SLO1 and SOUT that transmit respective values stored therein to the selective conversion circuit 4e. The data storage circuit LC2e outputs the signal SOUT.

The data storage circuits LC3e and LC4e receive a signal from the adder AD2e, and store a value of the received signal based on a control of the control circuit 3e. The data storage circuits LC3e and LC4e supply signals SLO3 and SLO4 that transmit respective values stored therein to the selective conversion circuit 4e. The signal SLO4I, which transmits the integral part of the signal SLO4, is supplied to the control circuit 3e and the 2:1 selection circuit MX3e in the selective conversion circuit 4e.

5.2. Operation

Prior to the description of an operation of the arithmetic circuit 100e, a principle on which the arithmetic operation of the arithmetic circuit 100e is based will be described.

5.2.1 Principle on which Arithmetic Operation Performed by Arithmetic Circuit is Based An arithmetic operation performed by the arithmetic circuit 100e is based on the Goldschmidt method disclosed in Robert E. Goldschmidt, Applications of Division by Convergence, MSc dissertation, M.I.T., June 1964. An outline of the Goldschmidt method will be described below.

Assuming that the divisor is D, the dividend is N, and the quotient is Q, the quotient Q obtained by dividing the dividend N by the divisor D is expressed as in Formula (39).

$$Q=N/D \qquad \text{Formula (39)}$$

Since a value of Q remains unchanged even if the denominator and the numerator of the right side of Formula (39) are multiplied by the same number W, Formula (39) can be transformed into Formula (40).

$$Q=N/D=NW/DW \qquad \text{Formula (40)}$$

In Formula (40), if the transformed denominator DW is 1, then the quotient Q is equal to the numerator NW. From this, the following can be derived. If an infinite sequence $W_k (k=1, 2, 3, \ldots )$ exists and, $$\text{with } h \to \infty, D \times \Pi_{k=1}^{h} W_k \to 1 \qquad \text{Formula (41)}$$

is satisfied, then, $$\text{with } h \to \infty, N \times \Pi_{k=1}^{h} W_k \to Q \qquad \text{Formula (42)}$$

is satisfied. Accordingly, it is possible to perform the following. A permissible error $e_a(>0)$ is set in advance. $W_k$ (k=1, 2, 3, . . . ) is sequentially multiplied with the denominator D and the numerator N, and when $$|D \times \Pi_{k=1}^{h} W_k - 1| < e_a \qquad \text{Formula (43)}$$

is satisfied during the multiplication, $$N \times \Pi_{k=1}^{h} W_k$$

is treated as an approximate solution of the quotient Q, which allows N/D to be performed. Such a sequence $W_k$ (k=1, 2, 3, . . . ) is given by Formula (44).

$$W_0=1, W_k=2-D \times \Pi_{i=0}^{k-1} W_i \qquad \text{Formula (44)}$$

Formula (44) is based on the fact that the function y=1/x, which expresses the inverse of the variable x, can be well approximated by a function expressed by Formula (45) in the vicinity of x=1, as shown in FIG. 16.

$$y=2-x \qquad \text{Formula (45)}$$

When the denominator (i.e., divisor) D is too far distanced from 1, the linear approximation shown in FIG. 16 is not satisfied. Based thereon, at the start of the approximate calculation, the divisor D is normalized in the range of 1≤D<2.

The normalization can be performed by counting the number of 0s that are continuous from the most significant bit (MSB) of a divisor D represented in a binary number and shifting right or left by the number based on the counted number on the bit string of the divisor D by using, for example, a priority encoder. Shifting on a bit string of the divisor D based on the number of 0s can also be performed by multiplication or division by a power of two such as 2, 4, and 8. Through such shifting, the bits of a value of the divisor D before the decimal point become 1, and the bits after the decimal point become the bit string of the divisor D from which the leftmost 1 is removed. Since the bits after the decimal point can take any value that is not equal to or greater than 1, a value of the normalized divisor D, which is the sum of the integral part and the decimal part, satisfies $1 \leq D < 2$.

When N/D is a fixed decimal division, the same process as the process performed on the divisor D for normalization of the divisor D is performed on the dividend N. When, for example, a one-bit right shift is performed on the bit string of the divisor D, a one-bit right shift is performed on the bit string of the dividend N. With such a shift, the range of the dividend N after the normalization is not uniquely determined in the case of a fixed-point division.

In general, in a floating-point division, a numerical value is separately represented as an exponent and a significand. Accordingly, a shift for normalization on the divisor D and the dividend N is performed by subtracting a shift amount obtained by regarding the left direction as positive and the right direction as negative from the significand of each of the divisor D and the dividend N. Accordingly, the divisor D and the dividend N can be independently normalized in the range of $1 \leq D < 2$ and $1 \leq N < 2$, respectively.

A description of the Goldschmidt method has been given above.

The priority encoder for normalization may be implemented as, for example, part of the control circuit $3e$, or provided independently from the control circuit $3e$.

The Goldschmidt method has been developed for the purpose of an enhanced operation speed. For the enhanced speed, the repetitive multiplications that occur in the formulas of the above description of the Goldschmidt method are based on the premise of being performed in a single cycle by a parallel-type multiple-bit multiplier. While h is small, in Formula (41), the convergence of $$D \times \Pi_{k=1}^{h} W_k$$

is slow. Accordingly, in order to perform the Goldschmidt method, a lookup table is used, in general, and approximation in the case where h is small is performed at high speed. The lookup table needs to have at least 4K bytes (where 1K byte consists of 1024 bytes) in the case of, for example, 32-bit floating-point precision. Resources for storing such a large size of data may be permitted in computers that use the Goldschmidt method. On the other hand, for purposes other than computers as described in advantages section of the first embodiment, it is not desirable to use a lookup table.

In the fifth embodiment, a process that uses a lookup table is replaced with the following process. Both the divisor D and the dividend N are binary numbers with a given number of digits, and are values normalized in the same format as that described in the Goldschmidt method. As the procedures to be described below are performed, the divisor D is sequentially updated with new divisors $D_0$, $D_1$, $D_2$, $D_3$, $D_4$, and $D_5$. Similarly, as the procedures to be described below are performed, the dividend N is sequentially updated with new dividends $N_0$, $N_1$, $N_2$, $N_3$, $N_4$, and $N_5$.

(Procedure 1)

The values obtained by multiplying the divisor D and the dividend N by 5 are respectively referred to as "divisor $D_1$" and "dividend $N_1$". Since $1 \leq D < 2$ is satisfied, $5 \leq D_1 < 10$ is satisfied, and a set of the integral parts of the divisor $D_1$ is $\{5, 6, 7, 8, 9\}$.

(Procedure 2)

The values obtained by dividing the divisor $D_1$ and the dividend $N_1$ by the integral part of the divisor $D_1$ are respectively referred to as "divisor $D_2$" and "dividend $N_2$". Since the integral part of the divisor $D_2$ is 1, it is possible to prove that the decimal part of the divisor $D_2$ is smaller than ⅕. Accordingly, $1 \leq D_2 < 1.2$ is satisfied.

(Procedure 3)

The values obtained by multiplying the divisor $D_2$ and the dividend $N_2$ by 9 are respectively referred to as "divisor $D_3$" and "dividend $N_3$". Since $1 \leq D_2 < 1.2$ is satisfied, $9 \leq D_3 < 10.8$ is satisfied. Accordingly, a set of the integral part of the divisor $D_3$ is $\{9, 10\}$.

(Procedure 4)

The values obtained by dividing the divisor $D_3$ and the dividend $N_3$ by the integral part of the divisor $D_3$ are respectively referred to as "divisor $D_4$" and "dividend $N_4$". It is possible to prove that the integral part of the divisor $D_4$ is 1, and that the decimal part of the divisor $D_4$ is smaller than ⅑. Accordingly, $1 \leq D_4 < 1.111\ldots$ (i.e., a number in which 1 recurs infinitely) is satisfied.

(Procedure 5)

The values obtained by multiplying the divisor $D_4$ and the dividend $N_4$ by 0.9 (=9×(1/10)) are referred to as "divisor $D_5$" and "dividend $N_5$", respectively. Since $1 \leq D_4 < 1.111\ldots = 10/9$ is satisfied, the divisor $D_5$ falls within the range shown in Formula (46).

$$0.9 \leq D_5 < 1 \quad \text{Formula (46)}$$

As a result of Procedures 1 to 5, the distribution of the divisor $D_5$ falls within the range in which its inverse can be approximated by the function $y = 2 - x$.

Thereafter, by repeating the approximation and multiplication of the inverse, the denominator of the quotient of the latest divisor D and the latest dividend N can be approximated to 1. The approximation is performed using the function $y = 2 - x$, similarly to the Goldschmidt method. Only a decimal one-digit value or a numerical value 10 is used as a multiplier of the multiplication.

The approximate value $R_5$ of the inverse of the divisor $D_5$ can be expressed, based on the approximation formula, as in Formula (47).

$$R_5 = 2 - D_5 \quad \text{Formula (47)}$$

Since $0.9 \leq D_5 < 1$ is satisfied, $R_5$ falls within the range expressed by Formula (48).

$$1 < R_5 \leq 1.1 \quad \text{Formula (48)}$$

Since $R_5$ is greater than 1, it can be expressed as in Formula (49).

$$R_5 = 1 + r_5 \quad \text{Formula (49)}$$

By substituting the relation of Formula (49) into Formula (48), Formula (50) is obtained.

$$0.00 < r_5 \leq 0.10 \quad \text{Formula (50)}$$

Accordingly, a set of the integral part of $100 \times r_5$ is $\{1, 2, \ldots, 9, 10\}$. Based thereon, the following procedure is performed.

(Procedure 6)

The values obtained by multiplying the divisor $D_5$ and the dividend $N_5$ by an approximate value of the inverse of the divisor $D_5$ expressed by Formula (51) are respectively referred to as "divisor $D_6$" and "dividend $N_6$".

$$1+\lfloor 100\times(1-D_5)\rfloor/100 \qquad \text{Formula (51)}$$

$\lfloor x \rfloor$ indicates a floor function of x, and expresses the integral part of x.

Here, since $1-D_5=r_5$ is satisfied according to Formulas (47) and (49), $\lfloor 100\times(1-D_5)\rfloor$ in Formula (51) is one of the integers from 1 to 10, as described above.

Since $0.9 \leq D_5 < 1$, if the multiplication can be performed without an error, a product of the divisor $D_5$ and an approximate value $R_5=2-D_5$ of its inverse falls within the range shown in Formula (52).

$$0.99 \leq D_5 R_5 < 1 \qquad \text{Formula (52)}$$

Formula (52) can be proved as follows. $D_5 R_5 = D_5 (2-D_5)$ is section of a convex quadratic curve $y=D_5 (2-D_5)$, which is 0 when D5=0 or D5=2, where $0.9 \leq D_5 < 1$ is satisfied. The coordinates of the vertex of the quadratic curve $y=D_5 (2-D_5)$ are (1, 1). Accordingly, the curve $y=D_5 (2-D_5)$ monotonically increases in the range $0.9 \leq D_5 < 1$.

Assuming that the lower limit (=0.9) of $D_5$ shown in Formula (46) is represented as $1-10^{-1}$ and that the multiplication should ideally be performed without an error, the lower limit of the divisor obtained next by repetition based on the Goldschmidt method is $(1-10^{-1})[2-(1-10^{-1})]=(1-10^{-1})(1+10^{-1})=1-10^{-2}$. As the same approximation is repeated, the lower limit of the approximated divisor reaches $1-10^{-4}=0.9999$.

Accordingly, assuming that the approximation in Procedure 5 is defined as the first approximation, and that, based on the Goldschmidt method, the number of approximations after the first approximation is M, the lower limit of the divisor becomes $1-(10$ to the power of $-2^{M-1})$. This lower limit corresponds to the case of $e=-0.1$ $(=-10^{-1})$ in Formula (38).

However, in Procedure 6, since the inverse of the divisor $D_5$ is approximated as expressed by Formula (51), the digits at and after the third decimal place of the approximate value $R_5=2-D_5$ of the inverse based on the Goldschmidt method are truncated. This causes a problem that will be described below.

FIG. 17 shows the values of the divisor $D_6$ with respect to various values of the divisor $D_5$. Since a value of $D_5$ whose range is shown in the first column of FIG. 17 is multiplied by a value of Formula (51) shown in the second column of the same row, $D_6$, which is a product of a value of the first column and a value of the second column, is distributed in the range shown in the third column of the same row. In the case of, for example, the fifth row (where the row indicating the topmost item is the first row) in which the value of Formula (51) is 1.07, the lower limit 0.9844 of the divisor $D_6$ is determined by multiplying the lower limit 0.92 of the divisor $D_5$ by 1.07, and the upper limit 0.9951 of the divisor $D_6$ is obtained by multiplying the upper limit 0.93 of the divisor $D_5$ by 1.07. Of the ranges of $D_6$ shown in the third column of FIG. 17, "$0.9810 < D_6 \leq 0.9919$" in the third row has the lowest lower limit, and "$0.9900 < D_6 < 1.0000$" in the last row has the highest upper limit. Accordingly, the divisor $D_6$ obtained by multiplying the divisor $D_5$ by the value of Formula (51) is distributed in the range of $0.981 < D_6 < 1$. It can be seen from FIG. 17 that a value of the divisor $D_6$ which should originally fall within the range of equal to or greater than 0.99 and less than 1 falls within $0.981 < D_6 < 1$, as a result of the truncation included in Formula (51). Based thereon, Procedure 7 is performed.

(Procedure 7)

When the value obtained by multiplying the divisor $D_6$ with the numerical value $1.01=1+\frac{1}{100}$ is less than 1, the divisor $D_7$ is set as $D_6+D_6/100$, and the dividend $N_7$ is set as $N_6+N_6/100$. If the product is not less than 1, $D_7=D_6$ is set, and $N_7=N_6$ is set.

Through Procedure 7, the new divisor $D_7$ falls within the range of $0.99 \leq D_7 < 1$. This can be proved as follows. If $0 < a \leq x < 1$, conversion shown in Formula (53) is performed using a number b that satisfies $1 < b < 1/a$.

$$y = g(x) = \begin{cases} bx, & bx < 1 \\ x, & bx \geq 1 \end{cases} \qquad \text{Formula (53)}$$

This state is shown in FIG. 18. The coordinates of a point A in FIG. 18 are (a, ab), and the coordinates of a point B are (1/b, 1/b). Accordingly, the lower limit of the function $y=g(x)$ is expressed as in Formula (54).

$$\min\{y\} = \begin{cases} ab, & ab < \frac{1}{b} \\ \frac{1}{b}, & ab \geq \frac{1}{b} \end{cases} \qquad \text{Formula (54)}$$

Procedure 7 corresponds to the case where a=0.981 and b=1.01 in the formula of the function $y=g(x)$. Since ab=0.99081 and 1/b=0.9900 . . . are satisfied, it is proved that the lower limit of $y=g(x)$ is $1/b=1/1.01 \geq 0.99$.

Thereafter, by alternately repeating the two processes corresponding to Procedures 6 and 7, $D_k$ can be approximated to 1, and the dividend $N_k$ can be approximated to the quotient Q. The generalized format of this process is performed as the following Procedures 8 and 9.

(Procedure 8)

By multiplying the divisor $D_7$ and the dividend $N_7$ with an approximate value of the inverse of the divisor $D_7$ shown in Formula (55), the divisor $D_8$ and the dividend $N_8$ are respectively obtained.

$$1+\lfloor 1000\times(1-D_7)\rfloor/1000 \qquad \text{Formula (55)}$$

The inverse of the divisor $D_7$ is approximated to $2-D_7$ by Formula (45), and if a multiplication of the approximate value and the divisor $D_7$ can be performed without errors, the divisor $D_7$ falls within the range shown in Formula (56).

$$0.9999 \leq D_7(2-D_7) < 1 \qquad \text{Formula (56)}$$

On the other hand, the divisor $D_8$ is distributed in the range of Formula (57) for the same reason as the reason described in Procedure 6.

$$0.99891 < D_8 < 1 \qquad \text{Formula (57)}$$

(Procedure 9)

If the product of the divisor $D_8$ and the numerical value $1.001=1+\frac{1}{1000}$ is less than 1, the new divisor $D_9$ and dividend $N_9$ are set as $D_9=D_8+D_8/1000$ and $N_9=N_8+N_8/1000$, respectively. If not, $D_9=D_8$ and $N_9=N_8$ are set.

The divisor $D_9$ is distributed in the range of $0.999 \leq D_8 < 1$ for the same reason as the reason described in Procedure 7.

Through Procedures 6 and 8, Formula (51) is generalized as in Formula (58), using the index k of the divisor $D_k$ and the dividend $N_k$ prior to the arithmetic operation (where k is an odd number equal to or greater than 5 (k=5, 7, 9, . . . )).

$$1+\lfloor 10^{(k-1)/2}\times(1-D_k)\rfloor 10^{(k-1)/2} \qquad \text{Formula (58)}$$

The numerical values 1.01 and 1.001 used in Procedures 7 and 8 are generalized as in Formula (59), using the index k of the divisor $D_k$ and the dividend $N_k$ prior to the arithmetic operation in the previous procedure.

$$1+\frac{1}{10}^{(k-1)/2} \quad \text{Formula (59)}$$

Furthermore, by replacing $(k-1)/2$ with m (where m is a natural number equal to or greater than 2), Formulas (58) and (59) can be respectively expressed as Formula (60) and Formula (61).

$$1+\lfloor 10^m \times (1-D_{2m+1})\rfloor/10^m \quad \text{Formula (60)}$$

$$1+\frac{1}{10}^m \quad \text{Formula (61)}$$

Based on Formulas (60) and (61), the values of a and b used in the proof described in Procedure 7 with reference to FIG. 18 can be expressed as follows.

$$a = \min\{D_{2m+1} \times [1 + \lfloor 10^m \times (1-D_{2m+1})\rfloor/10^m]\} \quad \text{Formula (62)}$$

$$> (1-10^{-m+1})1 + 10^{-m+1} - 10^{-m})$$

$$= 1 - 10^{-m} - 9 \times 10^{-2m+1}$$

$$b=1+10^{-m} \quad \text{Formula (63)}$$

By replacing $10^{-m}$ with c, Formula (64) is obtained from Formulas (62) and (63).

$$ab^2-1>(1+c)^2(1+9c)(1-10c)-1 \quad \text{Formula (64)}$$

Since $0<c\leq 10^{-2}$, Formula (64) is transformed as in Formula (65).

$$ab^2-1>c(1-91c-181c^2-90c^3)>0 \quad \text{Formula (65)}$$

Accordingly, $ab>1/b$ is satisfied.

Accordingly, $1/b$ is transformed as in the following.

$$1/b = 1/(1+c)$$
$$= 1 - c + c^2 - c^3 + c^4 - c^5 + c^6 - ...$$
$$= 1 - c + c^2/(1+c) > 1 - c (\because c > 0)$$

Accordingly, Formula (66) is satisfied.

$$1/b>1-c=1-10^{-m}=1-10^{-(k-1)/2} \quad \text{Formula (66)}$$

From the foregoing, the processes after Procedure 5 are generalized as a repetition of the following two procedures, where $k=5, 7, 9, \ldots$.

(Procedure (k+1))

By multiplying the divisor $D_k$ and the dividend $N_k$ with an approximate value of the inverse of the divisor $D_k$ shown in Formula (67), a divisor $D_{k+1}$ and a dividend $N_{k+1}$ are respectively obtained.

$$1+\lfloor 10^{(k-1)/2} \times (1-D_k)\rfloor/10^{(k-1)/2} \quad \text{Formula (67)}$$

(Procedure (k+2))

When $D_{k+1}+D_{k+1}/10^{(k-1)/2}<1$, $D_{k+2}$ is set to $D_{k+1}+D_{k+1}/10^{(k-1)/2}$, and $N_{k+2}$ is set to $N_{k+1}+N_{k+1}/10^{(k-1)/2}$. When $D_{k+1}+D_{k+1}/10^{(k-1)/2}\geq 1$, $D_{k+2}$ is set to $D_{k+1}$, and $N_{k+2}$ is set to $N_{k+1}$.

After the processes of Procedures k+1 and k+2, the divisor $D_{k+2}$ is distributed in the range of $1-10^{-(k-1)/2}\leq D_{k+2}<1$. Accordingly, when the operation precision of the quotient Q is s decimal digits, since $(k-1)/2=s$, a division is completed by performing the procedure up to $k+2=2s+3$, and setting the quotient Q to $N_{k+2}$.

5.2.2. Operation of Arithmetic Device

FIG. 19 shows a flow of an operation of the arithmetic circuit 100e according to the fifth embodiment. FIG. 19 shows, in particular, a flow for calculation of a division.

The flow of FIG. 19 is started when the control circuit 3e receives an input signal SIN and an input signal Sm. The input signal SIN transmits a dividend N, and the input signal Sm transmits a divisor D.

Steps ST21, ST22, ST23, and ST24 respectively correspond to the performance of Procedures 1, 2, 3, and 4. The set of steps ST26 and ST27 corresponds to the performance of Procedure 5. The steps ST31, ST32, ST33, ST34, ST35, ST36, ST37, ST41, ST42, ST43, ST44, ST45, and ST46 correspond to the performance of Procedures 6, 8 or Procedure (k+1). Here, k is an odd number equal to or greater than 5. The set of ST51, ST52, ST53, ST54, ST55, ST56, and ST57 corresponds to the performance of Procedures 7, 9, or Procedure (k+2).

In the flow shown in FIG. 19, the dividend is replaced with a variable Q immediately after the start of the flow, in order to omit the process where the variable Q is set to $N_{k+2}$ at the end of the series of steps.

The control circuit 3e sets values to be described below to variables M, D, and Q (ST21). The control circuit 3e sets, to the variable s, an operation precision of the quotient, namely, the number of significant decimal digits. The operation precision of the quotient is, for example, supplied from outside the arithmetic circuit 100e. The control circuit 3e sets 1 to the variable M. The control circuit 3e sets, to the variable D, a divisor normalized to a value equal to or greater than 1 and less than 2. The control circuit 3e sets a normalized dividend N to the variable Q. The control circuit 3e prepares temporary variables i, r, $D_0$, and $Q_0$. "M" is a variable used for controlling the number of repetitions of the arithmetic loop. "Q" is a variable which stores a value that becomes a quotient when the flow of FIG. 19 ends. "i" is a variable used for controlling the loop. "r" is a variable used for approximation of the inverse. "$D_0$" is a variable used for temporarily maintaining a value of D. "$Q_0$" is a variable used for temporarily maintaining a value of Q. The variables i, s, and M are, for example, stored in the control circuit 3e. The variables D, Q, $D_0$, $Q_0$, and r are, for example, stored in the data storage circuit LC.

The control circuit 3e calculates 5×D using an arithmetic device OP, updates D with the obtained value, calculates 5×Q using the arithmetic device OP, and updates Q with the obtained value (ST22).

The control circuit 3e divides D by the integral part of D using the arithmetic device OP, updates D with the obtained value, divides Q by the integral part of Q using the arithmetic device OP, and updates Q with the obtained value (ST23). In notations in the drawings including that of ST23, "the integral part of" is represented using a floor function.

The control circuit 3e calculates 9×D using the arithmetic device OP, updates D with the obtained value, calculates 9×Q using the arithmetic device OP, and updates Q with the obtained value (ST24).

The control circuit 3e divides D by the integral part of D using the arithmetic device OP, updates D with the obtained value, divides Q by the integral part of Q using the arithmetic device OP, and updates Q with the obtained value (ST25).

The control circuit 3e calculates 9×D using the arithmetic device OP, updates D with the obtained value, calculates 9×Q using the arithmetic device OP, and updates Q with the obtained value (ST26).

The control circuit 3e calculates D/10 using the arithmetic device OP, updates D with the obtained value, calculates Q/10 using the arithmetic device OP, and updates Q with the obtained value (ST27).

The control circuit 3e determines whether s is equal to 1 (ST28).

If s is not equal to 1 (ST28_No), it means that a division that satisfies the operation precision set as s is not completed. Based thereon, the control circuit 3e updates $D_0$ with the value of D in the data storage circuit LC, and updates $Q_0$ with the value of Q (ST31).

The control circuit 3e obtains 1−D using the arithmetic device OP, a sign inverter CM, and an adder AD, and updates r with the obtained value (ST32).

The control circuit 3e updates M with M+1 (ST33).

The control circuit 3e updates i with 0 (ST34).

The control circuit 3e obtains 10×r using the arithmetic device OP, and updates r with the obtained value (ST35).

The control circuit 3e determines whether i is equal to M−1 (ST36).

If i is not equal to M−1 (ST36_No), the control circuit 3e updates i with i+1 (ST37). The processing continues to ST35.

If i is equal to M−1 (ST36_Yes), the control circuit 3e obtains a product of the integral part of r and D using the arithmetic device OP, updates D with the obtained product, obtains a product of the integral part of r and Q using the arithmetic device OP, and updates Q with the obtained product (ST41).

The control circuit 3e updates i with 0 (ST42).

The control circuit 3e calculates D/10 using the arithmetic device OP, updates D with the obtained value, calculates Q/10 using the arithmetic device OP, and updates Q with the obtained value (ST43).

The control circuit 3e determines whether i is equal to M−1 (ST44).

If i is not equal to M−1 (ST44_No), the control circuit 3e updates i with i+1 (ST45). The processing continues to ST43.

If i is equal to M−1 (ST44_Yes), the control circuit 3e obtains $D_0$+D using the arithmetic device OP and the adder AD, updates D with the obtained value, obtains $Q_0$+Q using the arithmetic device OP and the adder AD, and updates Q with the obtained value (ST46).

The control circuit 3e performs the processes performed as ST51, ST52, ST53, and ST54. The processes performed as ST51, ST52, ST53, and ST54 are the same as the processes performed as ST31, ST42, ST43, and ST44, respectively.

If i is not equal to M−1 (ST54_No), the control circuit 3e updates i with i+1 (ST55). The processing continues to ST53.

If i is equal to M−1 (ST54_Yes), the control circuit 3e obtains $D_0$+D using the arithmetic device OP and the adder AD, and determines whether the obtained value is less than 1 (ST56).

If $D_0$+D is less than i (ST56_Yes), the control circuit 3e obtains $D_0$+D using the arithmetic device OP and the adder AD, updates D with the obtained value, obtains $Q_0$+Q using the arithmetic device OP and the adder AD, and updates Q with the obtained value (ST57).

If $D_0$+D is less than 1 (ST56_No), the control circuit 3e updates D with $D_0$, and updates Q with $Q_0$ (ST58).

After ST57 and ST58, the processing continues to ST59. The control circuit 3e updates s with s−1 (ST59). After ST59, the processing continues to ST28.

If s is equal to 1 (ST28_Yes), it means that a division that satisfies the operation precision set as s has been completed. Accordingly, the flow ends. The Q at the time of ending of the flow of FIG. 19 is the value obtained by dividing the dividend N by the divisor D. After the flow ends, the control circuit 3e controls the data storage circuit LC, and outputs a signal SOUT that transmits the quotient.

5.3. Advantages

The arithmetic circuit 100e of the fifth embodiment includes the arithmetic device OP, and is capable of obtaining a quotient obtained by dividing the dividend N by the divisor D using the arithmetic device OP. Also, the arithmetic circuit 100e is capable of performing an arithmetic operation with the operation precision of the number of digits specified by a decimal number.

6. Sixth Embodiment

The sixth embodiment differs from the first to fifth embodiments in terms of the operation of the arithmetic circuit 100. To be distinguished from the arithmetic circuit 100 of the first embodiment, the arithmetic circuit 100 of the sixth embodiment may be referred to as an arithmetic circuit 100f.

6.1. Configuration

The arithmetic circuit 100f may have any configuration that is capable of performing an operation to be described below. An example of a configuration of the arithmetic circuit 100f will be described in a seventh embodiment. The arithmetic circuit 100f may have the same configuration as the arithmetic circuit 100e of the fifth embodiment. An input Sm according to the sixth embodiment is a binary number, unlike the input Sm according to the first and second embodiments.

6.2. Operation

Figure 20:
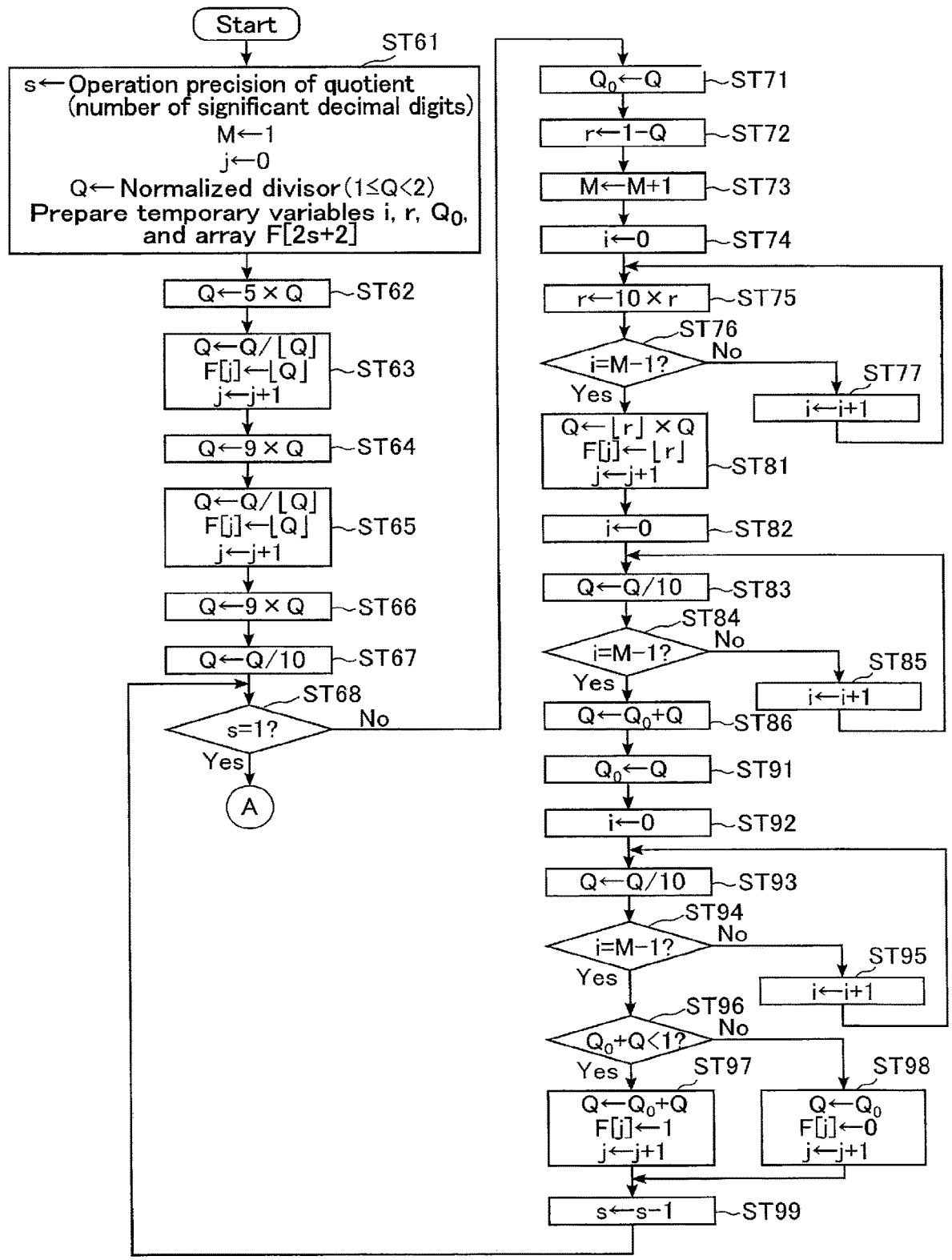
FIG. 20 shows a part of a flow of an operation of an arithmetic circuit according to a sixth embodiment.

FIGS. 20 and 21 show a flow of an operation of the arithmetic circuit 100f according to the sixth embodiment. FIGS. 20 and 21 show, in particular, a flow for a division. The flow of FIG. 21 follows the flow of FIG. 20. As an example, a case will be described where the arithmetic circuit 100f has the same configuration as the configuration of the arithmetic circuit 100e (FIG. 15) according to the fifth embodiment. In the description that follows, to be distinguished from the control circuit 3e of the fifth embodiment, the control circuit 3 of the sixth embodiment may be referred to as a control circuit 3f. The flow of FIGS. 20 and 21 is started when the control circuit 3f receives an input signal SIN and an input signal Sm. The control circuit 3f sets values to be described below to variables s, M, j, and Q (ST61). The control circuit 3f sets, to the variable s, an operation precision of the quotient, namely, the number of significant decimal digits. The control circuit 3f sets 1 to the variable M, and sets 0 to the variable j. The control circuit 3f sets, to the variable Q, a divisor normalized to a value equal to or greater than 1 and less than 2. Also, the control circuit 3f prepares temporary variables i, r, and $Q_0$, and a sequence F. The variables i, s, j, and M, and the array F are stored in, for example, the control circuit 3f. The variables r, $Q_0$, and Q are, for example, stored in a data storage circuit LC. The array F includes (2s+2) components. F[j] is the j-th component of the array F, where j=0, 1, . . . , 2s+1. Since it suffices that each component of the array F is capable of storing an integer from 0 to 9 or 10, each component of the array F includes at least four bits. The array F is referred to according to the first-in-first-out (FIFO) storage principle, namely, is controlled to perform the same operation as a FIFO memory. The "M" is a variable used for controlling the number of repetitions of the arithmetic loop. The "Q" is a variable that stores a value to be a quotient when the flow of FIGS. 20 and 21 ends. "i" is a variable used for controlling the loop. "j" is a variable used to specify a component of the array F.

In the case of a fixed-point arithmetic operation, the position of the decimal point of the number to be handled is fixed. Accordingly, the amount of the logical or arithmetic shift of the bit string obtained by normalization of the divisor needs to be equal to the amount of the logical or arithmetic shift of the bit string obtained by normalization of the dividend. For this purpose, the amount of the logical or arithmetic shift performed by normalization of the divisor is stored using a signed variable with a logical or arithmetic shift to the left (toward the most significant bit), for example, being defined as positive. The bit string of the dividend is logically or arithmetically shifted by a value stored with the signed variable, and the logically or arithmetically shifted bit string is substituted into Q. Alternatively, if the bit width assigned for each component of the array F is great enough to store the amount of the logical or arithmetic shift on the divisor, the amount of the logical or arithmetic shift on the divisor may be stored in the array F and may be referred to.

The control circuit $3f$ calculates $5 \times Q$ using an arithmetic device OP, and updates Q with the obtained value (ST62).

The control circuit $3f$ divides Q by the integral part of Q using the arithmetic device OP, updates Q with the obtained value, inputs the integral part of Q into the array F[j], and updates j with j+1 (ST63).

The control circuit $3f$ calculates $9 \times Q$ using the arithmetic device OP, and updates Q with the obtained value (ST64).

The control circuit $3f$ divides Q by the integral part of Q using the arithmetic device OP, updates Q with the obtained value, inputs the integral part of Q into the array F[j], and updates j with j+1 (ST65).

The control circuit $3f$ calculates $9 \times Q$ using the arithmetic device OP, and updates Q with the obtained value (ST66).

The control circuit $3f$ calculates Q/10 using the arithmetic device OP, and updates Q with the obtained value (ST67).

The control circuit $3f$ determines whether s is equal to 1 (ST68).

If s is not equal to 1 (ST68_No), the control circuit $3f$ updates Q with $Q_0$ in a data storage circuit LC (ST71).

The control circuit $3f$ obtains 1−Q using the arithmetic device OP, a sign inverter CM, and an adder AD, and updates r with the obtained value (ST72).

The control circuit $3f$ updates M with M+1 (ST73).

The control circuit $3f$ updates i with 0 (ST74).

The control circuit $3f$ obtains $10 \times r$ using the arithmetic device OP, and updates r with the obtained value (ST75).

The control circuit $3f$ determines whether i is equal to M−1 (ST76).

If i is not equal to M−1 (ST76 No), the control circuit $3f$ updates i with i+1 (ST77). The processing continues to ST75.

If i is equal to M−1 (ST76_Yes), the control circuit $3f$ obtains a product of the integral part of r and Q using the arithmetic device OP, updates Q with the obtained product, inputs the integral part of r into the array F[j], and updates j with j+1 (ST81).

The control circuit $3f$ updates i with 0 (ST82).

The control circuit $3f$ calculates Q/10 using the arithmetic device OP, and updates Q with the obtained value (ST83).

The control circuit $3f$ determines whether i is equal to M−1 (ST84).

If i is not equal to M−1 (ST84_No), the control circuit $3f$ updates i with i+1 (ST85). The processing continues to ST83.

If i is equal to M−1 (ST84_Yes), the control circuit $3f$ calculates $Q_0+Q$ using an arithmetic device OC, and updates Q with the obtained value (ST86).

The control circuit $3f$ performs processes performed as ST91, ST92, ST93, and ST94. The processes performed as ST91, ST92, ST93, and ST94 are the same as the processes performed as ST71, ST82, ST83, and ST84, respectively.

If i is not equal to M−1 (ST94_No), the control circuit $3f$ updates i with i+1 (ST95). The processing continues to ST93.

If i is equal to M−1 (ST94_Yes), the control circuit $3f$ obtains $Q_0+Q$ using the arithmetic device OP and the adder AD, and determines whether the obtained value is less than 1 (ST96).

If $Q_0+Q$ is less than 1 (ST96_Yes), the control circuit $3f$ updates Q with $Q_0+Q$, inputs 1 into the array F[j], and updates j with j+1 (ST97).

If $Q_0+Q$ is less than 1 (ST96_No), the control circuit $3f$ updates Q with $Q_0$, inputs 0 into the array F[j], and updates j with j+1 (ST98).

After ST97 and ST98, the processing continues to ST99. The control circuit $3f$ updates s with s−1 (ST99). After ST99, the processing continues to ST68.

If s is equal to 1 (ST68_Yes), the control circuit $3f$ sets values to be described below to variables s, M, j, and Q, as shown in FIG. 21 (ST101). The control circuit $3f$ sets, to the variable s, an operation precision of the quotient, namely, the number of significant decimal digits. The control circuit $3f$ sets 1 to the variable M, and sets 0 to the variable j. The control circuit $3f$ sets, to the variable Q, a normalized dividend.

The control circuit $3f$ calculates $5 \times Q$ using the arithmetic device OP, and updates Q with the obtained value (ST102).

The control circuit $3f$ divides Q by F[j] using the arithmetic device OP, and updates j with j+1 (ST103).

The control circuit $3f$ calculates $9 \times Q$ using the arithmetic device OP, and updates Q with the obtained value (ST104).

The control circuit $3f$ divides Q by F[j] using the arithmetic device OP, and updates j with j+1 (ST105).

The control circuit $3f$ calculates $9 \times Q$ using the arithmetic device OP, and updates Q with the obtained value (ST106).

The control circuit $3f$ calculates Q/10 using the arithmetic device OP, and updates Q with the obtained value (ST107).

The control circuit $3f$ determines whether s is equal to 1 (ST108).

If s is not equal to 1 (ST108_No), the control circuit $3f$ updates $Q_0$ with Q in a data storage circuit LC (ST111).

The control circuit $3f$ updates M with M+1 (ST112).

The control circuit $3f$ multiplies F[j] by Q using the arithmetic device OP, and updates Q with the obtained value, and updates j with j+1 (ST113).

The control circuit $3f$ updates i with 0 (ST114).

The control circuit $3f$ calculates Q/10 using the arithmetic device OP, and updates Q with the obtained value (ST115).

The control circuit $3f$ determines whether i is equal to M−1 (ST116).

If i is not equal to M−1 (ST116_No), the control circuit $3f$ updates i with i+1 (ST117). The processing continues to ST115.

If i is equal to M−1 (ST116_Yes), the control circuit $3f$ calculates $Q_0+Q$ using the arithmetic device OP, and updates Q with the obtained value (ST121).

The control circuit $3f$ updates $Q_0$ with Q (ST122).

The control circuit $3f$ updates i with 0 (ST123).

The control circuit $3f$ calculates Q/10 using the arithmetic device OP, and updates Q with the obtained value (ST124).

The control circuit 3f determines whether i is equal to M−1 (ST125).

If i is not equal to M−1 (ST125_No), the control circuit 3f updates i with i+1 (ST126). The processing continues to ST124.

If i is equal to M−1 (ST125_Yes), the control circuit 3f multiplies F[j] by Q using the arithmetic device OP, updates Q with the obtained value, and updates j with j+1 (ST127).

The control circuit 3f obtains $Q_0+Q$ using the arithmetic device OP and the adder AD, and updates Q with the obtained value (ST128).

The control circuit 3f updates s with s−1 (ST129). After ST129, the processing continues to ST108.

If s is equal to 1 (ST108_Yes), the flow ends. The Q at the time of ending of the flow of FIGS. 20 and 21 is equal to the result obtained by dividing a dividend N by a divisor D. After the flow ends, the control circuit 3f controls the data storage circuit LC, and outputs a signal SOUT that transmits the quotient.

6.3. Advantages

The arithmetic circuit 100f of the sixth embodiment includes the arithmetic device OP, and is capable of obtaining a quotient obtained by dividing the dividend N by the divisor D using the arithmetic device OP. Also, the arithmetic circuit 100f is capable of performing an arithmetic operation with the operation precision of the number of digits specified by a decimal number.

In the fifth embodiment, as can be seen from, for example, the processes performed as ST22 and ST23 of FIG. 19, the process on the dividend Q and the process on the divisor D are performed in parallel. On the other hand, in the sixth embodiment, through the use of the array F, the process on the divisor and the process on the dividend are collectively performed in portions of the flow that are independent from each other. That is, all the processes on the divisor are performed and part of the result of the process on the divisor is stored in the array F, as shown in FIG. 20. Next, the process on the dividend is performed with reference to the value stored in the array F, as shown in FIG. 21. Through such a process, it is possible, in some cases, to obtain a quotient in a shorter period of time than a period of time required to obtain a quotient in the fifth embodiment. Such cases include, for example, the case where only the value of the divisor is determined but a value of the dividend is not yet determined and it requires time until its determination, as in the case where the divisor is a constant. In such a case, according to the sixth embodiment, since the time from the determination of the divisor to the determination of the dividend can be allocated to the process on the divisor, it is possible to perform determination and division of the dividend partially in parallel. This eliminates the necessity for the start of the division to wait until the determination of the dividend, and the overall time required until the quotient is obtained is shorter than that required in the fifth embodiment.

7.1. Seventh Embodiment

The seventh embodiment relates to an example of a specific circuit of the arithmetic circuit 100f of the sixth embodiment. The arithmetic circuit 100 of the seventh embodiment may be referred to as an arithmetic circuit 100g, to be distinguished from that of the sixth embodiment.

7.1. Configuration

FIG. 22 shows components in an arithmetic circuit and couplings of the components according to the seventh embodiment. As shown in FIG. 22, the arithmetic circuit 100g has the same configuration as that of the sixth embodiment (i.e., fifth embodiment). However, the control circuit 3 and the arithmetic section 9 of the seventh embodiment are different from the control circuit 3f and the arithmetic section 9 of the sixth embodiment, and may be respectively referred to as "control circuit 3g" and "arithmetic section 9g", to be distinguished from the control circuit 3f and from the arithmetic section 9 of the sixth embodiment. An input Sm according to the seventh embodiment is a binary number, unlike the input Sm according to the first and second embodiments.

The control circuit 3g controls the arithmetic section 9g. For that purpose, the control circuit 3g supplies, as a control signal, a control signal that indicates various digital values to the arithmetic section 9g. The control circuit 3g supplies, to the arithmetic section 9g, an at least 2-bit input select signal SRC1<1:0>, an at least 2-bit input select signal SRC2<1:0>, an at least 5-bit input select signal SRC3<4:0>, an at least 2-bit write enable signal DST<1:0>, an at least 1-bit enable signal FIFOEN, an at least 1-bit conditional arithmetic select signal CND, a clock signal CLK, a reset signal RST, a control signal SL, an at least 1-bit addition/subtraction select signal Sp1, and an at least 1-bit multiplication/division select signal Sp2. The value surrounded by "< >" at the end of the reference sign that designates a signal represents the position of the bit of the signal. For example, "signal SRC<P>" (where P is 0 or a positive integer) indicates that the P-th bit from the least significant bit toward the most significant bit of the bit string of the signal SRC is transmitted. "signal SRC<P:R>" (where each of P and R is 0 or a positive integer) indicates the signal of the R-th to P-th bits from the least significant bit toward the most significant bit of the bit string of the signal SRC. The sign "⁻" at the head of each signal denotes a negative logic. The control signal SL transmits a value $2^{-L-1}$. The control signal SL may be a fixed value.

Figure 23:
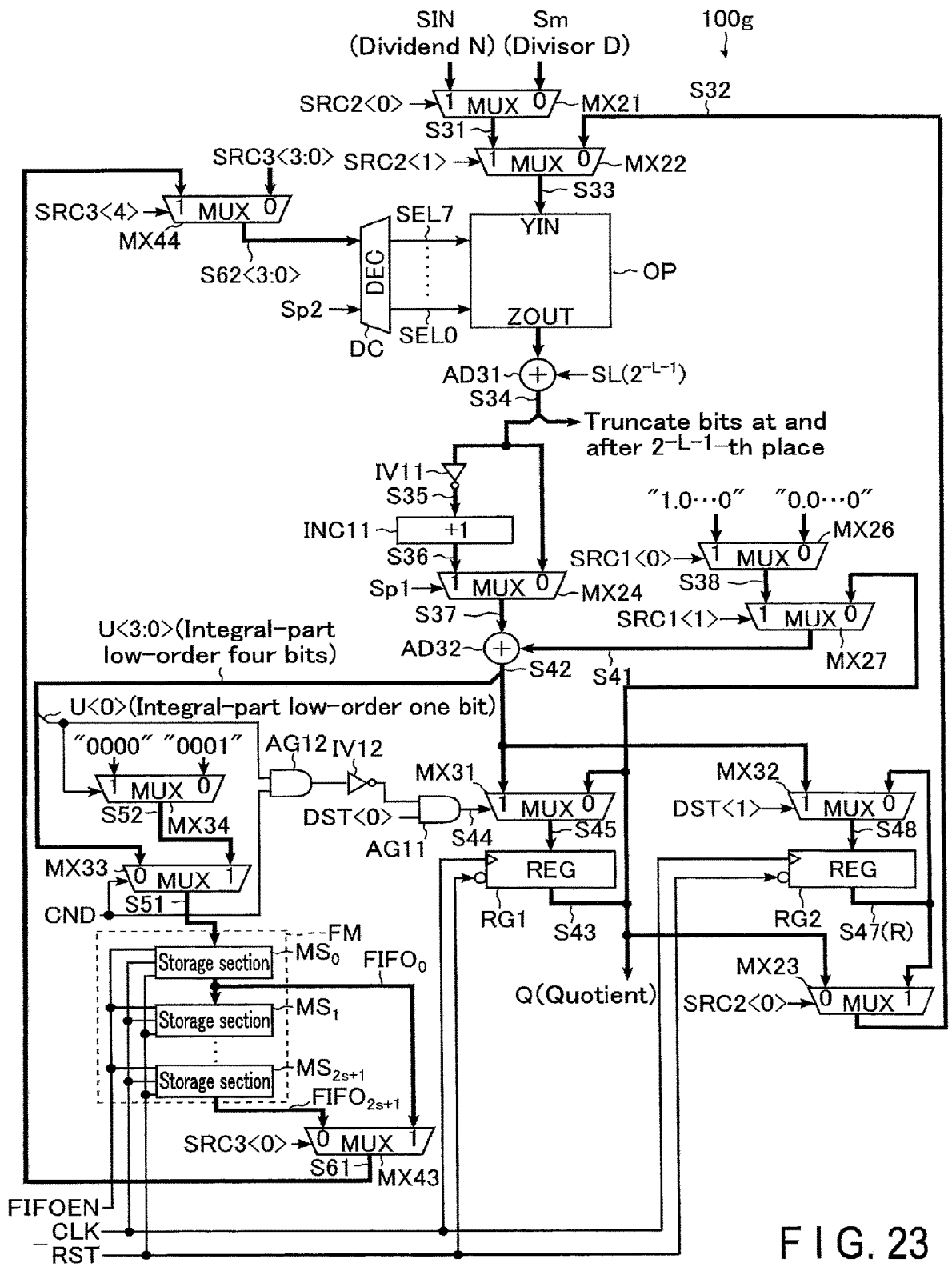
FIG. 23 shows components in the arithmetic circuit and couplings of the components according to the seventh embodiment.

FIG. 23 shows components in the arithmetic circuit 100g and its couplings according to the seventh embodiment. As shown in FIG. 23, the arithmetic circuit 100g includes an arithmetic device OP, multiplexers MX21 to 24, 26, and 27, MX31 to MX34, MX43, and MX44, inverters IV11 and IV12, an incrementer INC11, adders AD31 and AD32, registers RG1 and RG2, AND gates AG11 and AG12, a decoder DC, and a FIFO memory FM.

The multiplexer MX21 receives, via its first input, an input signal Sm, and receives, via its second input, an input signal SIN. The input signal SIN transmits a dividend N. The input signal Sm transmits a divisor D. The multiplexer MX21 receives an input select signal SRC2<0> as its select signal. The multiplexer MX21 outputs, as a signal S31, one of the input signals SIN and Sm that is selected based on the input select signal SRC2<0>. The signal S31 transmits an n-bit value.

The signal S31 is received by a second input of the multiplexer MX22. The multiplexer MX22 receives, via its first input, a signal S32 output from the multiplexer MX23. The multiplexer MX22 receives an input select signal SRC2<1> as its select signal. The multiplexer MX22 outputs, as a signal S33 that transmits an n-bit value, one of the signals S31 and S32 that is selected based on the input select signal SRC2<1>.

The signal S33 is received as a signal YIN by the arithmetic device OP. The arithmetic device OP may be any of the arithmetic devices OP of the first, third, and fourth embodiments. The arithmetic device OP performs any of the processes of the first to seventh embodiments on the signal YIN, and outputs a signal ZOUT as a result of the performance.

The signal ZOUT of the arithmetic device OP is received by a first input of the adder AD31. The adder AD31 receives a signal SL via its second input. The signal SL transmits a constant $2^{-L-1}$. L specifies the number of bits (or, digits) after the decimal point of a binary number that an arithmetic result obtained by the arithmetic circuit 100g is required to have. In general, a product of two binary numbers has the same number of bits as the sum of the number of bits of the two binary numbers. Thus, as the multiplication is repeated, the number of bits of the product increases, resulting in the number of bits of the product becoming extremely large. Methods for restricting such a state include a method of truncating the bits at and after the $2^{-L-1}$-th place and a method of performing rounding. In general, the error rate of the result is lower in the case of rounding. In the case where the weight of the least significant bit of the multiplicand is $2^{-L}$, rounding can be performed by adding $2^{-L-1}$ to the value (i.e., product) transmitted by the signal ZOUT and cutting off all the bits at and after the $2^{-L-1}$-th bit position. The adder AD31 is provided to perform such rounding. The adder AD31 outputs a signal S34. The signal S34 transmits a value obtained by adding $2^{-L-1}$ to the value transmitted by the signal ZOUT, and cutting off all the bits at and after the $2^{-L-1}$-th bit position. The signal S34 transmits a value consisting of a group of all the bits of the integral part and L bits after the decimal point (hereinafter also referred to as high-order bit string) of the bit string transmitted by the signal ZOUT.

The signal S34 is received by the inverter IV11. The inverter IV11 outputs a signal S35. The signal S35 transmits a multiple-bit value.

The signal S35 is received by the incrementer INC11. The incrementer INC11 outputs a signal S36. The signal S36 transmits a multiple-bit value obtained by adding 1 at the least significant bit position of the value transmitted by the signal S35. Accordingly, the signal S36 transmits a value of the signal S34 (i.e., high-order bit string) represented in two's complement form having the sign inverted from the sign of the signal S35.

The signal S36 is received by a second input of the multiplexer MX24. The multiplexer MX24 receives the value (i.e., high-order bit string) of the signal S34 via its first input. The multiplexer MX24 receives the addition/subtraction select signal Sp1 as its select signal. The multiplexer MX24 outputs, as a signal S37, one of the signals S34 and S36 that is selected based on the addition/subtraction select signal Sp1. The signal S37 transmits a multiple-bit value.

The signal S37 is received by a first input of the adder AD32. The adder AD32 receives a signal S41 via its second input, and outputs a signal S42. The signal S41 transmits a value that contains 1 in the integral part and contains 0s in all the bit positions of the decimal part, i.e., 1.0...0, a value that contains 0s in all the bit positions of the integral part and the decimal part, i.e., 0.0...0, or a value transmitted by a signal S43 output from the register RG1, as will be discussed below. More details will be described below.

The value that contains 0s in all the bit positions of the integral part and the decimal part is received by a first input of the multiplexer MX26. The value that contains a 1 in the integral part and contains 0s in all the bit positions of the decimal part is received by a second input of the multiplexer MX26. The multiplexer MX26 receives a signal SRC1<0> as its select signal. The multiplexer MX26 outputs, as a signal S38, one of the value that contains 0s in all the bit positions of the integral part and the decimal part and the value that contains a 1 in the integral part and contains 0s in all the bit positions of the decimal part that is selected based on the signal SRC1<0>. The signal S38 transmits a multiple-bit value.

The signal S38 is received by a second input of the multiplexer MX27. The multiplexer MX27 receives, via its first input, the signal S43 output from the register RG1. The multiplexer MX27 receives a signal SRC1<1> as its select signal. The multiplexer MX27 outputs, as the signal S41, one of the signals S43 and S38 that is selected based on the signal SRC1<1>. The signal S41 transmits a multiple-bit value.

The signal S42 is received by a second input of the multiplexer MX31. The multiplexer MX31 receives, via its first input, the signal S43 output from the register RG1. The multiplexer MX31 receives a signal S44 output from the AND gate AG11. The multiplexer MX31 outputs, as a signal S45, one of the signals S42 and S43 that is selected based on the signal S44. The signal S45 transmits a multiple-bit value.

The signal S45 is received by a data input of the register RG1. The register RG1 receives, via its clock input, the clock signal CLK, and receives, via its reset input, the reset signal ⁻RST. The register RG1 acquires and stores a value of the signal S45 received via a data input based on a rising edge of the clock signal CLK. The register RG1 outputs the stored value as the signal S43 based on the rising edge of the clock signal CLK. The signal S43 transmits a quotient Q of a dividend N and a divisor D after a series of processes by the arithmetic circuit 100g is completed.

The signal S42 is received by a second input of the multiplexer MX32. The multiplexer MX32 receives, via its first input, a signal S47 output from the register RG2. The multiplexer MX32 receives a write enable signal DST<1> as its select signal. The multiplexer MX32 outputs, as a signal S48, one of the signals S42 and S47 that is selected based on the write enable signal DST<1>. The signal S48 transmits a multiple-bit value.

The signal S48 is received by a data input of the register RG2. The register RG2 receives, via its clock input, the clock signal CLK, and receives, via its reset input, the reset signal ⁻RST. The register RG2 acquires and stores a value of the signal S48 received via a data input based on a rising edge of the clock signal CLK. The register RG2 outputs the stored value as the signal S47 based on the rising edge of the clock signal CLK. The signal S47 transmits a multiple-bit value R.

The signal S47 is received by a second input of the multiplexer MX23. The multiplexer MX23 receives, via its first input, the signal S43 output from the register RG1. The multiplexer MX23 receives a signal SRC2<0> as a select signal. The multiplexer MX23 outputs, as the signal S32, one of the signals S43 and S47 that is selected based on the input select signal SRC2<0>. The signal S32 transmits a multiple-bit value.

A group of bits from the least significant bit to the fourth bit toward the most significant bit of the integral part of the value transmitted by the signal S42 from the adder AD32 (hereinafter also referred to as a "signal U<3:0>") is received by a first input of the multiplexer MX33. The multiplexer MX33 receives, via its second input, a signal S52 that transmits a four-bit value from the multiplexer MX34. The multiplexer MX33 receives, as its select signal, the conditional arithmetic select signal CND. The multiplexer MX33 outputs, as a signal S51, one of the signals U<3:0> and S52 that is selected based on the conditional arithmetic select signal CND.

The least significant bit of the integral part of the value transmitted by the signal S42 from the adder AD32 (hereinafter also referred to as a signal U<0>) is received as a select signal by the multiplexer MX34. The multiplexer MX34 receives a 4-bit value "0000" via its second input, and receives a 4-bit value "0001" via its first input. The multiplexer MX34 outputs, as the signal S52, one of the value "0000" or "0001" that is selected based on the signal U<0>. The signal S52 transmits a 4-bit value.

The signal U<0> is received by a first input of the AND gate AG12. The AND gate AG12 receives the conditional arithmetic select signal CND via its second input. The AND gate AG12 computes a logical product of the signal U<0> and the conditional arithmetic select signal CND, and outputs a signal of the arithmetic result.

The signal output from the AND gate AG12 is received by the inverter IV12. The signal output from the inverter IV12 is received by a first input of the AND gate AG11. The AND gate AG11 receives, via its second input, a write enable signal DST<0>. The AND gate AG12 computes a logical product of the signal output from the inverter IV12 and the write enable signal DST<0>. The AND gate AG11 outputs the signal S44 as an arithmetic result.

The signal S51 from the multiplexer MX33 is received by a FIFO memory FM. The FIFO memory FM stores and outputs a value of the signal S51 in a first-in-first-out method. The FIFO memory FM receives the enable signal FIFOEN, the clock signal CLK, and the reset signal $^{31}$RST. The FIFO memory FM operates while a high-level enable signal FIFOEN is being received.

The FIFO memory FM includes 2 (s+1) storage sections MS ($MS_0$, $MS_1$, $MS_{2s+1}$). The 2 (s+1) storage sections MS are coupled in series. That is, the storage section $MS_q$ outputs a signal $FIFO_q$ with respect to all the cases where q is 0 or a positive integer equal to or lower than 2s+1. The signal $FIFO_q$ is received by the storage section $MS_{q+1}$ with respect to all the cases where q is 0 or a positive integer equal to or lower than 2s. Each storage section MS receives the enable signal FIFOEN, the clock signal CLK, and the reset signal $^-$RST.

The FIFO memory FM acquires the value of the signal S51 based on a rising edge of the clock signal CLK, and stores the value stored in each storage section MS in the next storage section MS coupled to the output of the storage section MS.

The output $FIFO_0$ of the storage section $MS_0$ is received by a second input of the multiplexer MX43. The multiplexer MX43 receives an output $FIFO_{2s+1}$ of the storage section $MS_{2s+1}$ via its first input. The multiplexer MX43 receives an input select signal SRC3<0> as its select signal. The multiplexer MX43 outputs, as a signal S61, one of the signals $FIFO_{2s+1}$ and $FIFO_0$ that is selected based on the input select signal SRC3<0>. The signal S61 transmits a multiple-bit value.

The signal S61 is received by a second input of the multiplexer MX44. The multiplexer MX44 receives an input select signal SRC3<3:0> via its first input. The multiplexer MX44 receives an input select signal SRC3<4> as its select signal. The multiplexer MX44 outputs one of the signal S61 and the input select signal SRC3<3:0> that is selected based on the input select signal SRC3<4> as a 4-bit signal S62<3:0>.

The signal S62 is received by the decoder DC. The decoder DC outputs the control signals SEL0 to SEL7 which have values based on the signal S62<3:0> and the multiplication/division select signal Sp2. The control signals SEL0 to SEL7 are supplied to the arithmetic device OP.

FIG. 24 shows an example of components and couplings of the components in a FIFO memory according to the seventh embodiment. As shown in FIG. 24, with respect to all the cases where q is 0 or a positive integer equal to or lower than 2(s+1), the storage section $MS_q$ includes a multiplexer $MX41_q$ and a register $RG11_q$. With respect to all the case where q is 0 or a positive integer equal to or lower than 2(s+1), the multiplexer $MX41_q$ receives the enable signal FIFOEN as its select signal, and supplies one of the signals received via the first input and the second input that is selected based on the enable signal FIFOEN to a data input of the register $RG11_q$. Each register $RG11_q$ receives, via its clock input, the clock signal CLK, and receives, via its reset input, the signal $^-$RST. Each register $RG11_q$ acquires and stores a value of the signal received via a data input based on a rising edge of the clock signal CLK. With respect to all the cases where q is 0 or a positive integer equal to or lower than 2(s+1), the register $RG11_q$ outputs the stored value as a signal $FIFO_q$ based on the rising edge of the clock signal CLK. The signal $FIFO_q$ is received by a first input of the multiplexer $MX41_q$. The signal $FIFO_q$ is received by the second input of the multiplexer $MX_{q+1}$ with respect to all the cases where q is 0 or a positive integer equal to or lower than 2s.

7.2. Operation 7.2.1. Operation of Decoder

FIG. 25 shows a combination of an input and an output of a decoder DC in the arithmetic circuit 100g according to the seventh embodiment. The decoder DC outputs control signals SEL0 to SEL7 which have values based on the values of the multiplication/division select signal Sp2 and the signal S62<3:0>, using the values of the multiplication/division select signal Sp2 and the signal S62.

In the description that follows, "V:κλμν:αδγδεζθι" represents the following matters. "V" represents the value (or, level) of the multiplication/division select signal Sp2. "κλμν" respectively represent the values of the signal S62<3>, the signal S62<2>, the signal S62<1>, and the signal S62<0>. "α", "β", "γ", "δ", "ε", "θ", and "ι" respectively represent the levels of the control signals SEL7, SEL6, SEL5, SEL4, SEL3, SEL2, SEL1, and SEL0, similarly to the first embodiment.

L: 1010:L-LLHHHL
L: 1001:L-LLHHLH
L: 1000:L-LLHHLL
L:0111:L-LLLHHH
L:0110:L-LLLHHL
L:0101:L-LLLHLH
L:0100:L-LLLHLL
L:0011:L-LL-LHH
L:0010:L-LL-LHL
L:0001:L-L- -LLH
H:0010:L-HHHHLL
H:0011:HLLHHHHH
H:0100:L-HLHHLL
H:0101:HLHHHLHHH
H:0110:HHLHHHHH
H:0111:HLLLHHLH
H:1000:L-HLLHLL
H:1001:HLLLLHHH
H:1010:HHHHLHHH
L:0000:L-L- -LLL

By the combination of the values of the addition/subtraction select signal Sp2 and the signal S62, the values of the control signals SEL0 to SEL7 are determined, and the operation of the arithmetic device OP is specified by the values of the control signals SEL0 to SEL7. Thus, the operation of the arithmetic device OP is specified by the combination of the values of the addition/subtraction select signal Sp2 and the signal S62.

7.2.2. Operation of Arithmetic Device

FIG. 26 shows types of arithmetic operations performed by the arithmetic circuit 100g according to the seventh embodiment. An "input" in FIG. 26 and the description given below includes an input from outside the arithmetic circuit 100g and an internal signal of the arithmetic circuit 100g, such as a value stored in the register RG1 or RG2. A "second arithmetic operation" is given a higher priority than a priority given to the "first arithmetic operation" in the order of operations. Each row includes items from which selection can be made.

As a "first input", a selected one of the signal S43 (i.e., a signal that transmits Q), a fixed value that contains 0s in all the bit positions of the integral part and the decimal part, i.e., 0.0 . . . 0, and a fixed value that contains a 1 in the integral part and contains 0s in all the bit positions of the decimal part is used, i.e., 1. 0 . . . 0.

As a "first arithmetic operation", a selected one of addition and subtraction is used. Hereinafter, addition may be denoted by the sign "+", and subtraction may be denoted by the sign "−".

As a "second input", the signal Sm (i.e., a signal that transmits a divisor D), the signal SIN (i.e., a signal that transmits a dividend N), the signal S43 (i.e., a signal that transmits Q), or the signal S47 (i.e., a signal that transmits R) is used.

As a "second arithmetic operation", a selected one of multiplication and division is used. In the drawings, multiplication may be denoted by the sign "×", and division may be denoted by the sign "/(÷)".

As a "third input", a selected one of 0, an integer equal to or greater than 1 and equal to or less than 10, a value of the signal $FIFO_0$, and a value of the signal $FIFO_{2s+1}$ is used.

As a "condition", a selected one of none and U<0>=0 is used.

As an "output", the selected one of signals S43(Q) and S47(R) is used.

Based on the combination of selected items with respect to the first input, the first arithmetic operation, the second input, the second arithmetic operation, the third input, and the condition, various types of arithmetic operations are performed.

The arithmetic circuit 100g generates a first arithmetic result by performing a "second arithmetic operation" on a "second input" and a "third input". The arithmetic circuit 100g outputs a result obtained by performing a "first arithmetic operation" on the first arithmetic result and a "first input" as a signal described in the "output" row when the "condition" is satisfied.

The condition is applied to a value of U<0>. Specifically, an example in which the first input is Q, the first arithmetic operation is +, the second input is D, the second arithmetic operation is ×, the third input is 10, the condition is U<0>=0, and the output is Q is as follows. The result of the arithmetic operation Q+D×10 is updated as the value of Q if U<0>=0, and if U<0>=0 is not satisfied, Q is not updated. Hereinafter, this arithmetic operation is described as in Formula (68).

$$Q \leftarrow Q+D\times10 (U<1) \qquad \text{Formula (68)}$$

In the case where the condition is none, the arithmetic operation is described as in Formula (69).

$$Q \leftarrow Q+D\times10 \qquad \text{Formula (69)}$$

Similarly, if the second input is D, the second arithmetic operation is ×, the third input is 10, the output is Q, and the first input is 0.0 . . . 0, the arithmetic operation is described as in Formula (70).

$$Q \leftarrow D\times10 \qquad \text{Formula (70)}$$

On the other hand, if the first input is 1.0 . . . 0, the arithmetic operation is described as in Formula (71).

$$Q \leftarrow 1+D\times10 \qquad \text{Formula (71)}$$

FIG. 27 shows a combination of values of control signals for an arithmetic operation performed by the arithmetic circuit 100g according to the seventh embodiment. Specifically, FIG. 27 shows the values of the input select signals SRC1, SRC2, and SRC3 for selection of the items shown in FIG. 26, the addition/subtraction select signal Sp1, the multiplication/division select signal Sp2, the conditional arithmetic select signal CND, and the write enable signal DST.

For selection regarding a first input, an input select signal SRC1<1:0> is used. In the case of "00", a signal S43(Q) is selected. In the case of "10", 0.0 . . . 0 is selected. In the case of "11", 1.0 . . . 0 is selected.

For selection regarding a first arithmetic operation, the addition/subtraction select signal Sp1 is used. In the case of a low level, + is selected. In the case of a high level, − is selected.

For selection regarding a second input, an input select signal SRC2<1:0> is used. In the case of "00", a signal S43(Q) is selected. In the case of "01", a signal S47(R) is selected. In the case of "10", a signal Sm(D) is selected. In the case of "11", a signal SIN(N) is selected.

For selection regarding a second arithmetic operation, the multiplication/division select signal Sp2 is used. In the case of a low level, × is selected. In the case of a high level, /(÷) is selected.

For selection regarding a third input, an input select signal SRC3<4:0> is used. In the case of "00000", 0 is selected. In the case of "00001", 1 is selected. In the case of "00010", 2 is selected. In the case of "00011", 3 is selected. In the case of "00100", 4 is selected. In the case of "00101", 5 is selected. In the case of "00110", 6 is selected. In the case of "00111", 7 is selected. In the case of "01000", 8 is selected. In the case of "01001", 9 is selected. In the case of "01010", 10 is selected. In the case of "10000", $FIFO_0$ is selected. In the case of "10001", $FIFO_{2s+1}$ is selected.

For selection regarding a condition, the conditional arithmetic select signal CND is used. In the case of a low level, none is selected as the condition. In the case of a high level, U<0>=0 is selected.

For selection regarding an output, a write enable signal DST<1:0> is used. In the case of "00", none is selected as the output. In the case of "01", a signal S43(Q) is selected. In the case of "10", a signal S47(R) is selected.

By the combination of the values of the conditional arithmetic select signal CND, the write enable signal DST, and the enable signal FIFOEN, the arithmetic circuit 100g performs an operation to be described below.

If the conditional arithmetic select signal CND is at a low level, the multiplexer MX31 receives, as its select signal, a write enable signal DST<0> via the AND gate AG11. Moreover, if the conditional arithmetic select signal CND is at a low level, the FIFO memory FM receives integral-part low-order four bits U<3:0> of a value of the signal S42 from the adder AD32 via the multiplexer MX33. In this case, a write operation can be performed on the FIFO memory FM and the register RG1 based on the values of the enable signal FIFOEN and the write enable signal DST<0>, respectively.

If the conditional arithmetic select signal CND is at a high level, one of the following two types of processes is performed according to the value U<0> in the signal S42 from the adder AD32.

If a value of the integral-part least significant bit U<0> of the value transmitted by the signal S42 is 0, the FIFO memory FM receives an integral value 1 ("0001") via the multiplexers MX33 and MX34. If the value of U<0> is 0, the multiplexer MX31 receives, as its select signal via the AND gate AG11, a write enable signal DST<0>. In this case, a write operation can be performed on the FIFO memory FM and the register RG1 based on the values of the enable signal FIFOEN and the write enable signal DST<0>, respectively.

If the value of the integral-part least significant bit U<0> of the value transmitted by the signal S42 is 1, the FIFO memory FM receives an integral value 0 ("0000") via the multiplexers MX33 and MX34. The multiplexer MX31 receives a low level as its select signal via the AND gate AG11. Accordingly, writing can be performed in the FIFO memory FM based on the enable signal FIFOEN, but writing is not performed in the register RG1. The register RG1 receives its output via the multiplexer MX31.

FIG. 28 shows a combination of values of control signals for an arithmetic operation performed by the arithmetic circuit 100g according to the seventh embodiment. Specifically, FIG. 28 shows the values of the conditional arithmetic select signal CND for control of the FIFO memory FM and an enable signal FIFOEN.

An "input" in the "item" column includes selection of an input to the FIFO memory FM. For selection regarding an "input", the conditional arithmetic select signal CND is used. In the case of a low level, "U<3:0>" is specified to be input to the FIFO memory FM. In the case of a high level, the integral value "1" is specified to be input to the FIFO memory FM when U<0>=0, and the integral value "0" is specified to be input to the FIFO memory FM when U<0>≠0.

An "update" in the "item" column denotes a process on the value being subjected to an arithmetic operation. For selection regarding the "update", the enable signal FIFOEN is used. In the case of a low level, the FIFO memory FM is instructed of a storage "retention" operation to keep storing the stored value regardless of the input (i.e., value of the signal S51) to the FIFO memory FM. In the case of a high level, the FIFO memory FM is instructed of a storage "update" operation to perform a first-in-first-out operation, taking the value of the signal S51 as an input.

Hereinafter, selection of an input to the FIFO memory FM and whether or not to make an update will be described as in Formulas (72) and (73).

$$\text{FIFO} \leftarrow U \qquad \text{Formula (72)}$$

$$\text{FIFO} \leftarrow (U<1) \qquad \text{Formula (73)}$$

Formula (72) represents an operation in which U<3:0> is unconditionally input to the FIFO memory FM based on the conditional arithmetic select signal CND being at a low level. Formula (73) represents an operation in which 1 is input if U<0>=0 and 0 is input if U<0>≠0, based on the conditional arithmetic select signal CND being at a high level.

From FIGS. 27 and 28, values of various signals for causing the arithmetic circuit 100g to perform a selected operation can be known. Accordingly, by selecting a combination of values of signals, the operations represented by Formulas (68) to (73) can be implemented. For example, a combination of values of signals for performing the arithmetic operation Q←R/5, FIFO←U is as follows.

SRC1<1:0>=10
Sp1="L"
SRC2<1:0>=01
Sp2="H"
SRC3<4:0>=00101
CND="L"
DST<1:0>=01
FIFOEN="H"

By repeating the operations represented by Formulas (68) to (73) using different values for the respective items, the arithmetic operation described as the sixth embodiment can be performed. For that purpose, a plurality of signals which have values that specify each step (e.g., the arithmetic operation Q←R/5, FIFO←U in the above example) for causing the arithmetic circuit 100g to perform the arithmetic operation described as the sixth embodiment are supplied to the arithmetic circuit 100g. The plurality of signals include the input select signals SRC1<1:0>, SRC2<1:0>, and SRC3<4:0>, the addition/subtraction select signal Sp1, the multiplication/division select signal Sp2, the conditional arithmetic select signal CND, the write enable signal DST<1:0>, and the enable signal FIFOEN. Hereinafter, the values of the input select signals SRC1<1:0>, SRC2<1:0>, and SRC3<4:0>, the addition/subtraction select signal Sp1, the multiplication/division select signal Sp2, the conditional arithmetic select signal CND, the write enable signal DST<1:0>, and the enable signal FIFOEN FIFOEN, which have values for performing a single step, will be referred to as "orders". A plurality of orders that respectively specify the operations of a plurality of steps are sequentially supplied, and thereby the arithmetic operations described as the sixth embodiment are performed. FIG. 29 shows, along a timeline, states of some of the signals (including orders) of the arithmetic circuit 100g for such an arithmetic operation according to the seventh embodiment.

As shown in FIG. 29, the clock signal CLK continues to be supplied. Until time t1, the reset signal RST remains at a low level, and the registers RG1, RG2, and RG11 are reset. From time t1, the reset signal ⁻RST remains at a high level, thus allowing the registers RG1, RG2, and RG11 to be in an operable state.

Also, from time t1, a divisor D is continues to be supplied by transmission of an input signal SIN that transmits the divisor D. Similarly, a dividend N continues to be supplied by transmission of an input signal Sm that transmits the dividend N.

From time t1, while the reset signal ⁻RST remains at a high level and the divisor D and the dividend N continue to be supplied, a plurality of different orders (a first order, a second order, . . . , and a final order) are sequentially supplied in accordance with a plurality of rising edges of the clock signal CLK (or, cycles of the clock signal CLK).

As a result of the supply of each order, in a cycle subsequent to the cycle in which the order in the clock signal CLK is supplied, the signal S43 transmits a result Q of the arithmetic operation based on this order. The signal S43 in the cycle subsequent to the cycle of supplying the final order transmits a quotient Q. After completion of the final order, a value of the write enable signal DST<1:0> is set to "00" so that a signal S43 that transmits the quotient Q continues to be output.

Figure 31:
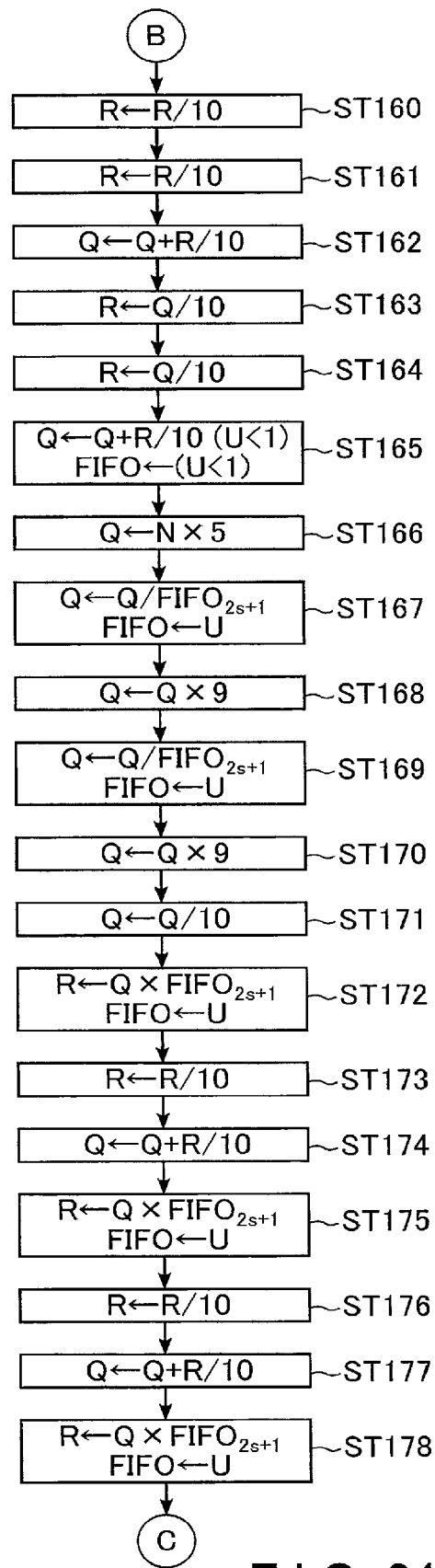
FIG. 31 shows another part of the flow of the operation of the arithmetic circuit according to the seventh embodiment.
Figure 32:
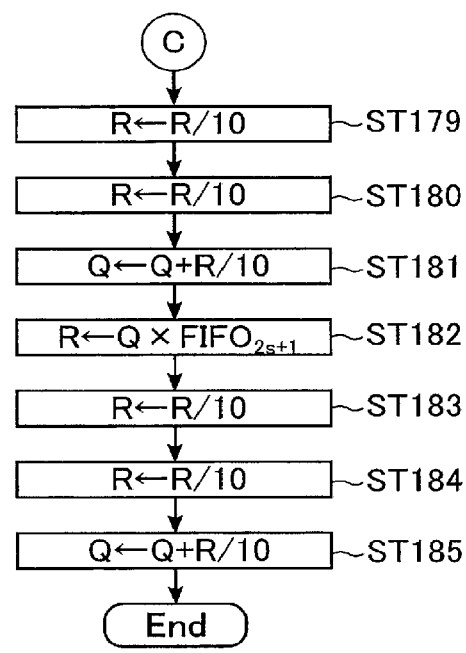
FIG. 32 shows yet another part of the flow of the operation of the arithmetic circuit according to the seventh embodiment.

FIGS. 30, 31, and 32 show a flow of an arithmetic operation performed by the arithmetic circuit 100g of the seventh embodiment. The flow of FIG. 30 continues to the flow of FIG. 31. The flow of FIG. 31 continues to the flow of FIG. 32. Each step (or, ST) corresponds to the process performed in a single cycle of the clock signal CLK. As described above, the seventh embodiment relates to an example of a specific circuit of the arithmetic circuit $100f$ of the sixth embodiment. However, in the flow of the sixth embodiment (FIGS. 20 and 21), one or a group of processes (or, steps) is repeated until a certain condition is satisfied. On the other hand, in the flow of FIGS. 30 to 32, a group of processes corresponding to the group of processes in the sixth embodiment is performed by, for example, a predetermined number. Since the conditional order can be performed based on the circuit configuration of the arithmetic circuit $100g$, the flow of FIGS. 30 to 32 does not include a condition-based branch process. The flows of FIGS. 30 to 32 show an example in which the number s of significant decimal digits of the quotient is 3.

As described with reference to FIG. 29, the flow of FIGS. 30 to 32 is started by starting the process at time t1 in FIG. 29. As shown in FIG. 30, an arithmetic operation $Q \leftarrow D/5$, FIFO←U is performed by the start of the flow (ST141). The control circuit $3g$ supplies orders to the arithmetic section $9g$ in such a manner that an arithmetic operation $Q \rightarrow D/5$, FIFO→U is performed. Hereinafter, the description of an arithmetic operation performed at each step includes an output of an order by the control circuit $3g$ for performing the arithmetic operation.

An arithmetic operation $Q \leftarrow Q/FIFO_0$ is performed (ST142).

An arithmetic operation $Q \leftarrow Q \times 9$, FIFO←U is performed (ST143).

An arithmetic operation $Q \leftarrow Q/FIFO_0$ is performed (ST144).

An arithmetic operation $Q \leftarrow Q \times 9$ is performed (ST145).
An arithmetic operation $Q \leftarrow Q/10$ is performed (ST146).
An arithmetic operation $R \leftarrow 1-Q \times 1$ is performed (ST147).
An arithmetic operation $R \leftarrow R \times 10$ is performed (ST148).
An arithmetic operation $R \leftarrow R \times 10$, FIFO←U is performed (ST149).
An arithmetic operation $R \leftarrow Q \times FIFO_0$ is performed (ST150).
An arithmetic operation $R \leftarrow R/10$ is performed (ST151).
An arithmetic operation $Q \leftarrow Q+R/10$ is performed (ST152).
An arithmetic operation $R \leftarrow Q/10$ is performed (ST153).
An arithmetic operation $Q \leftarrow Q+R/10(U<1)$, FIFO←(U<1) is performed (ST154).
An arithmetic operation $R \leftarrow 1-Q \times 1$ is performed (ST155).
An arithmetic operation $R \leftarrow R \times 10$ is performed (ST156).
An arithmetic operation $R \leftarrow R \times 10$ is performed (ST157).
An arithmetic operation $R \leftarrow R \times 10$, FIFO←U is performed (ST158).
An arithmetic operation $R \leftarrow Q \times FIFO_0$ is performed (ST159).

Thereafter, an arithmetic operation $R \leftarrow R/10$ is performed, as shown in FIG. 31 (ST160).

An arithmetic operation $R \leftarrow R/10$ is performed (ST161).
An arithmetic operation $Q \leftarrow Q+R/10$ is performed (ST162).
An arithmetic operation $R \leftarrow Q/10$ is performed (ST163).
An arithmetic operation $R \leftarrow Q/10$ is performed (ST164).
An arithmetic operation $Q \leftarrow Q+R/10$ (U<1), FIFO←(U<1) is performed (ST165).
An arithmetic operation $Q \leftarrow N \times 5$ is performed (ST166).

An arithmetic operation $Q \leftarrow Q/FIFO_{2s+1}$, FIFO←U is performed (ST167).
An arithmetic operation $Q \leftarrow Q \times 9$ is performed (ST168).
An arithmetic operation $Q \leftarrow Q/FIFO_{2s+1}$, FIFO←U is performed (ST169).
An arithmetic operation $Q \leftarrow Q+9$ is performed (ST170).
An arithmetic operation $Q \leftarrow Q/10$ is performed (ST171).
An arithmetic operation $R \leftarrow Q \times FIFO_{2s+1}$, FIFO←U is performed (ST172).
An arithmetic operation $R \leftarrow R/10$ is performed (ST173).
An arithmetic operation $Q \leftarrow Q+R/10$ is performed (ST174).
An arithmetic operation $R \leftarrow Q \times FIFO_{2s+1}$, FIFO←U is performed (ST175).
An arithmetic operation $R \leftarrow R/10$ is performed (ST176).
An arithmetic operation $Q \leftarrow Q+R/10$ is performed (ST177).
An arithmetic operation $R \leftarrow Q \times FIFO_{2s+1}$, FIFO←U is performed (ST178).

Thereafter, an arithmetic operation $R \leftarrow R/10$ is performed, as shown in FIG. 32 (ST179).

An arithmetic operation $R \leftarrow R/10$ is performed (ST180).
An arithmetic operation $Q \leftarrow Q+R/10$ is performed (ST181).
An arithmetic operation $R \leftarrow Q \times FIFO_{2s+1}$ is performed (ST182).
An arithmetic operation $R \leftarrow R/10$ is performed (ST183).
An arithmetic operation $R \leftarrow R/10$ is performed (ST184).
An arithmetic operation $Q \leftarrow Q+R/10$ is performed (ST185). After ST185, the flow ends.

7.3. Advantages

The arithmetic circuit $100g$ according to the seventh embodiment includes components and couplings shown in FIG. 23. With such an arithmetic circuit $100g$, it is possible to perform the arithmetic operation described as the sixth embodiment. It is thus possible to achieve the same advantages as those achieved by the sixth embodiment.

That is, the arithmetic circuit $100g$ of the seventh embodiment includes an arithmetic device OP, and is capable of obtaining a quotient obtained by dividing the dividend N by the divisor D using the arithmetic device OP. Also, the arithmetic circuit $100g$ is capable of performing an arithmetic operation with the operation precision of the number of digits specified by a decimal number. Moreover, the control circuit $3g$ of the seventh embodiment, which does not perform conditional judgment, can be implemented by a combination of a counter and a memory, similarly to the control circuit 3 of the second embodiment.

8. Modification

In the description given above, it is assumed that the multiplier is equal to or greater than 0, and the divisor is a positive value greater than 0. If the multiplier or the divisor is negative, the sign of the multiplier or the divisor is inverted, and then the multiplication or division according to the above-described embodiments is performed, and the sign of the product or the quotient is inverted. Thereby, it is possible to perform an arithmetic operation even when the multiplier or the divisor is negative.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An arithmetic device including:
a first input terminal configured to receive a first signal that transmits an input bit string;
a second input terminal configured to receive a second signal that includes first to eighth control signals;
an output terminal configured to output a signal indicating a product of a value indicated by the first signal and a value indicated by the second signal;
a first logical shifter configured to output a first bit string obtained by shifting left a sequence of bits of the input bit string by one bit;
a second logical shifter configured to output a second bit string obtained by shifting left a sequence of bits of the first bit string by one bit;
a third logical shifter configured to output a third bit string obtained by shifting left a sequence of bits of the second bit string by one bit;
a first AND gate configured to output a fourth bit string that is an arithmetic result of a logical product of values of the input bit string and the first control signal;
a second AND gate configured to output a fifth bit string that is an arithmetic result of a logical product of values of the first bit string and the second control signal;
a first multiplexer configured to output, based on the third control signal, a sixth bit string that is either the second bit string or the third bit string;
a third AND gate configured to output a seventh bit string that is an arithmetic result of a logical product of values of the sixth bit string and the fourth control signal;
a first adder configured to output an eighth bit string that is a sum of the seventh bit string and the fifth bit string;
a fourth logical shifter configured to output a ninth bit string obtained by shifting left a sequence of bits of the eighth bit string by one bit;
a second multiplexer configured to output, based on the fifth control signal, a tenth bit string that is either the eighth bit string or the ninth bit string;
a second adder configured to output an eleventh bit string that is a sum of the fourth bit string and the tenth bit string;
a first arithmetic shifter configured to output a twelfth bit string obtained by shifting right a sequence of bits of the eleventh bit string by five bits while maintaining a sign;
a second arithmetic shifter configured to output a thirteenth bit string obtained by shifting right a sequence of bits of the twelfth bit string by one bit while maintaining a sign;
a third arithmetic shifter configured to output a fourteenth bit string obtained by shifting right a sequence of bits of the thirteenth bit string by one bit while maintaining a sign;
a third multiplexer configured to output, based on the sixth control signal, a fifteenth bit string that is either the eleventh bit string or the twelfth bit string;
a fourth multiplexer configured to output, based on the seventh control signal, a sixteenth bit string that is either the thirteenth bit string or the fourteenth bit string; and
a fifth multiplexer configured to output, as the signal indicating the product, an output signal that transmits either the fifteenth bit string or the sixteenth bit string based on the eighth control signal.

2. An arithmetic circuit comprising:
the arithmetic device according to claim 1;
a circuit configured to output the first signal and the second signal; and
an accumulative adder configured to accumulatively add a value of the output signal of the arithmetic device.

3. An arithmetic circuit comprising:
the arithmetic device according to claim 1;
a circuit configured to output the first signal and the second signal; and
a control circuit configured to control the arithmetic device and the circuit so as to repeatedly perform processes of:
substituting a product of a divisor and an approximate value of an inverse of the divisor into a first variable and substituting a product of a dividend and the approximate value of the inverse of the divisor into a second variable;
substituting a product of the first variable and an approximate value of an inverse of the first variable into the first variable and substituting a product of the second variable and the approximate value of the inverse of the first variable into the second variable; and
when a first product of the first variable and a first value that is equal to or greater than 1 is less than 1, substituting the first product into the first variable and substituting a second product of the second variable and the first value into the second variable, and when the first product is equal to or greater than 1, maintaining the first variable and the second variable.

4. The arithmetic circuit according to claim 3, wherein
the arithmetic circuit is configured to output the second variable when a first condition is satisfied as a quotient of the divisor and the dividend.

5. The arithmetic circuit according to claim 3, wherein
the approximate value of the inverse of the divisor is a value obtained by subtracting the divisor from 2, and
the approximate value of the inverse of the first variable is a value obtained by subtracting the first variable from 2.

6. The arithmetic circuit according to claim 3, wherein
the first value is 1 summed with 1 over (10 to a power of n), where n is a natural number.

7. An arithmetic circuit comprising:
the arithmetic device according to claim 1;
a circuit configured to output the first signal and the second signal; and
a control circuit configured to control the arithmetic device and the circuit so as to perform:
substituting a product of a divisor and an approximate value of an inverse of the divisor into a first variable;
repeating a first process k times, where k is a natural number, a k-th first process including: substituting a product of the first variable and a k-th approximate value of an inverse of the first variable into the first variable; substituting a k-th product of the first variable and a first value that is equal to or greater than 1 into the first variable when the k-th product is less than 1 and maintaining the k-th product when the k-th product is equal to or greater than 1;
substituting a product of a dividend and the approximate value of the inverse of the divisor into the first variable; and
repeating a second process k times, a k-th second process including: substituting a product of the first variable and the k-th approximate value into the first variable;

and substituting a product of the first variable and the first value into the first variable when the k-th product is less than 1.

8. An arithmetic circuit comprising:
the arithmetic device of claim 1 configured to output the output signal as a seventeenth bit string;
a circuit configured to output the first signal and the second signal;
a control circuit configured to output third to twelfth signals;
a first adder configured to output a eighteenth bit string including a sum of the seventeenth bit string and a power of 2;
an inverter configured to output a nineteenth bit string having a value obtained by inverting bits of the eighteenth bit string;
an incrementer configured to output a twentieth bit string having a sum of 1 and the nineteenth bit string;
a first multiplexer configured to output, based on the third signal, a twenty-first bit string that is either the eighteenth bit string or the twentieth bit string; a first register configured to store a received value and output the stored value as a twenty-second bit string;
a second register configured to store a received value and output the stored value as a twenty-third bit string;
a second multiplexer configured to output, based on the fourth signal, an twenty-fourth bit string that is either the twenty-second bit string, a first constant, or a second constant;
a second adder configured to output a twenty-fifth bit string that is a sum of the twenty-first bit string and the twenty-fourth bit string;
a third multiplexer configured to output a third constant that is either an integral value 0 or an integral value 1 based on a value of a least significant bit of an integral part of the twenty-fifth bit string;
a first AND gate configured to output a first bit that is an arithmetic result of a logical product of a value of the fifth signal and the least significant bit of the integral part of the twenty-fifth bit string;
an inverter configured to output a second bit having a value obtained by inverting the first bit;
a second AND gate configured to output a third bit that is an arithmetic result of a logical product of the second bit and a value of the sixth signal;
a fourth multiplexer configured to supply, based on the third bit, a twenty-sixth bit string that is either the twenty-fifth bit string or the twenty-second bit string to the first register;
a fifth multiplexer configured to supply, based on the seventh signal, an twenty-seventh bit string that is either the twenty-fifth bit string or the twenty-third bit string to the second register;
a sixth multiplexer configured to output, based on the eighth signal, the twenty-second bit string, the twenty-third bit string, a first value, or a second value as the input bit string;
a seventh multiplexer configured to output, based on the ninth signal, a twenty-eighth bit string that is either a plurality bits that are continuous from the lowest order of an integral part of the twenty-fifth bit string or the third constant;
a memory configured to output an input according to a first-in-first-out principle, includes a plurality of storage sections that are coupled in series, the storage sections coupled in series including a first-stage storage section and a last-stage storage section, the first-stage storage section receiving the twenty-eighth bit string;
an eighth multiplexer configured to output, based on the tenth signal, a twenty-ninth bit string that is either an output of the first-stage storage section or the last-stage storage section;
a ninth multiplexer configured to output, based on the eleventh signal, a thirty-first bit string that is either the twenty-ninth bit string or a thirtieth bit string; and
a decoder configured to output the first to eighth control signals having a value based on the twelfth signal and the thirty-first bit string.

9. An arithmetic device comprising:
a first input terminal configured to receive a first signal that transmits an input bit string;
a second input terminal configured to receive a second signal that includes first to eighth control signals;
an output terminal configured to output a signal indicating a product of a value indicated by the first signal and a value indicated by the second signal;
a first logical shifter configured to output a first bit string obtained by shifting left a sequence of bits of the input bit string by one bit;
a second logical shifter configured to output a second bit string obtained by shifting left a sequence of bits of the first bit string by one bit;
a third logical shifter configured to output a third bit string obtained by shifting left a sequence of bits of the second bit string by one bit;
a first AND gate configured to output a fourth bit string that is an arithmetic result of a logical product of values of the input bit string and the first control signal;
a second AND gate configured to output a fifth bit string that is an arithmetic result of a logical product of values of the first bit string and the second control signal;
a first multiplexer configured to output, based on the third control signal, a sixth bit string that is either the second bit string or the third bit string;
a third AND gate configured to output a seventh bit string that is an arithmetic result of a logical product of values of the sixth bit string and the fourth control signal;
a first adder configured to output an eighth bit string that is a sum of the seventh bit string and the fifth bit string;
a fourth logical shifter configured to output a ninth bit string obtained by shifting left a sequence of bits of the eighth bit string by one bit;
a second multiplexer configured to output, based on the fifth control signal, a tenth bit string that is either the eighth bit string or the ninth bit string;
a second adder configured to output an eleventh bit string that is a sum of the fourth bit string and the tenth bit string;
a first arithmetic shifter configured to output a twelfth bit string obtained by shifting right a sequence of bits of the eleventh bit string by five bits while maintaining a sign;
a second arithmetic shifter configured to output a thirteenth bit string obtained by shifting right a sequence of bits of the twelfth bit string by one bit while maintaining a sign;
a third arithmetic shifter configured to output a fourteenth bit string obtained by shifting right a sequence of bits of the thirteenth bit string by one bit while maintaining a sign;
a third multiplexer configured to output, based on the sixth control signal, a fifteenth bit string that is either the eleventh bit string or the twelfth bit string;

a fourth multiplexer configured to output, based on the seventh control signal, a sixteenth bit string that is either the thirteenth bit string or the fourteenth bit string;
a fourth arithmetic shifter configured to output a seventeenth bit string obtained by shifting right a sequence of bits of the sixteenth bit string by six bits while maintaining a sign;
an inverter configured to output an eighteenth bit string having a value obtained by inverting bits of the seventeenth bit string;
an incrementer configured to output a nineteenth bit string having a sum of the eighteenth bit string and 1;
a fifth multiplexer configured to output, based on the sixth control signal, a twentieth bit string that is either the seventeenth bit string or the nineteenth bit string;
a third adder configured to output a twenty-first bit string that is a sum of the sixteenth bit string and the twentieth bit string; and
a sixth multiplexer configured to output an output signal that transmits either the fifteenth bit string or the twenty-first bit string based on the eighth control signal.

10. An arithmetic circuit comprising:
the arithmetic device according to claim 9;
a circuit configured to output the first signal and the second signal; and
an accumulative adder configured to accumulatively add a value of the output signal of the arithmetic device.

11. An arithmetic circuit comprising:
the arithmetic device according to claim 9;
a circuit configured to output the first signal and the second signal; and
a control circuit configured to control the arithmetic device and the circuit so as to repeatedly perform processes of:
substituting a product of a divisor and an approximate value of an inverse of the divisor into a first variable and substituting a product of a dividend and the approximate value of the inverse of the divisor into a second variable;
substituting a product of the first variable and an approximate value of an inverse of the first variable into the first variable and substituting a product of the second variable and the approximate value of the inverse of the first variable into the second variable; and
when a first product of the first variable and a first value that is equal to or greater than 1 is less than 1, substituting the first product into the first variable and substituting a second product of the second variable and the first value into the second variable, and when the first product is equal to or greater than 1, maintaining the first variable and the second variable.

12. The arithmetic circuit according to claim 11, wherein the arithmetic circuit is configured to output the second variable when a first condition is satisfied as a quotient of the divisor and the dividend.

13. The arithmetic circuit according to claim 11, wherein the approximate value of the inverse of the divisor is a value obtained by subtracting the divisor from 2, and the approximate value of the inverse of the first variable is a value obtained by subtracting the first variable from 2.

14. The arithmetic circuit according to claim 11, wherein the first value is 1 summed with 1 over (10 to a power of n), where n is a natural number.

15. An arithmetic circuit comprising:
the arithmetic device according to claim 9;
a circuit configured to output the first signal and the second signal; and
a control circuit configured to control the arithmetic device and the circuit so as to perform:
substituting a product of a divisor and an approximate value of an inverse of the divisor into a first variable;
repeating a first process k times, where k is a natural number, a k-th first process including:
substituting a product of the first variable and a k-th approximate value of an inverse of the first variable into the first variable; substituting a k-th product of the first variable and a first value that is equal to or greater than 1 into the first variable when the k-th product is less than 1 and maintaining the k-th product when the k-th product is equal to or greater than 1;
substituting a product of a dividend and the approximate value of the inverse of the divisor into the first variable; and
repeating a second process k times, a k-th second process including: substituting a product of the first variable and the k-th approximate value into the first variable; and substituting a product of the first variable and the first value into the first variable when the k-th product is less than 1.

16. An arithmetic circuit comprising:
the arithmetic device of claim 9 configured to output the output signal as a twenty-second bit string;
a circuit configured to output the first signal and the second signal;
a control circuit configured to output third to twelfth signals;
a first adder configured to output a twenty-third bit string including a sum of the twenty-second bit string and a power of 2;
an inverter configured to output a twenty-fourth bit string having a value obtained by inverting bits of the twenty-third bit string;
an incrementer configured to output a twenty-fifth bit string having a sum of 1 and the twenty-fourth bit string;
a first multiplexer configured to output, based on the third signal, a twenty-sixth bit string that is either the twenty-third bit string or the twenty-fifth bit string;
a first register configured to store a received value and outputs the stored value as a twenty-seventh bit string;
a second register configured to store a received value and outputs the stored value as a twenty-eighth bit string;
a second multiplexer configured to output, based on the fourth signal, a twenty-ninth bit string that is either the twenty-seventh bit string, a first constant, or a second constant;
a second adder configured to output a thirtieth bit string that is a sum of the twenty-sixth bit string and the twenty-ninth bit string;
a third multiplexer configured to output a third constant that is either an integral value 0 or an integral value 1 based on a value of a least significant bit of an integral part of the thirtieth bit string;
a first AND gate configured to output a first bit that is an arithmetic result of a logical product of a value of the fifth signal and the least significant bit of the integral part of the thirtieth bit string;
an inverter configured to output a second bit having a value obtained by inverting the first bit;

a second AND gate configured to output a third bit that is an arithmetic result of a logical product of the second bit and a value of the sixth signal;
a fourth multiplexer configured to supply, based on the third bit, a thirty-first bit string that is either the thirtieth bit string or the twenty-seventh bit string to the first register;
a fifth multiplexer configured to supply, based on the seventh signal, a thirty-second bit string that is either the thirtieth bit string or the twenty-eighth bit string to the second register;
a sixth multiplexer configured to output, based on the eighth signal, the twenty-seventh bit string, the twenty-eighth bit string, a first value or a second value as the input bit string;
a seventh multiplexer configured to output, based on the ninth signal, a thirty-third bit string that is either a plurality bits that are continuous from a lowest order of an integral part of the thirtieth bit string or the third constant;
a memory configured to output an input according to a first-in-first-out principle, includes a plurality of storage sections that are coupled in series, the storage sections coupled in series including a first-stage storage section and a last-stage storage section, the first-stage storage section receiving the thirty-third bit string;
an eighth multiplexer configured to output, based on the tenth signal, a thirty-fourth bit string that is either an output of the first-stage storage section or the last-stage storage section;
a ninth multiplexer configured to output, based on the eleventh signal, a thirty-sixth bit string that is either the thirty-fourth bit string or a thirty-fifth bit string; and
a decoder configured to output the first to eighth control signals having a value based on the twelfth signal and the thirty-sixth bit string.

17. An arithmetic device comprising:
a first input terminal configured to receive a first signal that transmits an input bit string;
a second input terminal configured to receive a second signal that includes first to eighth control signals;
an output terminal configured to output a signal indicating a product of a value indicated by the first signal and a value indicated by the second signal;
a first logical shifter configured to output a first bit string obtained by shifting left a sequence of bits of the input bit string by one bit;
a second logical shifter configured to output a second bit string obtained by shifting left a sequence of bits of the first bit string by one bit;
a third logical shifter configured to output a third bit string obtained by shifting left a sequence of bits of the second bit string by one bit;
a first AND gate configured to output a fourth bit string that is an arithmetic result of a logical product of values of the input bit string and the first control signal;
a second AND gate configured to output a fifth bit string that is an arithmetic result of a logical product of values of the first bit string and the second control signal;
a first multiplexer configured to output, based on the third control signal, a sixth bit string that is either the second bit string or the third bit string;
a third AND gate configured to output a seventh bit string that is an arithmetic result of a logical product of values of the sixth bit string and the fourth control signal;
a first adder configured to output an eighth bit string that is a sum of the seventh bit string and the fifth bit string;
a fourth logical shifter configured to output a ninth bit string obtained by shifting left a sequence of bits of the eighth bit string by one bit;
a second multiplexer configured to output, based on the fifth control signal, a tenth bit string that is either the eighth bit string or the ninth bit string;
a second adder configured to output an eleventh bit string that is a sum of the fourth bit string and the tenth bit string;
a first arithmetic shifter configured to output a twelfth bit string obtained by shifting right a sequence of bits of the eleventh bit string by five bits while maintaining a sign;
a second arithmetic shifter configured to output a thirteenth bit string obtained by shifting right a sequence of bits of the twelfth bit string by one bit while maintaining a sign;
a third arithmetic shifter configured to output a fourteenth bit string obtained by shifting right a sequence of bits of the thirteenth bit string by one bit while maintaining a sign;
a third multiplexer configured to output, based on the sixth control signal, a fifteenth bit string that is either the eleventh bit string or the twelfth bit string;
a fourth multiplexer configured to output, based on the seventh control signal, a sixteenth bit string that is either the thirteenth bit string or the fourteenth bit string;
a fourth arithmetic shifter configured to output a seventeenth bit string obtained by shifting right a sequence of bits of the sixteenth bit string by six bits while maintaining a sign;
an inverter configured to output an eighteenth bit string having a value obtained by inverting bits of the seventeenth bit string;
an incrementer configured to output a nineteenth bit string having a sum of the eighteenth bit string and 1;
a fifth multiplexer configured to output, based on the sixth control signal, a twentieth bit string that is either the seventeenth bit string or the nineteenth bit string;
a third adder configured to output a twenty-first bit string that is a sum of the sixteenth bit string and the twentieth bit string;
a fifth arithmetic shifter configured to output a twenty-second bit string obtained by shifting right a sequence of bits of the twenty-first bit string by twelve bits while maintaining a sign;
a fourth adder configured to output a twenty-third bit string that is a sum of the twenty-first bit string and the twenty-second bit string; and
a sixth multiplexer configured to output, based on the eighth control signal, an output signal that transmits either the fifteenth bit string or the twenty-third bit string.

18. An arithmetic circuit comprising:
the arithmetic device according to claim 17;
a circuit configured to output the first signal and the second signal; and
an accumulative adder configured to accumulatively add a value of the output signal of the arithmetic device.

19. An arithmetic circuit comprising:
the arithmetic device according to claim 17;
a circuit configured to output the first signal and the second signal; and
a control circuit configured to control the arithmetic device and the circuit so as to repeatedly perform processes of:

substituting a product of a divisor and an approximate value of an inverse of the divisor into a first variable and substituting a product of a dividend and the approximate value of the inverse of the divisor into a second variable;

substituting a product of the first variable and an approximate value of an inverse of the first variable into the first variable and substituting a product of the second variable and the approximate value of the inverse of the first variable into the second variable; and when a first product of the first variable and a first value that is equal to or greater than 1 is less than 1, substituting the first product into the first variable and substituting a second product of the second variable and the first value into the second variable, and when the first product is equal to or greater than 1, maintaining the first variable and the second variable.

20. The arithmetic circuit according to claim 19, wherein the arithmetic circuit is configured to output the second variable when a first condition is satisfied as a quotient of the divisor and the dividend.

21. The arithmetic circuit according to claim 19, wherein the approximate value of the inverse of the divisor is a value obtained by subtracting the divisor from 2, and the approximate value of the inverse of the first variable is a value obtained by subtracting the first variable from 2.

22. The arithmetic circuit according to claim 19, wherein the first value is 1 summed with 1 over (10 to a power of n), where n is a natural number.

23. An arithmetic circuit comprising:
the arithmetic device according to claim 17;
a circuit configured to output the first signal and the second signal; and
a control circuit configured to control the arithmetic device and the circuit so as to perform:
substituting a product of a divisor and an approximate value of an inverse of the divisor into a first variable;
repeating a first process k times, where k is a natural number, a k-th first process including: substituting a product of the first variable and a k-th approximate value of an inverse of the first variable into the first variable; substituting a k-th product of the first variable and a first value that is equal to or greater than 1 into the first variable when the k-th product is less than 1 and maintaining the k-th product when the k-th product is equal to or greater than 1;
substituting a product of a dividend and the approximate value of the inverse of the divisor into the first variable; and
repeating a second process k times, a k-th second process including: substituting a product of the first variable and the k-th approximate value into the first variable; and substituting a product of the first variable and the first value into the first variable when the k-th product is less than 1.

24. An arithmetic circuit comprising:
the arithmetic device of claim 17 configured to output the output signal as a twenty-fourth bit string;
a circuit configured to output the first signal and the second signal;
a control circuit configured to output third to twelfth signals;
a first adder configured to output a twenty-fifth bit string including a sum of the twenty-fourth bit string and a power of 2;

an inverter configured to output a twenty-sixth bit string having a value obtained by inverting bits of the twenty-fifth bit string;
an incrementer configured to output a twenty-seventh bit string having a sum of 1 and the twenty-sixth bit string;
a first multiplexer configured to output, based on the third signal, a twenty-eighth bit string that is either the twenty-fifth bit string or the twenty-seventh bit string;
a first register configured to store a received value and outputs the stored value as a twenty-ninth bit string;
a second register configured to store a received value and outputs the stored value as a thirtieth bit string;
a second multiplexer configured to output, based on the fourth signal, an thirty-first bit string that is either the twenty-ninth bit string, a first constant, or a second constant;
a second adder configured to output a thirty-second bit string that is a sum of the twenty-eight bit string and the thirty-first bit string;
a third multiplexer configured to output a third constant that is either an integral value 0 or an integral value 1 based on a value of a least significant bit of an integral part of the thirty-second bit string;
a first AND gate configured to output a first bit that is an arithmetic result of a logical product of a value of the fifth signal and the least significant bit of the integral part of the thirty-second bit string;
an inverter configured to output a second bit having a value obtained by inverting the first bit;
a second AND gate configured to output a third bit that is an arithmetic result of a logical product of the second bit and a value of the sixth signal;
a fourth multiplexer configured to supply, based on the third bit, a thirty-third bit string that is either the thirty-second bit string or the twenty-ninth bit string to the first register;
a fifth multiplexer configured to supply, based on the seventh signal, an thirty-fourth bit string that is either the thirty-second bit string or the thirtieth bit string to the second register;
a sixth multiplexer configured to output, based on the eighth signal, the twenty-ninth bit string, the thirtieth bit string, a first value or a second value as the input bit string;
a seventh multiplexer configured to output, based on the ninth signal, a thirty-fifth bit string that is either a plurality bits that are continuous from a lowest order of an integral part of the thirty-second bit string or the third constant;
a memory configured to output an input according to a first-in-first-out principle, includes a plurality of storage sections that are coupled in series, the storage sections coupled in series including a first-stage storage section and a last-stage storage section, the first-stage storage section receiving the thirty-fifth bit string; an eighth multiplexer configured to output, based on the tenth signal, a thirty-sixth bit string that is either an output of the first-stage storage section or the last-stage storage section;
a ninth multiplexer configured to output, based on the eleventh signal, a thirty-eighth bit string that is either the thirty-sixth bit string or a thirty-seventh bit string; and
a decoder configured to outputs the first to eighth control signals having a value based on the twelfth signal and the thirty-eighth bit string.

* * * * *